(12) United States Patent
Tatani et al.

(10) Patent No.: US 10,438,983 B2
(45) Date of Patent: Oct. 8, 2019

(54) SOLID-STATE IMAGING DEVICE, PRODUCTION METHOD THEREOF, AND ELECTRONIC DEVICE

(71) Applicant: Sony Corporation, Tokyo (JP)

(72) Inventors: Keiji Tatani, Kanagawa (JP); Takuji Matsumoto, Kanagawa (JP); Yasushi Tateshita, Kanagawa (JP); Fumihiko Koga, Kanagawa (JP); Takashi Nagano, Kanagawa (JP); Takahiro Toyoshima, Kanagawa (JP); Tetsuji Yamaguchi, Kanagawa (JP); Keiichi Nakazawa, Tokyo (JP); Naoyuki Miyashita, Kanagawa (JP); Yoshihiko Nagahama, Kumamota (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/072,538

(22) Filed: Mar. 17, 2016

(65) Prior Publication Data

US 2016/0197109 A1 Jul. 7, 2016

Related U.S. Application Data

(60) Continuation of application No. 14/244,485, filed on Apr. 3, 2014, now abandoned, which is a division of
(Continued)

(30) Foreign Application Priority Data

Apr. 9, 2008 (JP) .................................. 2008-101971
Jul. 31, 2008 (JP) .................................. 2008-199050
Aug. 4, 2008 (JP) .................................. 2008-201117

(51) Int. Cl.
*H01L 31/02* (2006.01)
*H01L 27/146* (2006.01)
*H01L 27/148* (2006.01)

(52) U.S. Cl.
CPC .... *H01L 27/1463* (2013.01); *H01L 27/14689* (2013.01); *H01L 27/14831* (2013.01);
(Continued)

(58) Field of Classification Search
CPC .......... H01L 27/1463; H01L 27/14831; H01L 27/14689; H01L 27/14625; H01L 27/14609; H01L 27/14627
(Continued)

(56) References Cited

U.S. PATENT DOCUMENTS 4,910,568 A * 3/1990 Takei ................ H01L 27/14831
257/222
5,959,888 A * 9/1999 Araki ..................... H01L 27/115
365/185.14
(Continued)

*Primary Examiner* — Marc Anthony Armand
(74) *Attorney, Agent, or Firm* — Sheridan Ross P.C.

(57) ABSTRACT

Disclosed is a solid-state imaging device which includes a pixel section, a peripheral circuit section, a first isolation region formed with a STI structure on a semiconductor substrate in the peripheral circuit section, and a second isolation region formed with the STI structure on the semiconductor substrate in the pixel section. The portion of the second isolation region buried into the semiconductor substrate is shallower than the portion buried into the semiconductor substrate of the first isolation region, and the height of the upper face of the second isolation region is equal to that of the first isolation region. A method of producing the solid-state imaging device and an electronic device provided with the solid-state imaging devices are also disclosed.

11 Claims, 33 Drawing Sheets

Related U.S. Application Data application No. 13/178,624, filed on Jul. 8, 2011, now Pat. No. 8,728,852, which is a division of application No. 12/420,570, filed on Apr. 8, 2009, now abandoned.

(52) U.S. Cl.
CPC .. *H01L 27/14609* (2013.01); *H01L 27/14625* (2013.01); *H01L 27/14627* (2013.01)

(58) Field of Classification Search
USPC .......................................................... 257/432
See application file for complete search history.

(56) References Cited

U.S. PATENT DOCUMENTS

| | | | | |
|---|---|---|---|---|
| 2001/0025970 A1* | 10/2001 | Nozaki | ............. | H01L 27/14609 257/255 |
| 2005/0263804 A1* | 12/2005 | Yoshihara | ........... | H01L 27/1463 257/291 |
| 2006/0061674 A1* | 3/2006 | Iida | ................... | H01L 27/14621 348/308 |
| 2007/0029463 A1* | 2/2007 | Park | ................. | H01L 27/14689 250/208.1 |
| 2007/0087518 A1* | 4/2007 | Ochi | ................ | H01L 21/31053 438/424 |
| 2007/0128954 A1* | 6/2007 | Itonaga | ............... | H01L 27/1463 439/852 |
| 2008/0017901 A1* | 1/2008 | Sato | .................... | H04N 3/1568 257/292 |

* cited by examiner

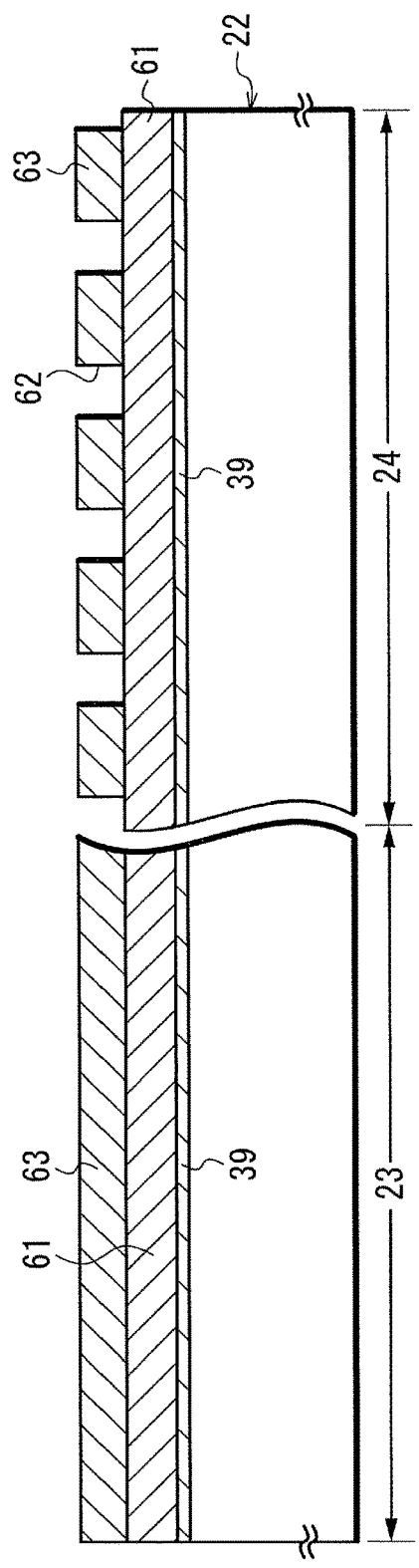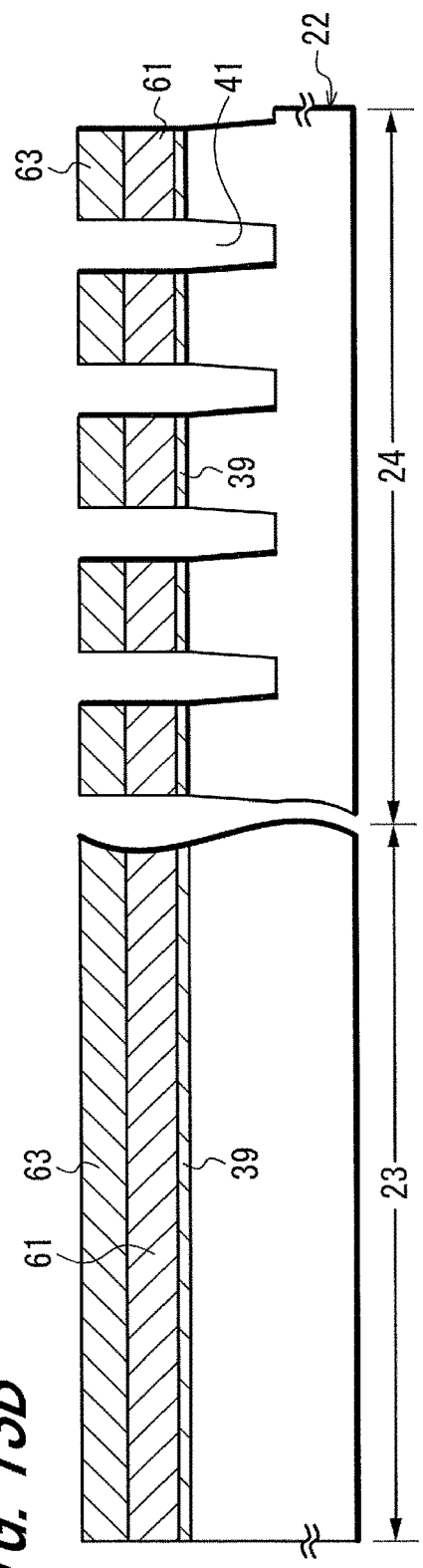

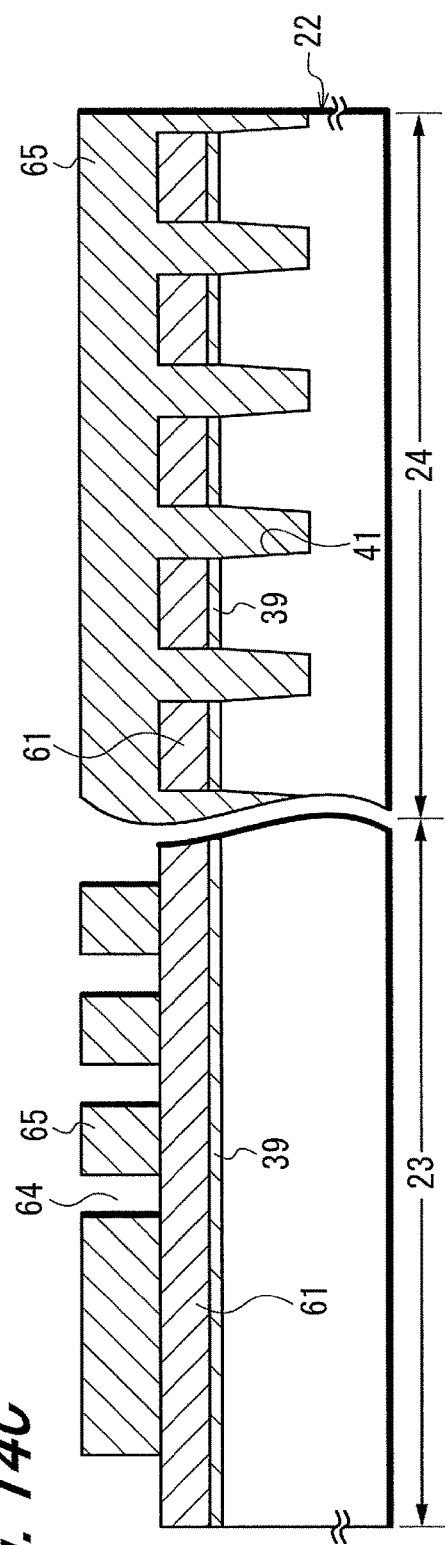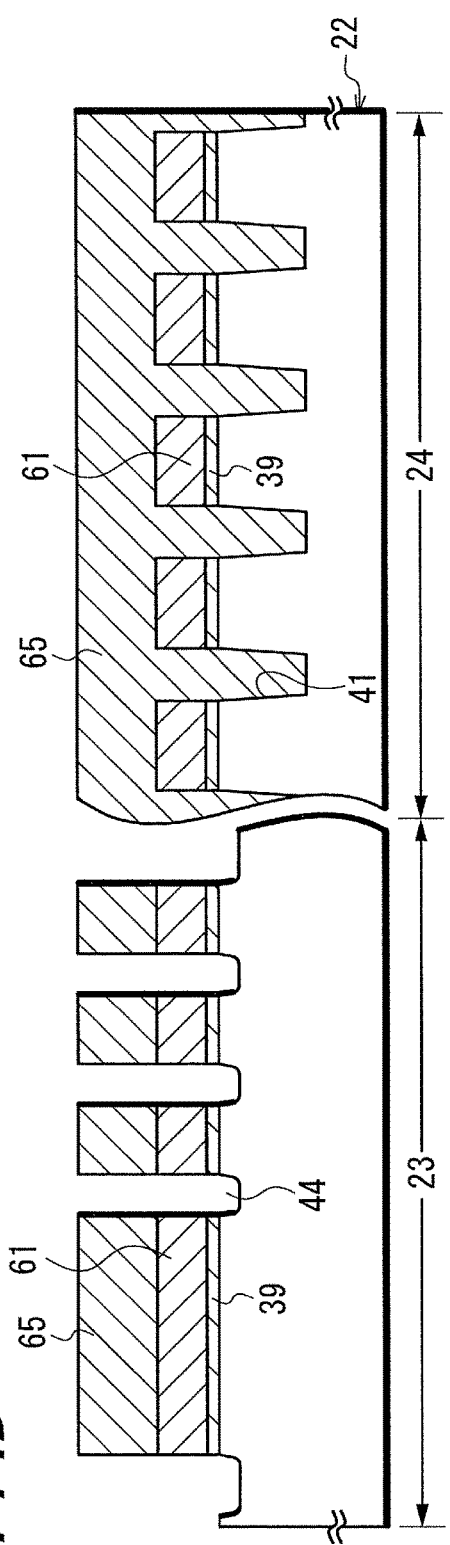

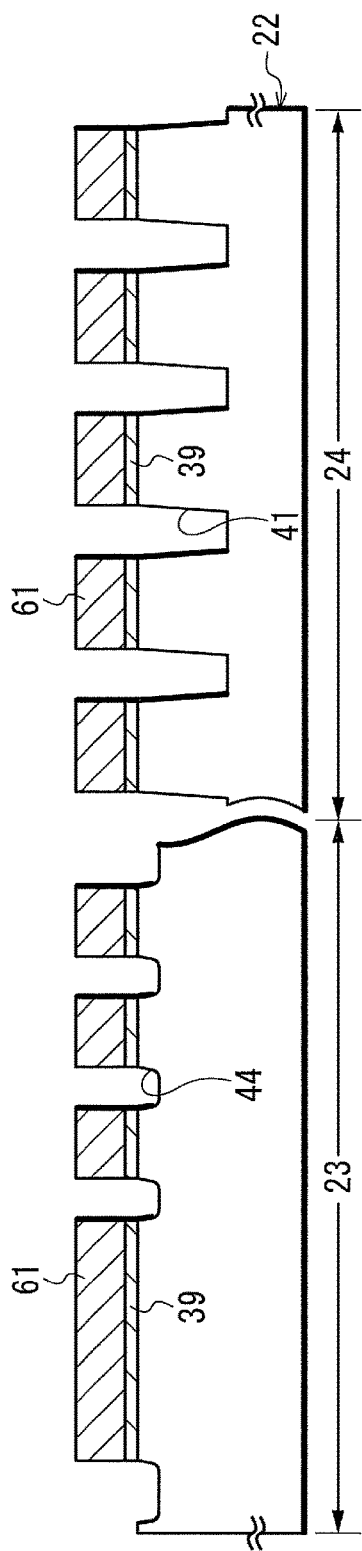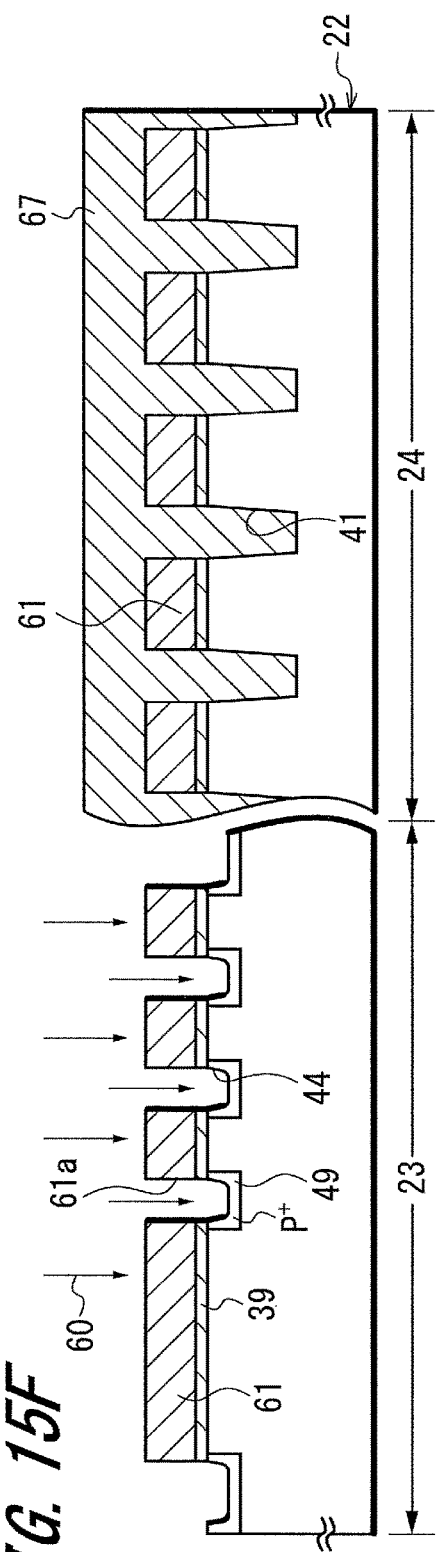

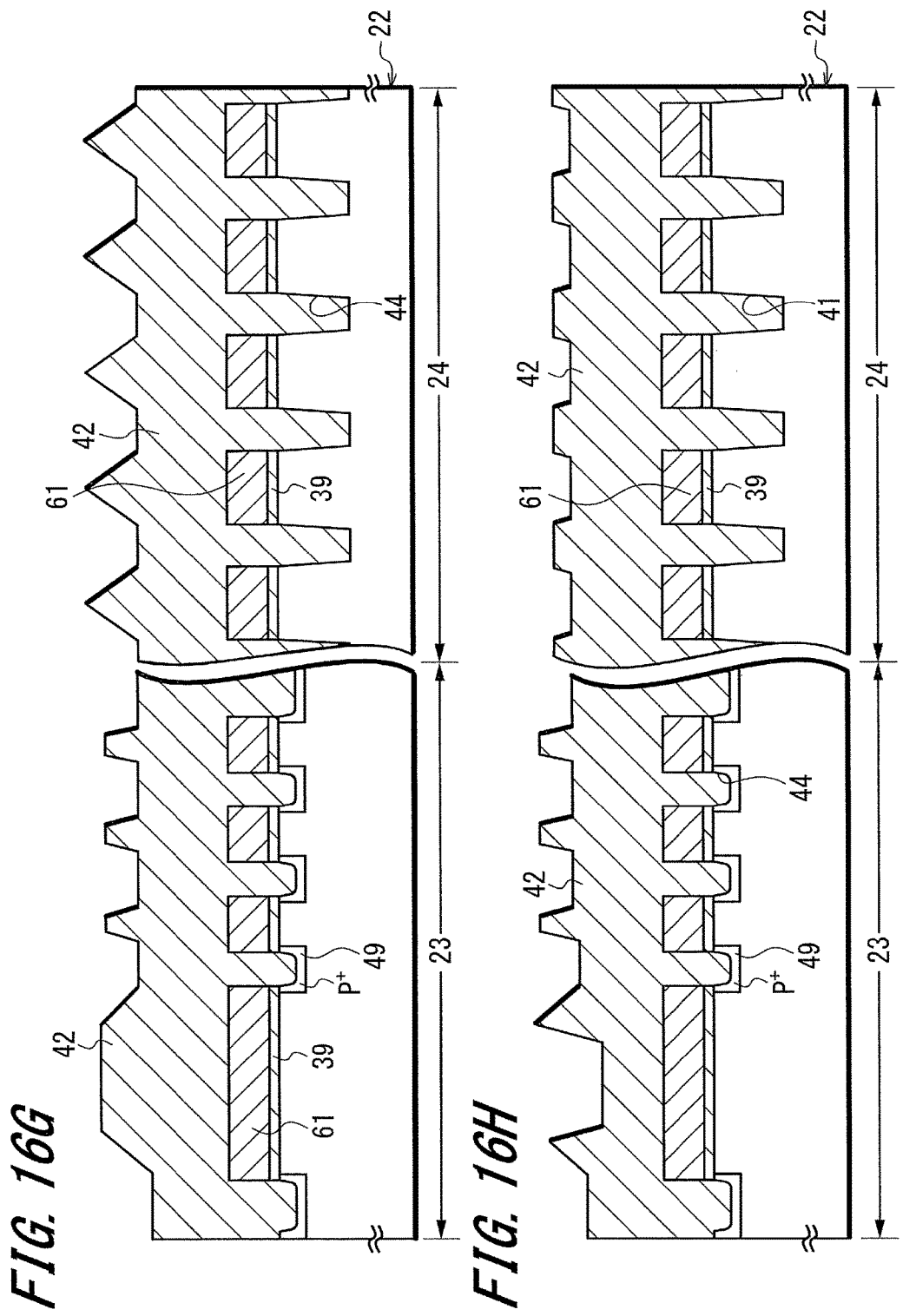

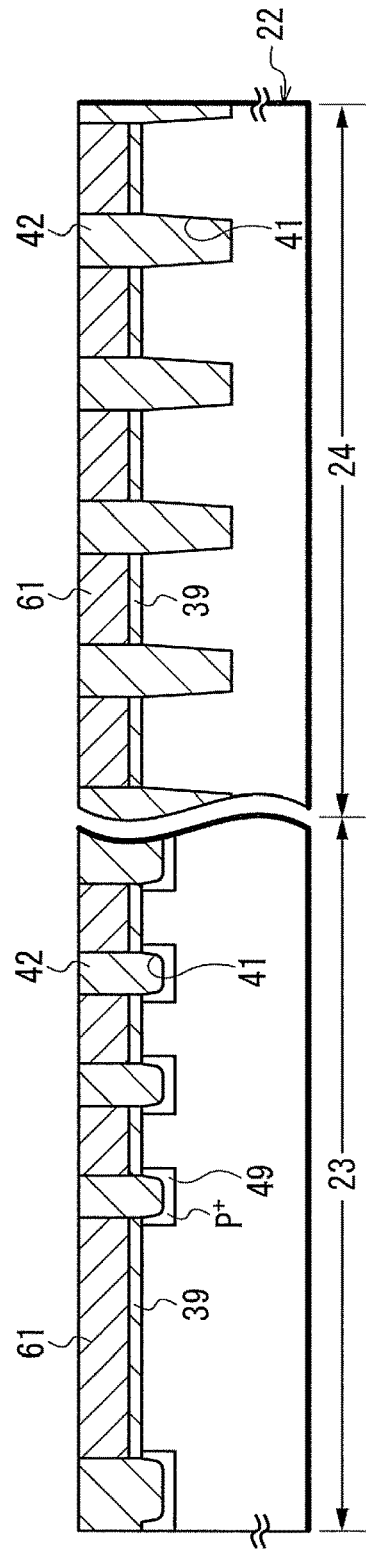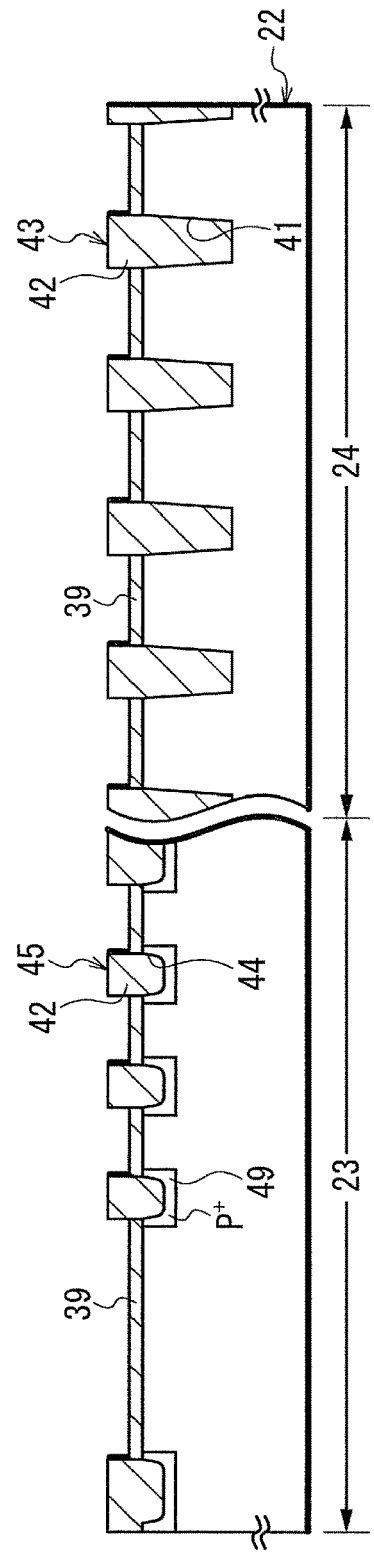

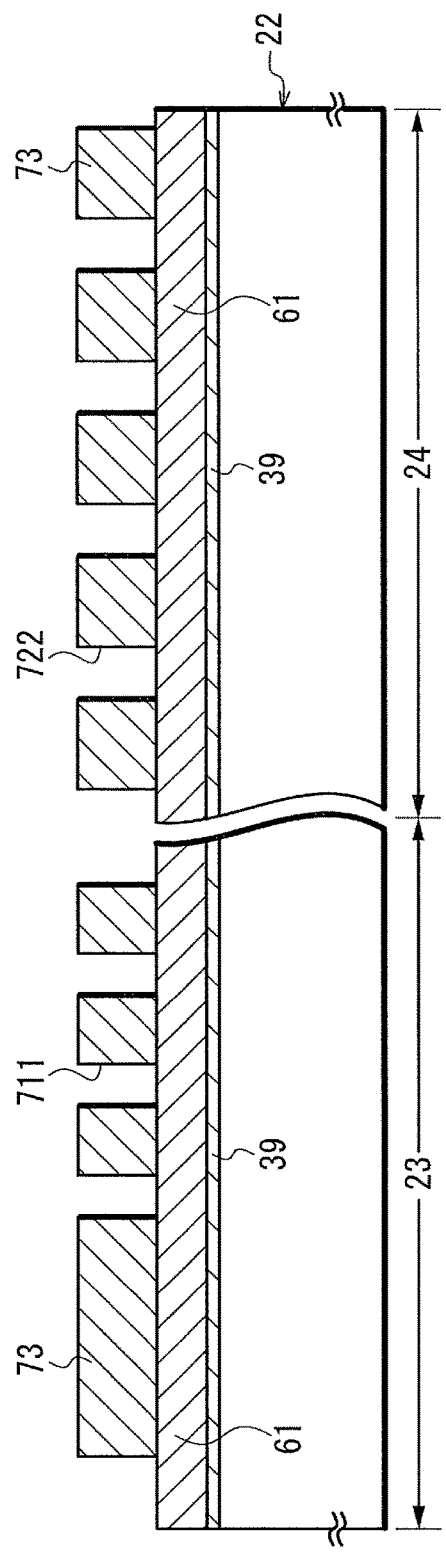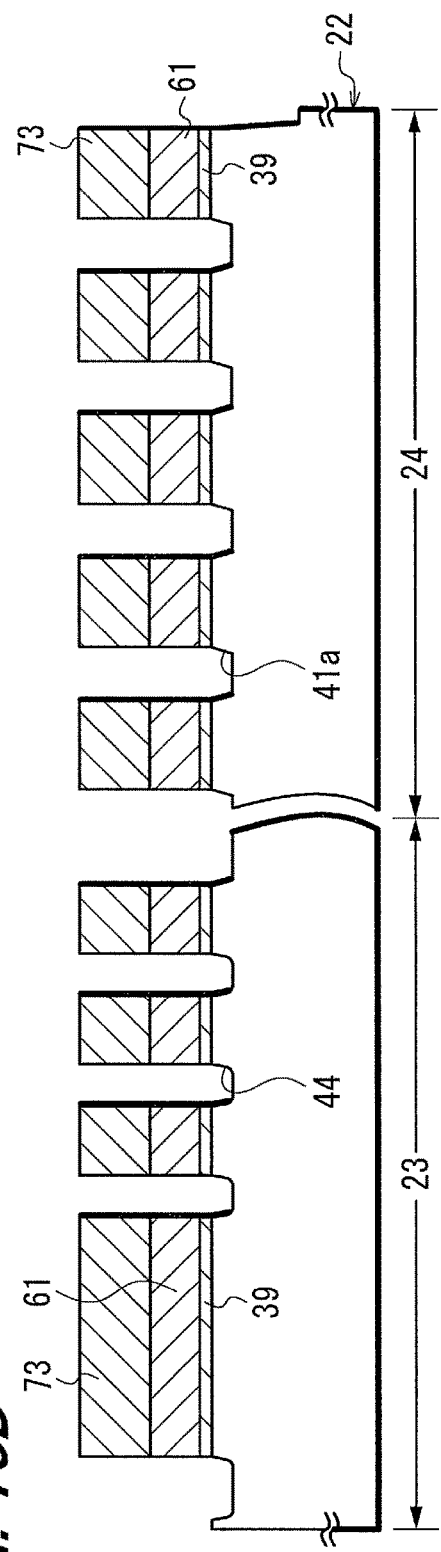

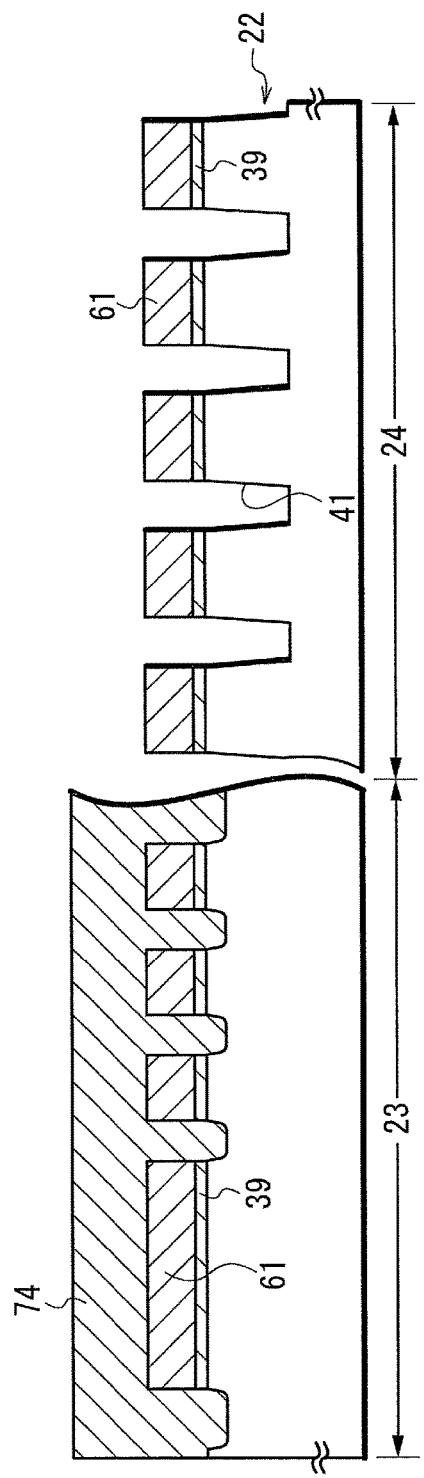
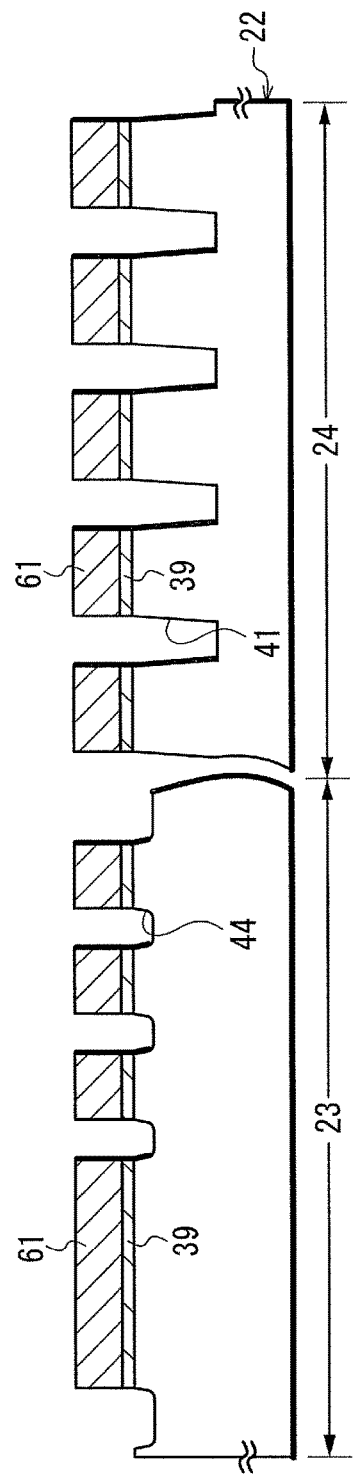

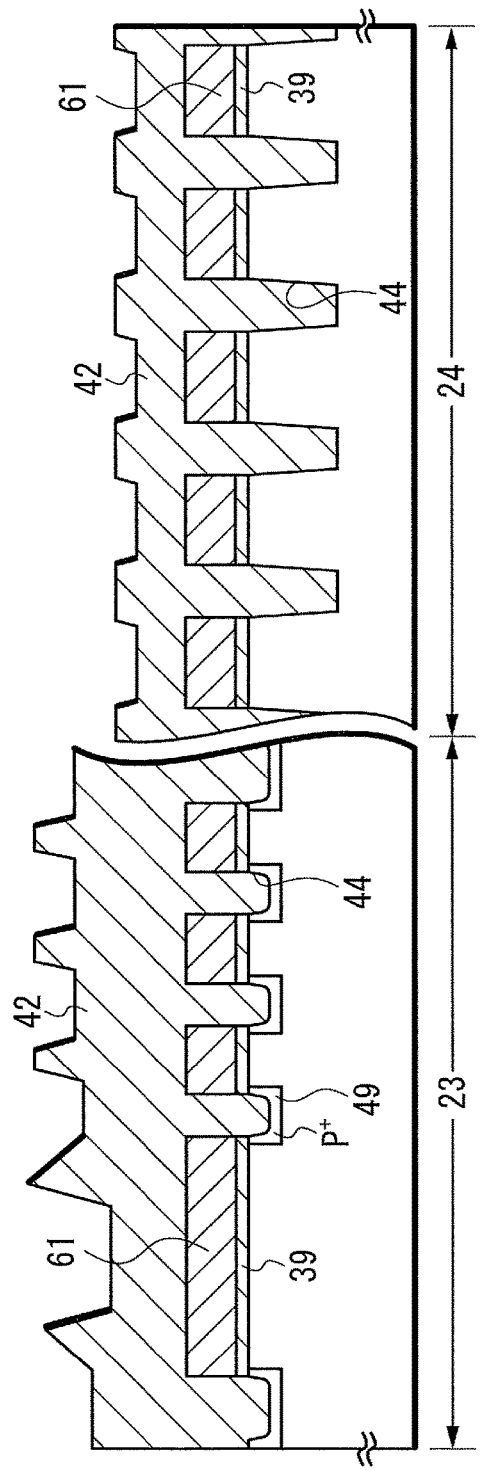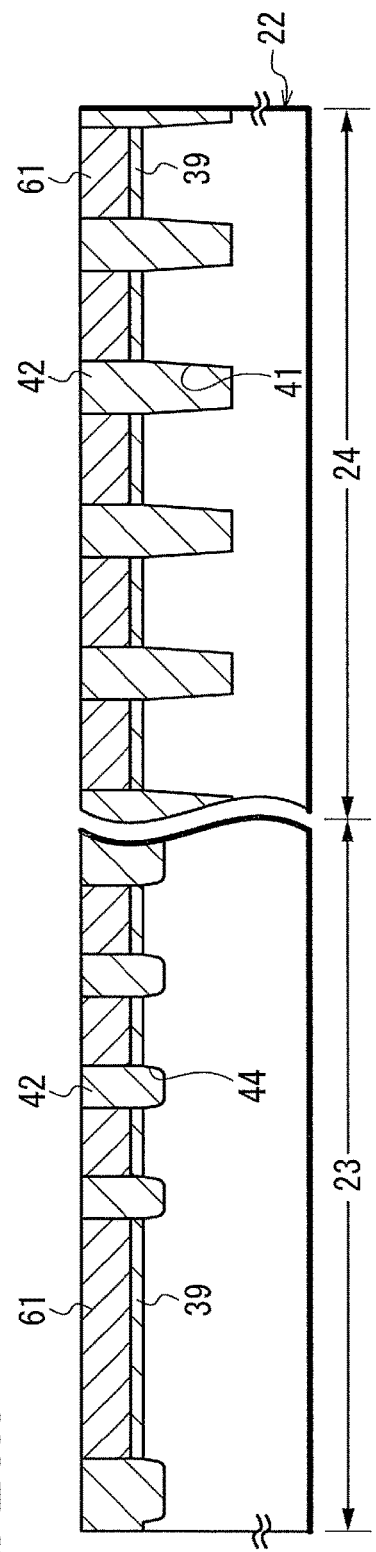

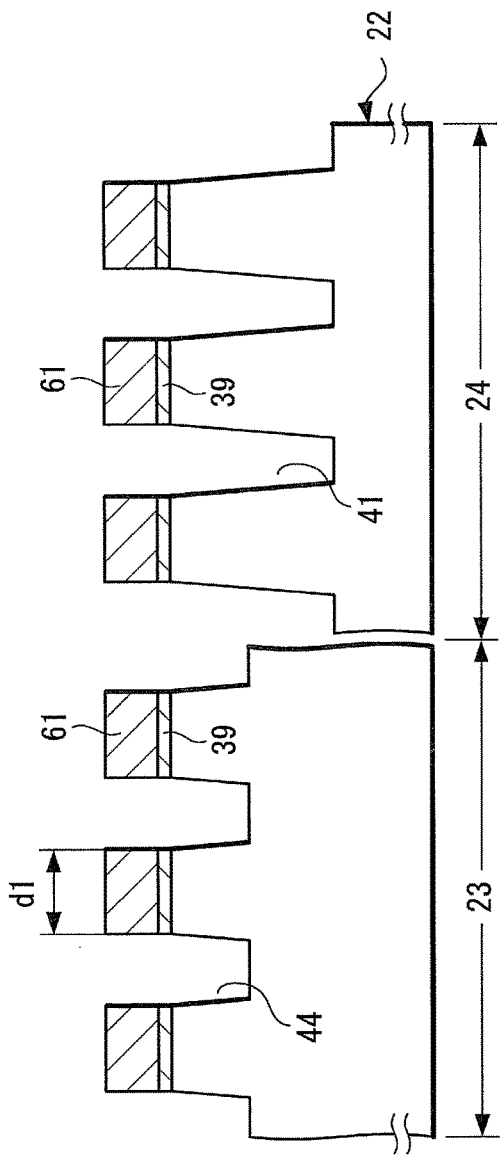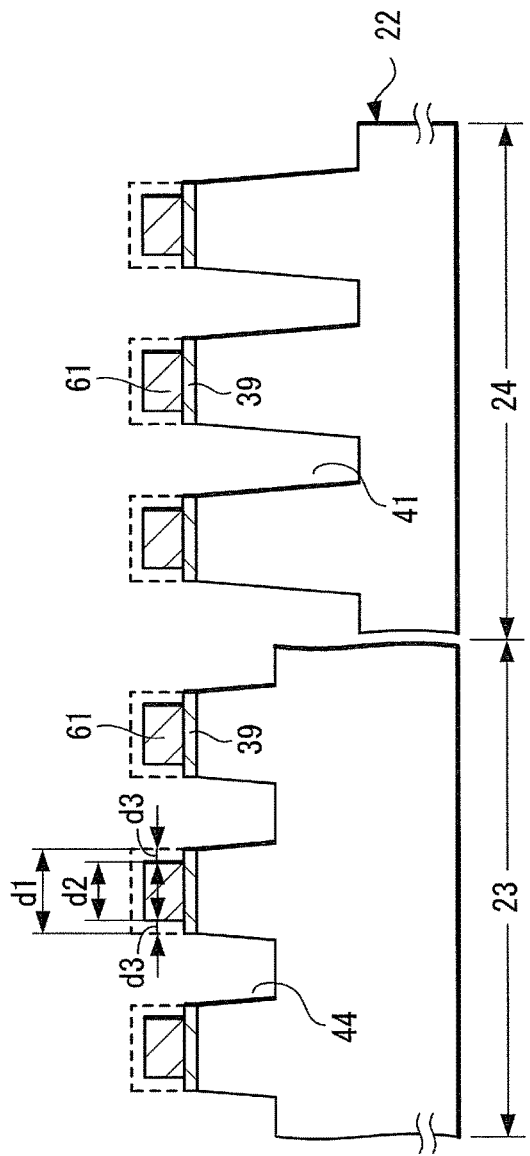
FIG. 23A
FIG. 23B

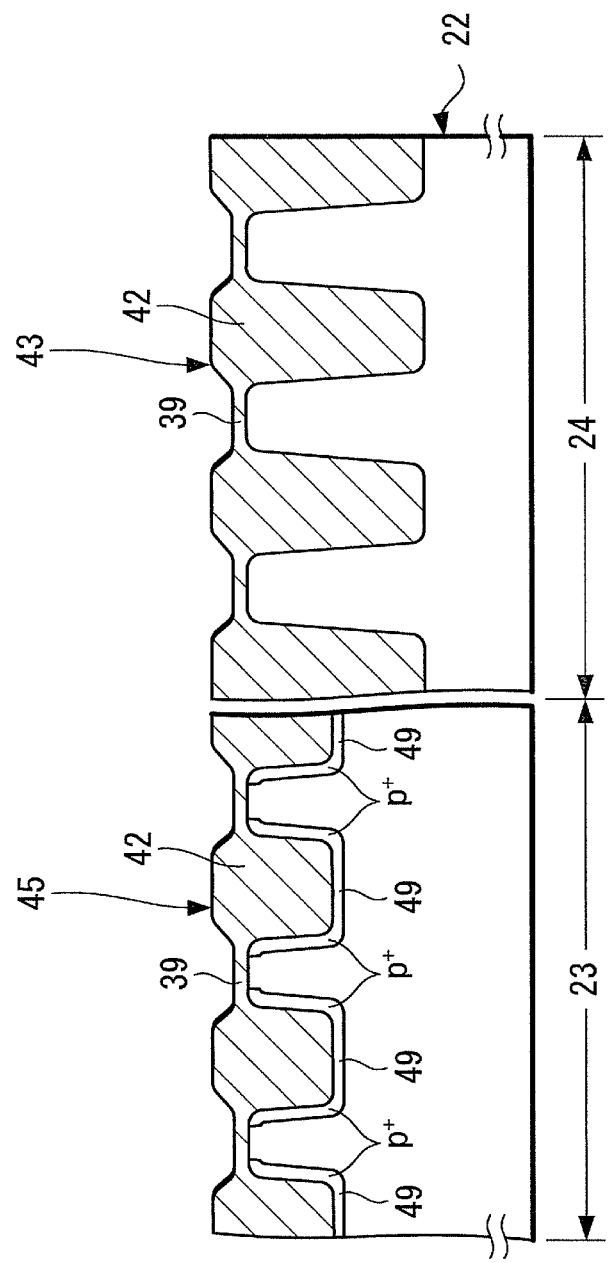

SOLID-STATE IMAGING DEVICE, PRODUCTION METHOD THEREOF, AND ELECTRONIC DEVICE

CROSS-REFERENCE TO RELATED APPLICATIONS

This application is a continuation of U.S. patent application Ser. No. 14/244,485, filed Apr. 3, 2014, which is a divisional of U.S. patent application Ser. No. 13/178,624, filed Jul. 8, 2011, which is a divisional of U.S. patent application Ser. No. 12/420,570, filed Apr. 8, 2009, which claims priority to Japanese Patent Application Serial Nos. JP 2008-101971, JP 2008-199050, and JP 2008-201117, filed in the Japan Patent Office on Apr. 9, 2008, Jul. 31, 2008, and Aug. 4, 2008, respectively, the entire disclosures of which are hereby incorporated herein by reference.

BACKGROUND OF THE INVENTION

1. Field of the Invention

The invention generally relates to solid-state imaging devices, production methods thereof, and electronic devices provided with the solid-state imaging devices.

2. Description of the Related Art

Solid-state imaging devices are broadly classified into amplification type solid-state imaging devices, which are typically illustrated by CMOS (complementary metal-oxide semiconductor) image sensors, and charge transfer type imaging devices, which are typified by CCD (charge-coupled device) image sensors. The solid-state imaging devices have been used extensively in digital still cameras, digital camcorders, etc. In addition, as solid-state imaging devices mounted in mobile devices such as cellular phones with camera, PDA (personal digital assistant), etc., CMOS image sensors are used more frequently in recent years owing to relatively low source voltages and low power consumption characteristics among others.

In the CMOS solid-state imaging device including a pixel section and a peripheral circuit section, the configuration of isolation regions is known, which are formed with the same STI (shallow trench isolation) structure in both the pixel section and the peripheral circuit section. In addition, in the CMOS solid-state imaging device, another configuration of isolation regions in the pixel section is also known, which are formed with diffusion layers (see Japanese Unexamined Patent Application Publication No. 2005-347325 and Japanese Unexamined Patent Application Publication No. 2006-24786.). FIG. 1 is a schematic view illustrating an exemplary CMOS solid-state imaging device provided with isolation regions formed with diffusion layers.

Referring to FIG. 1, a CMOS solid-state imaging device 101 is provided, including a pixel section 103 having plural pixels arranged on a semiconductor substrate 102, and a peripheral circuit section 104 including logic circuits, formed on the periphery of the pixel section 103. In the pixel section 103, plural unit pixels 110 are disposed to be arrayed two-dimensionally, in which each of the unit pixels is formed, including a photodiode (PD) 107 serving as a photoelectric conversion element and several pixel transistors 108. These pixel transistors are representatively illustrated in FIG. 1 by the single pixel transistor 108 for the purposes of clarity, and the pixel transistor 108 is formed, including source/drain regions 109, and a gate insulating film and a gate electrode (not shown). A multilevel wiring layer 114 is formed above the pixel 110, including multiple wiring layers 113 having insulator films 112 formed thereunder for passivation, and an on-chip color filter 115 and an on-chip micro-lens 116 are formed on thus formed structure. Although not shown in the drawing, another multilevel wiring layer is similarly formed in the peripheral circuit section 104, including multiple layers of wiring having insulator films formed thereunder.

The isolation region 121 in the pixel section 103 is formed, including a p+ diffusion region 122 formed by ion implantations in the semiconductor substrate 102, and an insulator layer 123 of a silicon oxide film formed on the diffusion region. Although the insulator layer 123 is partially buried into the substrate 102, the buried depth h1 is set to be 50 nm or less, and the total thickness is set in the range approximately from 50 to 150 nm. In the peripheral circuit section 104, on the other hand, an isolation region 125 is formed with the STI structure, consisting of a trench 126 disposed in the semiconductor substrate 102, and an insulator layer 127 of a silicon oxide film buried into the trench 126. The buried depth h2 of the insulating layer 127 into the substrate 102 is in the range approximately from 200 to 300 nm, and its protrusion height h3 protruded out of the substrate surface is sufficiently lower than the protrusion height h4 of the insulator layer 123 in the pixel section 103.

In addition, an example of an isolation region formed in a pixel section is disclosed in Japanese Unexamined Patent Application Publication No. 2005-191262, and another example of isolation region in DRAM is disclosed in Japanese Unexamined Patent Application Publication No. 2007-288137.

SUMMARY OF THE INVENTION

With regard to isolation regions in the solid-state imaging device, the former of the abovementioned structures, which forms the regions with the same STI structure in both the pixel section and the peripheral circuit section, is known to have a problem of increasing white spots. Namely, since the STI isolation regions in the pixel section are formed deep into the semiconductor substrate similarly to the STI isolation regions in the peripheral circuit section, the effects of stresses and damages exerted onto the photodiode increase, and this results in the increase of white spots. In order to suppress these white spots, the pinning (i.e., hole accumulation) has to be strengthened at the edges of the STI isolation regions. Since the strengthening of pinning, or increase in hole accumulation, is implemented by p-type ion implantations, this tends to reduce the area of n-type regions constituting the photodiode and the amount of saturation signals is decreased accordingly. Therefore, there is a trade-off between the strengthening of pinning and the reduction of the amount of saturation signals.

The latter of the abovementioned structures (with reference to the structure of FIG. 1) may be taken as a remedial measure, which forms the isolation region 121 including the p+ diffusion region 122 and the insulator layer 123 disposed on the diffusion region. However, in this case, there is a problem of increasing the number of processes, since the formation of the abovementioned diffusion region has to be included in addition to the processes of forming the isolation region 125 with the STI structure in the peripheral circuit section 104. In addition, as shown in FIGS. 2A and 2B, since the protrusion height h4 of the insulator layer 123 is relatively large in the isolation region 121 of the pixel section, there is a problem of generating a polysilicon residue 133a, etc. during process steps for forming gate electrodes 131 (131A, 131B, 131C) of pixel transistors. Namely, as shown in FIG. 2B, when a polysilicon film 133 is disposed over the entire surface and subsequently subjected to a patterning process using lithography and etching techniques, the residue 133a of conductive polysilicon is formed with relative ease on the sidewall of the insulator layer 123 having a large step difference. When the polysilicon residue 133a is formed, several adverse effects may arise such as short circuit failures between neighboring gate electrodes 131 of the pixel transistors and defects of imaging characteristics. Incidentally, the notations 131A, 131B, and 131C used in FIGS. 2A and 2B stand for gate electrodes of transfer, reset, and amplifying transistors, respectively. In addition, the notations 134 indicate n+ source/drain regions.

Moreover, with the structure shown in FIG. 1, since the protrusion height h4 from the substrate is large for the insulator layer constituting the isolation region in the pixel section, the distance L1 between the photodiode and the on-chip micro-lens tends to become large, which is disadvantageous to the condensing efficiency and results in the decrease in the sensor sensitivity.

In view of the abovementioned and other difficulties, the present invention provides a solid-state imaging device that enables reducing the number of production processes and improving pixel characteristics including the sensitivity, and a production method thereof. In addition, this invention provides an electronic device incorporating the solid-state imaging device.

The solid-state imaging device according to an embodiment of the invention is provided, including a pixel section, a peripheral circuit section, a first isolation region formed with the STI structure on a semiconductor substrate in the peripheral circuit section, and a second isolation regions formed with the STI structure on the semiconductor substrate in the pixel section. The second isolation region in the pixel section is formed such that the portion thereof buried into the semiconductor substrate is shallower than the portion buried into the semiconductor substrate of the first isolation region and the height of the upper face thereof is equal to that of the first isolation region with the STI structure.

In the solid-state imaging device according to the embodiment of the present invention, the portion buried into the semiconductor substrate of the second isolation region in the pixel section is shallower than the portion buried into the semiconductor substrate of the first isolation region in the peripheral circuit section, so that adverse effects of stresses and damages onto the photoelectric conversion element are suppressed. The surface height of the second isolation region in the pixel section is made to be equal to and as low as that of the first isolation region in the peripheral circuit section, so that in fabricating gate electrodes after forming device separation regions, no electrode material remains on the sidewalls of the device separation regions. Because the surface height of the second isolation region in the pixel section is made equal to that of the first isolation region in the peripheral circuit section, the increase of processing steps due to the difference in the STI structures of the first and second isolation regions can be suppressed to a minimum.

With the solid-state imaging device according to the embodiment of the invention, since the surface height of second isolation regions in the pixel section is brought to be equal to and as low as the surface height of the first isolation regions in the peripheral circuit section, the film thickness of insulating interlayers from the surface of the photoelectric conversion element to the wiring on the lowermost layer is decreased. As a result, the distance between the photoelectric conversion element and an on-chip micro-lens becomes small according to the abovementioned decrease in the film thickness, whereby the condensing efficiency is improved. Since the portion of the second isolation regions buried in the semiconductor substrate in the pixel section is shallower than the portion of the first isolation regions buried in the semiconductor substrate in the peripheral circuit section, adverse effects onto the photoelectric conversion element due to stresses and damages can be suppressed. The surface height of second isolation regions in the pixel section is brought to be equal to and as low as that of the first isolation regions in the peripheral circuit section, as mentioned above. Therefore, no electrode material remains on the sidewalls of the isolation regions during the gate electrode fabrication following the formation of the isolation regions.

A method of producing the solid-state imaging device according to an embodiment of the invention is provided, including the steps of (a) forming a first trench in the portion where an isolation region is to be formed in the peripheral circuit section on a semiconductor substrate and a second trench in the portion where another isolation region is to be formed in the pixel section on the semiconductor substrate, in which the second trench is shallower than the first trench, (b) forming a insulator layer over the structure including the interiors of the first and second trenches, and (c) forming first and second isolation regions to have the surface heights equal to each other through polishing the insulator layer.

With the method of producing the solid-state imaging device according to the embodiment of the invention, both the deposition of the insulator layer into the first trench formed on the side of the peripheral circuit section and the second trench formed on the side of the pixel section having a shallower depth than the first trench and the polishing of the insulator layer are performed in the same process, and the surface heights of the insulator layer, which is used for forming the first and second isolation regions, are brought to be equal to each other. As a result, the increase of the processing steps due to the difference in the STI structures of the first and second isolation regions can be suppressed to a minimum.

Since the surface height of second isolation regions in the pixel section is brought to be equal to and as low as that of the first isolation regions in the peripheral circuit section, no electrode material remains on the sidewalls of the isolation regions during the gate electrode fabrication following the formation of the isolation regions. Since the second trenches on the side of the pixel section are formed to be shallower than the first trenches on the side of the peripheral circuit section, the adverse effects of stresses and damages can be suppressed, which are otherwise exerted by the second isolation regions onto the photoelectric conversion element.

An electronic device according to an embodiment of the invention is provided, including a solid-state imaging device, an optical system configured to lead incident light to a photoelectric conversion element included in the solid-state imaging device, and a signal processing circuit configured to process output signals from the solid-state imaging device.

This solid-state imaging device includes a pixel section and a peripheral circuit section, in which first isolation regions are formed with the STI structure on a semiconductor substrate in the peripheral circuit section, and second isolation regions are formed with the STI structure on the semiconductor substrate in the pixel section. The second isolation regions in the pixel section are formed such that the portion thereof buried into the semiconductor substrate is shallower than the portion buried into the semiconductor substrate of the first isolation regions, and the height of the upper face thereof is equal to that of the first isolation regions with the STI structure.

In the electronic device according to the embodiment of the present invention, in the solid-state imaging device, the portion buried into the semiconductor substrate of the second isolation region in the pixel section is shallower than the portion buried into the semiconductor substrate of the first isolation region in the peripheral circuit section, so that adverse effects of stresses and damages by the second isolation region onto the photoelectric conversion element are suppressed. The surface height of the second isolation region in the pixel section is made to be equal to and as low as that of the first isolation region in the peripheral circuit section, so that in fabricating gate electrodes after forming device separation regions, no electrode material remains on the sidewalls of the device separation regions. Because the surface height of the second isolation region in the pixel section is made equal to that of the first isolation region in the peripheral circuit section, the increase of the processing steps due to the difference in the STI structures of the first and second isolation regions can be suppressed to a minimum.

With the electronic device according to the embodiment of the invention, since the surface height of second isolation regions in the pixel section is brought to be equal to and as low as the surface height of the first isolation regions in the peripheral circuit section, the film thickness of insulating interlayers decreases and the condensing efficiency is improved. The portion of the second isolation regions buried in the semiconductor substrate in the pixel section is shallower than the portion of the first isolation regions buried in the semiconductor substrate in the peripheral circuit section. As a result, adverse effects onto the photoelectric conversion element due to stresses and damages by the second isolation region can be suppressed. Since the surface height of second isolation regions in the pixel section is brought to be equal to and as low as that of the first isolation regions in the peripheral circuit section, no electrode material remains on the sidewall of the isolation regions during the gate electrode fabrication following the formation of the isolation regions.

According to an embodiment of the present invention, therefore, the reduction of processes and the improvement in the pixel characteristic including sensitivity can be achieved.

BRIEF DESCRIPTION OF THE DRAWINGS

The preferred embodiments of the invention will be described in detail with reference to the following drawings, wherein:

FIGS. 13A and 13B illustrate, in a series of diagrammatic cross-sectional views, a sequence of process steps utilized in producing a solid-state imaging device according to a first embodiment of the production method of the present invention;

FIGS. 14C and 14D illustrate, in a series of diagrammatic cross-sectional views, a sequence of process steps utilized in producing a solid-state imaging device according to a first embodiment of the production method of the present invention;

FIGS. 15E and 15F illustrate, in a series of diagrammatic cross-sectional views, a sequence of process steps utilized in producing a solid-state imaging device according to a first embodiment of the production method of the present invention;

FIGS. 16G and 16H illustrate, in a series of diagrammatic cross-sectional views, a sequence of process steps utilized in producing a solid-state imaging device according to a first embodiment of the production method of the present invention;

FIGS. 17I and 17J illustrate, in a series of diagrammatic cross-sectional views, a sequence of process steps utilized in producing a solid-state imaging device according to a first embodiment of the production method of the present invention;

FIGS. 18A and 18B illustrate, in a series of diagrammatic cross-sectional views, a sequence of process steps utilized in producing a solid-state imaging device according to a second embodiment of the production method of the present invention;

FIGS. 19C and 19D illustrate, in a series of diagrammatic cross-sectional views, a sequence of process steps utilized in producing a solid-state imaging device according to a second embodiment of the production method of the present invention;

FIGS. 21G and 21H illustrate, in a series of diagrammatic cross-sectional views, a sequence of process steps utilized in producing a solid-state imaging device according to a second embodiment of the production method of the present invention;

FIGS. 23A and 23B illustrate, in a series of diagrammatic cross-sectional views, a sequence of process steps utilized in producing a solid-state imaging device according to a third embodiment of the production method of the present invention;

FIG. 25 illustrates, in a series of diagrammatic cross-sectional views, a sequence of process step utilized in producing a solid-state imaging device according to a third embodiment of the production method of the present invention;

DESCRIPTION OF THE PREFERRED EMBODIMENTS

Figure 1:
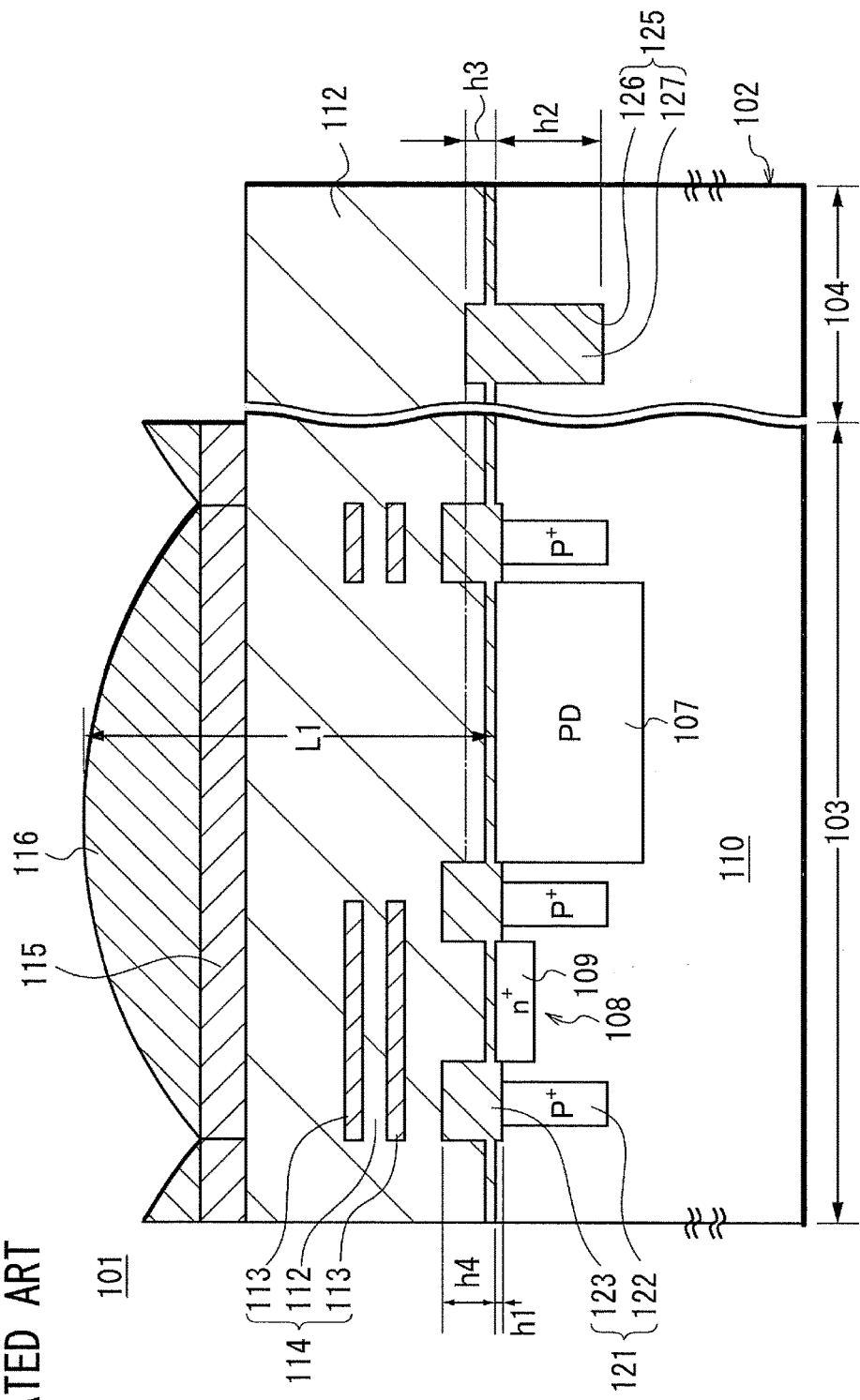
FIG. 1 is a schematic view illustrating the major portion of the related art solid-state imaging device.

Embodiments of the present invention will be described hereinbelow by referring to the accompanying drawings. It is not intended to be exhaustive or to limit the invention to those disclosed in the embodiments and illustrated in the drawings.

The solid-state imaging device according to an embodiment of the present invention is characterized by the configuration of isolation regions included in a pixel section and a peripheral circuit section of the imaging device.

Figure 3:
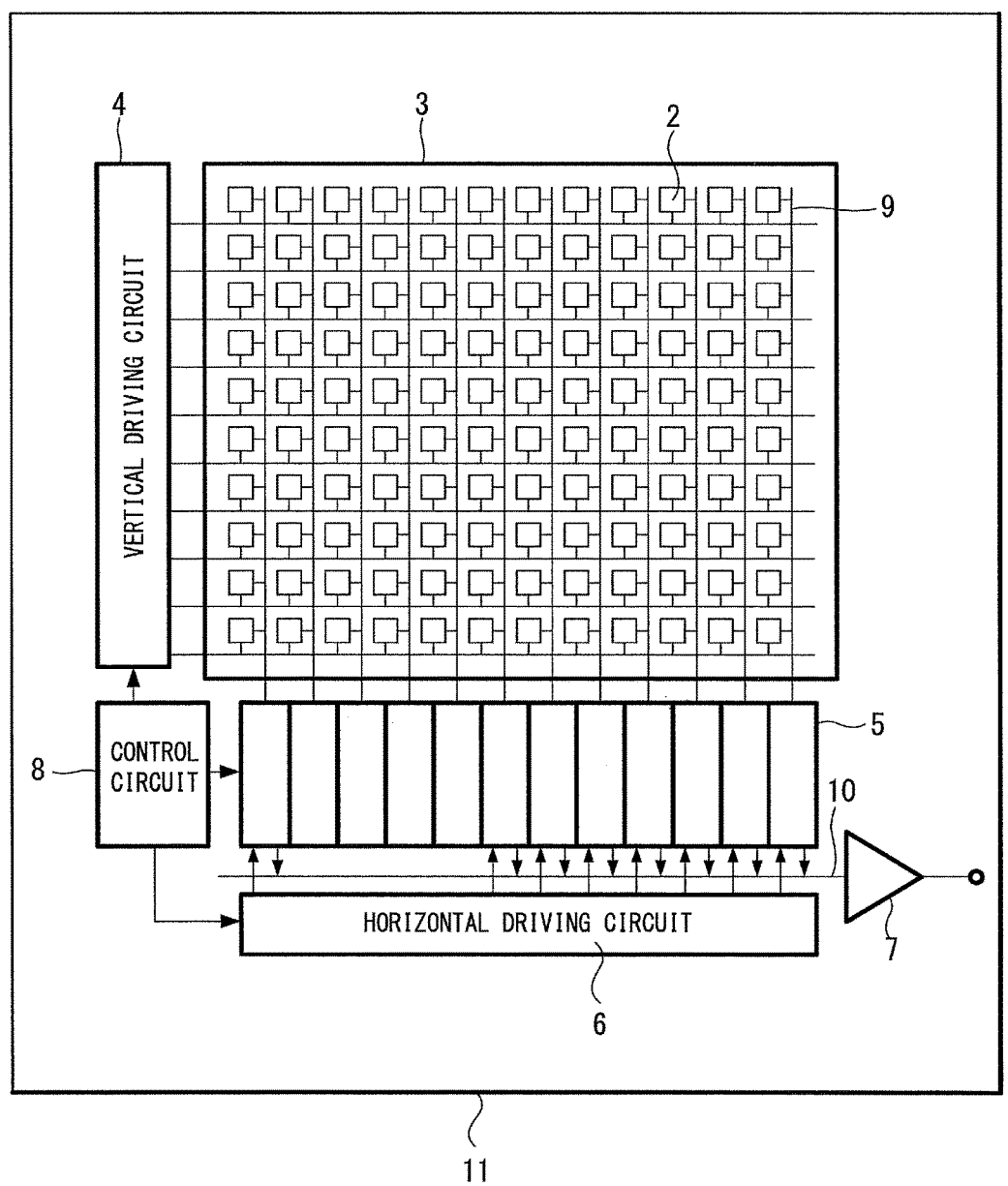
FIG. 3 is a drawing generally illustrating a configuration adapted to a solid-state imaging device according to an embodiment of the present invention.

FIG. 3 is a drawing generally illustrating a configuration of a solid-state imaging device or CMOS image sensor to which the an embodiment of present invention is applied. The solid-state imaging device 1 in this example is provided, including a pixel section 3 (so-called imaging section) having plural pixels 2 with plural photoelectric conversion elements regularly arranged in two-dimension on a semiconductor substrate 11 of silicon substrate, for example, and also including a peripheral circuit section. Each of the plural pixels 2 is formed, including a photodiode for example, serving as a photoelectric conversion element, and several pixel transistors (so-called MOS transistors). These pixel transistors are provided, including four transistors, for example, a transfer transistor, a reset transistor, an amplifying transistor, and a select transistor. The pixel transistors may alternatively be provided, including three transistors such as the transfer, reset, and amplifying transistors, excepting the select transistor. Since the equivalent circuit of a unit pixel is similar to the one in the past, a detailed description thereof is omitted herein.

The peripheral circuit section is provided, including a vertical driving circuit 4, column signal processing circuits 5, a horizontal driving circuit 6, an output circuit 7, and a control circuit 8, etc.

The control circuit 8 is configured to generate, based on vertical synchronizing signals, horizontal synchronizing signals, and the master clock, clock signals and control signals, which are used as the standard for the operation of the vertical driving circuit 4, column signal processing circuits 5, and horizontal driving circuit 6, and to input these generated signals to the vertical driving circuit 4, column signal processing circuits 5, horizontal driving circuit 6, etc.

The vertical driving circuit 4 is provided, including shift registers, for example, and configured to selectively scan each of the pixels 2 included in the pixel section 3 sequentially row by row in the vertical direction, and to supply pixel signals based on signal charges generated corresponding to the amount of light received by the photoelectric conversion element in each pixel 2, i.e., photodiode in this example, to the column signal processing circuits 5 by way of vertical signal lines 9.

The column signal processing circuits 5 are provided for example for respective columns of the pixels 2 included in the pixel section, and configured to implement various types of signal processing such as noise removal, which is performed by comparing, pixel column by column, a first group of the signals output from the pixels 2 on the presently selected column with a second group of the signals output from black reference pixels (disposed surrounding an effective pixel region). Namely, the column signal processing circuits 5 perform signal processing such as CDS (correlated double sampling) to remove fixed pattern noises inherent to the pixels 2, signal amplification, and other similar processes. To the output stage of the column signal-processing circuits 5, horizontal select switches (not shown) are connected between the column signal-processing circuits 5 and a horizontal signal line 10.

The horizontal driving circuit 6 is provided, including shift registers, for example, and configured to sequentially select each of the column signal processing circuits 5 by successively outputting horizontal scanning pulses, and to output pixel signals from each of the column signal processing circuits 5 to the horizontal signal line 10. The output circuit 7 is configured to perform signal processing onto the signals successively supplied by each of the column signal processing circuits 5 through the horizontal signal line 10, and output the thus processed signals.

In addition, since a surface illumination type solid imaging sensor is contemplated in the present example, a multilevel wiring layer is formed above the substrate surface on the side where the pixel section 3 and the peripheral circuit section are formed, having insulator films formed thereunder for passivation. In the pixel section 3, an on-chip color filter is formed on the multilevel wiring layer having a planarizing film formed thereunder, and further thereon an on-chip micro-lens is formed. A shading film is formed in the regions other than pixel regions in the imaging section. In more detail, the shading film is disposed in both the peripheral circuit section and the region in the imaging section other than the photodiodes (so-called photodetector parts). The shading film may be formed using the uppermost wiring layer of the multilevel wiring layer.

Incidentally, as described later on, with the backside illumination type solid-state imaging device, no multilevel wiring layer is formed on the backside as the light incidence side (so-called light receiving surface). Namely, the multilevel wiring layer is formed on the surface side opposite to the light receiving surface.

Although the solid-state imaging device according to the present embodiments of the invention, and particularly the configuration of isolation regions formed therein, can primarily be adapted to CMOS solid-state imaging devices as described herein, it is not intended to limit the invention to those disclosed in the embodiments.

First Embodiment of the Solid-State Imaging Device

Figure 4:
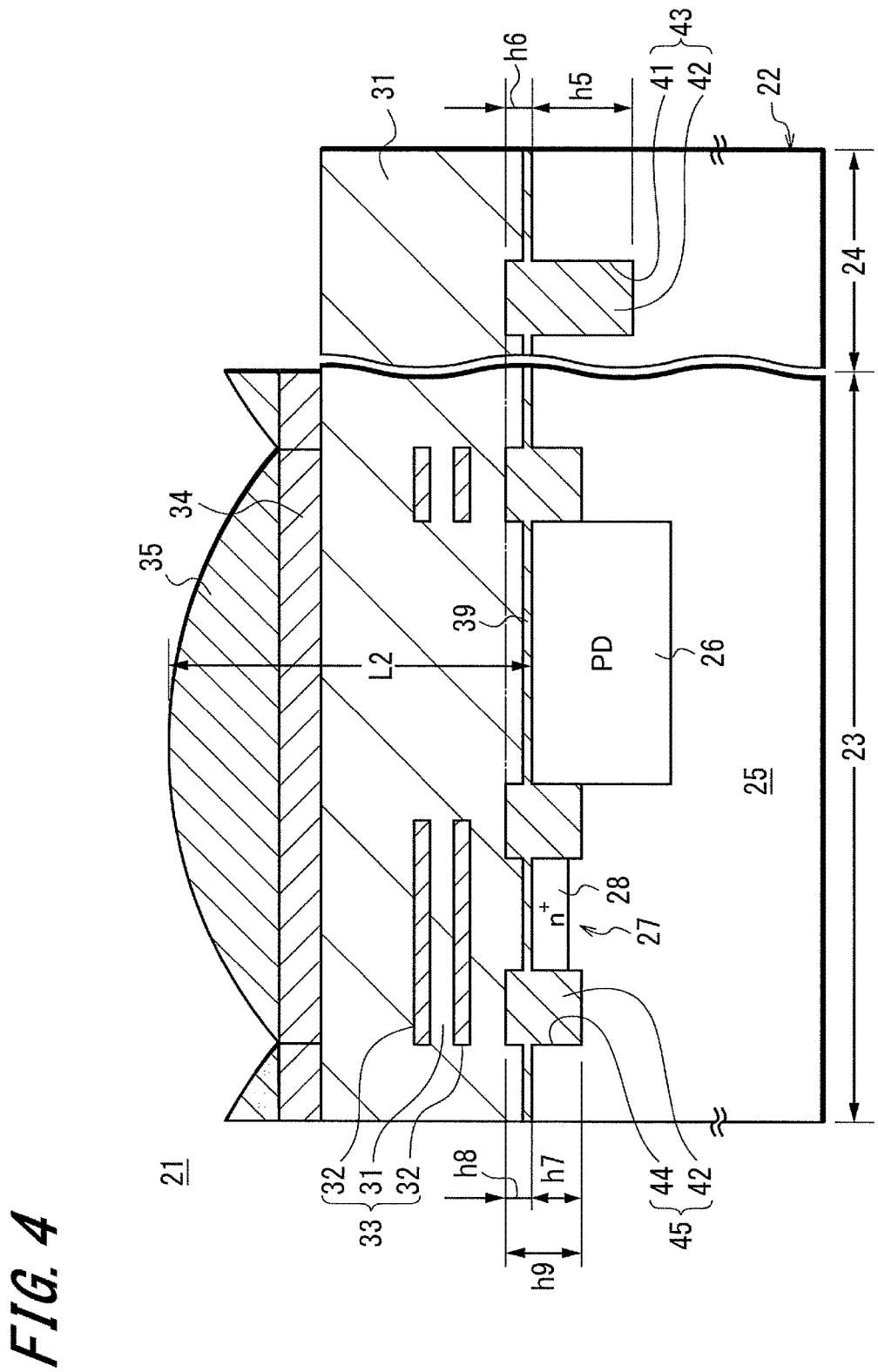
FIG. 4 is a schematic view illustrating the major portion of the solid-state imaging device according to a first embodiment of the present invention.

FIG. 4 is a schematic view illustrating a solid-state imaging device according to a first embodiment of the present invention. Referring to FIG. 4, the major portions of the imaging device are shown including a pixel section (so-called imaging region) 23 and a peripheral circuit section 24, respectively formed on a semiconductor substrate 22 such as a silicon substrate, for example. The solid-state imaging device 21 of the present embodiment is provided, including the pixel section 23 having a plurality of pixels arranged on the semiconductor substrate 22, and the peripheral circuit section 24 formed on the periphery of the pixel section 23 including logic circuits, for example.

The pixel section 23 is provided with a plurality of unit pixels 25 arranged in a two-dimensional array, in which each of the unit pixels is formed, including a photodiode (PD) 26 serving as a photoelectric conversion element and several pixel transistors 27.

These pixel transistors are representatively illustrated in FIG. 4 by a single pixel transistor 27 for the purpose of clarity, and this pixel transistor 27 is formed, including source/drain regions 28, and a gate insulating film and a gate electrode (not shown). A multilevel wiring layer 33 is formed above the pixel 25, including multiple layers of wiring 32 having insulating interlayers 31 formed thereunder, and an on-chip color filter 34 and an on-chip micro-lens 35 are formed on thus formed structure. The peripheral circuit section 24 is provided with logic circuits which are formed, including CMOS transistors (not shown), for example, and with another multilevel wiring layer which is similarly formed, including multiple layers of wiring having insulating interlayers 31 formed thereunder.

Figure 5:
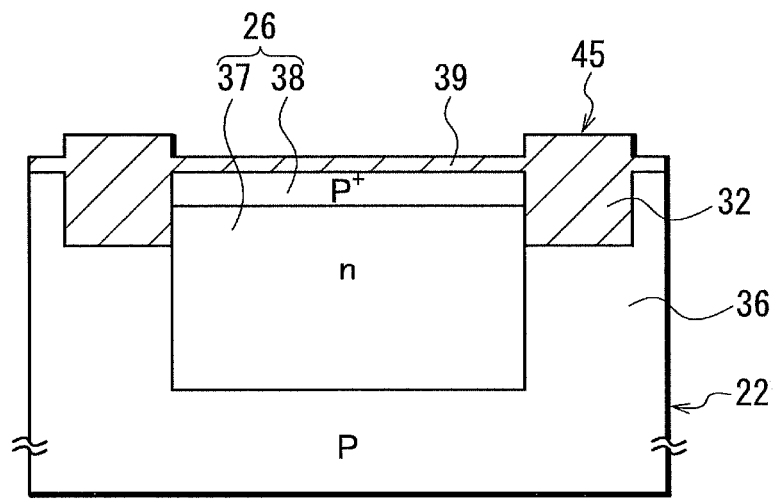
FIG. 5 is an enlarged view of a photoelectric conversion element included in the solid-state imaging device.

In the solid-state imaging device 21 of the present embodiment, electrons are adopted to serve as signal charges. As shown in FIG. 5, the photodiode 26 is provided in a p-type (or a first conductivity type) semiconductor well region 36 of the semiconductor substrate 22, including a charge accumulation region 37 of n-type (or a second conductivity type opposite to that of the first conductivity type), an insulator film 39 formed on the surface of the accumulation region, and a p+ semiconductor region 38 (so-called hole accumulation layer) for controlling dark currents formed in the vicinity of the interface with a silicon oxide film, for example.

In addition, in the present embodiment, for implementing the devise isolation in the peripheral circuit section 24 (FIG. 4)), a first isolation region 43 with the STI structure is formed by burying an insulator layer 42 in a trench 41, which is formed in advance vertically into the semiconductor substrate 22. Moreover, for implementing similarly the devise isolation in the pixel section 23, a second isolation region of the STI structure is formed by burying an insulator layer 42 in another trench 44, which is formed in advance vertically into the semiconductor substrate 22. The first isolation region 43 in the peripheral circuit section 24 is formed with a buried depth h5 of the buried portion of the insulator layer 42 in the semiconductor substrate ranging approximately from 200 to 300 nm, and with a height of the upper face of the portion thereof protruded from the surface of the semiconductor substrate 22, i.e., protrusion height h6, ranging approximately from 0 to 40 nm. The buried depth h5 is herein measured as the distance from the surface of the semiconductor substrate 22 under the insulator film 39, and the protrusion height h6 is the height measured also from the surface of the semiconductor substrate 22 under the insulator film 39.

On the other hand, for the second isolation region 45 in the pixel section 23, the buried depth h7 of the portion buried into the insulator layer 42 of the semiconductor substrate is formed to be shallower than the buried depth h5 on the side of the peripheral circuit section 24. In addition, this second isolation region 45 is formed to have a height of the upper face of the portion of the insulator layer 42 protruded from the surface of the semiconductor substrate 22, i.e., a protrusion height h8, that is approximately equal to the protrusion height h6 on the side of the peripheral circuit section 24. The second isolation region 45 can therefore be formed to have the protrusion height h8 ranging approximately from 0 to 40 nm, the buried depth h7 ranging approximately from 50 to 160 nm, and the total thickness h9 ranging approximately from 70 to 200 nm.

On the side of the peripheral circuit section 24, the protrusion height h6 of the first isolation region 43 is necessary to be in the range approximately from 0 to 40 nm from restrictions on the ordinary MOS structure. On the side of the pixel section 23, the protrusion height h8 of the second isolation region 45 is set to be in the range approximately from 0 to 40 nm in conformity with the protrusion height h6 on the side of the peripheral circuit section 24. In addition, the total thickness h9 ranging approximately from 70 to 200 nm as described above is needed for the second isolation region 45 from restrictions on pixel characteristics.

This total thickness h9 of the second isolation region 45 in the pixel section 23 is sufficient to yield satisfactory device isolation characteristics, not to form a parasitic MOS transistor even after wirings are formed on the insulator layer 42, and not to exert adverse effects on the photodiode 26 such as stress and damage.

That is, for the protruded height h8 in the range from 0 to 40 nm, no polysilicon remains on the side wall of the portion protruded out of surface of the second isolation region 45 during the fabrication of a gate electrode with polysilicon, as will be described later on. As a result, short circuit failures between gate electrodes can be prevented. For the height h8 exceeding 40 nm, polysilicon residue is formed with relative ease on the side wall of the protruded portion. In addition, for the buried depth h7 shallower than 50 nm, the parasitic MOS transistor is formed with ease when wirings are formed above the second isolation region 45. By contrast, for the depth h7 deeper than 160 nm, stresses and damages are exerted more easily onto the photodiode 26, and this may become a factor in generating white spots. Therefore, if the total thickness h9 is within the range between 70 and 200 nm, satisfactory device isolation characteristics of the isolation region 45 are obtained and the generation of white spots can be suppressed.

It is noted herein regarding the heights, h6 and h8, of the first and second isolation regions that these heights are defined as the same if they are found equal to each other within the limits of the processing variation based on manufacture processing accuracy. Namely, regarding the film thickness of a nitride film mask for use in groove (trench) processing, the wafer in-plane variation of about ±10% is generally present for the nitride film with a thickness in the order of 200 nm. Also present is the variation in polishing by CMP (chemical mechanical polishing) of about ±20 to 30 nm. Therefore, even if the process is devised so that the protrusion heights, h6 and h8, in the pixel section 23 and the peripheral circuit section 24 are equal to each other, there still is a possibility of the variation of about 20 to 30 nm. Even if the comparison is made during strict examination of the arbitrary location on the chip surface between the pixel section 23 and the peripheral circuit section 24 and thereby the protrusion heights are found not to be exactly the same, it is needless to say that, as long as the difference between both the protrusion heights, h8 and h6, remains within the range of less than 30 nm, these two are regarded as "the same height" as mentioned just above in the present embodiment.

With the solid-state imaging device 21 according to the first embodiment, both the second isolation region 45 in the pixel section 23 and the first isolation region 43 in the peripheral circuit section 24 are made in the STI structure, and the protrusion heights h6 and h8 of respective insulating layers 42 from the surfaces of the semiconductor substrate 22 are made the same. Since the process steps of burying the insulator layer 42 and planarizing the insulator layer 42 can be simultaneously carried out in production, owing to this configuration, the number of processes can be reduced.

With the solid-state imaging device 21 according to the first embodiment, the protrusion height h8 for the second isolation region 45 in the pixel section 23 is formed to be comparable with the protrusion height h6 of the first isolation region 43 in the peripheral circuit section 24, i.e., to be sufficiently small, so that the film thickness of the insulating interlayer between the photodiode 26 and the first layer wiring becomes small. Accordingly, the distance L2 between the photodiode 26 and the on-chip micro lens 35 becomes smaller than the distance L1 shown earlier in FIG. 1. As a result, the condensing efficiency to the photodiode 26 is improved and the sensitivity is improved.

For the second isolation region 45 in the pixel section 23, its protrusion height h8 above the substrate is in the range from 0 to 40 nm, which is as small as the protrusion height h6 of the first isolation region 43 in the peripheral circuit section 24. As a result, the patterning of polysilicon film is carried out with high precision during the steps of forming gate electrodes of pixel transistors, and no polysilicon remains on the sidewall of the portion protruded out of the substrate surface of the second isolation region 45. As a result, short circuit failures between pixel transistors possibly caused by a polysilicon residue can be avoided.

In the pixel section 23, the second isolation region 45 is formed with the STI structure so that the buried depth h7 of the portion of the second isolation region 45 buried into the semiconductor substrate 22 is shallower than the buried depth h5 of the first isolation region 43 with the STI structure into the semiconductor substrate 22 on the side of the peripheral circuit section 24. Namely, the buried depth h7 of the second isolation region 45 in the pixel section 23 is set to be in the range from 50 nm to 160 nm. This buried depth h7 does not exert adverse effects such as stress and damage on the photodiode 26. That is, the generation of defects can be prevented since the depth of the trench 44 is small. As a result, the generation of the electrons at the interface between the second isolation region 45 and the photodiode 26 can be suppressed, which is a factor in causing white spots otherwise. And, the leak of the electrons into the photodiode 26 from the interface with the second isolation region 45 is suppressed, whereby the appearance of the white spots in the photodiode 26 can be suppressed.

Moreover, since the total thickness h9 of the second isolation region 45 in the pixel section 23 is in the range approximately from 70 and 200 nm, sufficient device isolation characteristics can be obtained. In addition, the parasitic MOS transistor may not be formed even when wirings are formed extending above the second isolation region 45.

Figure 2A:
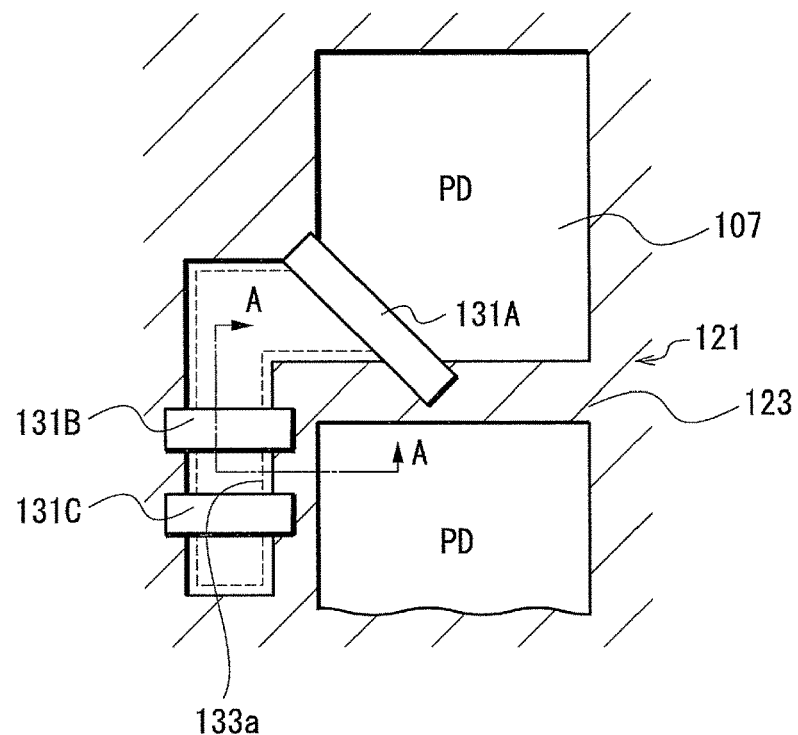
FIG. 2A is a plan view illustrating the related art pixel structure included in imaging device, prepared for purposes of illustrating the difficulty in the related art.
Figure 2B:
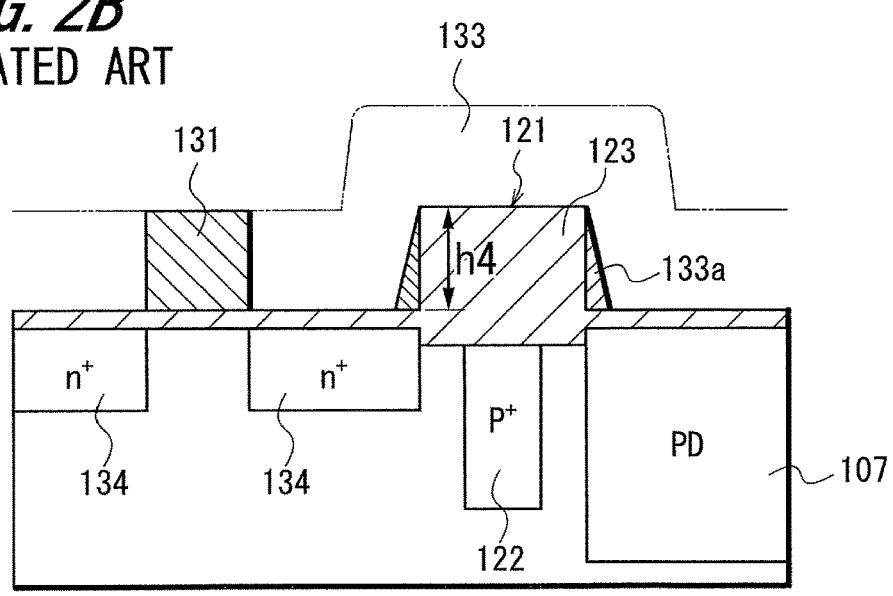
FIG. 2B is a cross-sectional view taken along the line A-A of the structure of FIG. 2A.

Furthermore, since the device isolation characteristics can be secured even if the concentration of p-type ions at the edge portion (transverse end portion) of the second isolation region 45 in the pixel section 23 is relatively low, it is advantageous for reading out from the transfer transistor in comparison with the related art configuration having a diffusion layer isolation region shown in FIGS. 2A and 2B. Although not shown in the drawing, the above noted p-type region is formed in the isolation region adjacent to the transfer transistor in the pixel.

Because the protrusion height h8 of the second isolation region 45 in the pixel section 23 becomes the same as the protrusion height h6 of the first isolation region 43 in the peripheral circuit section 24, i.e., sufficiently small, the distance L2 between the photodiode 26 and the on-chip micro lens 35 becomes smaller than the distance L1 shown in FIG. 1. As a result, the condensing efficiency to the photodiode 26 is improved and the sensitivity is improved.

Both the second isolation region 45 in the pixel section 23 and the first isolation region 43 in the peripheral circuit section 24 are each configured to be the STI structure, having the same protrusion heights, h6 and h8, for respective insulator layers 42 from the surface of semiconductor substrate 22. Since the process steps of burying and planarizing the insulator layers 42 can be carried out simultaneously with this configuration, the number of processes can be reduced.

Therefore, with the configuration of the solid-state imaging device according to the first embodiment, the reduction in the number of processes in the manufacturing process becomes feasible and pixel characteristics can be improved through the improvement in afterimage characteristics and in the amount of saturation signals, the short circuit prevention between pixel transistors, etc. In addition, no polysilicon residue is formed during the fabrication of gate electrodes with a polysilicon film, on the sidewall of the portion of the insulator film 42 protruded out of the substrate surface, the insulator film 42 forming the second isolation region 45 in the pixel section 23. Thereby, the processing of gate electrodes can be carried out with more ease and manufacturing yield is improved.

Second Embodiment of the Solid-State Imaging Device

Figure 6:
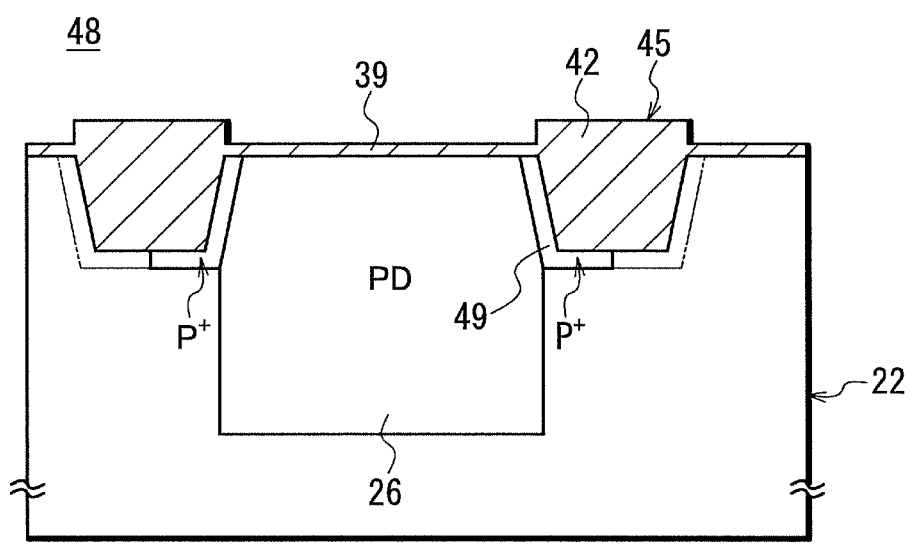
FIG. 6 is a schematic view illustrating the major portion of the solid-state imaging device according to a second embodiment of the present invention.

FIG. 6 illustrates the solid-state imaging device according to a second embodiment of the present invention. FIG. 6 is a cross section illustrating the major portions of the imaging device configuration primarily including the photodiode 26 in the pixel section 23 and the second isolation region 45 adjacent thereto.

The solid-state imaging device 48 according to the present embodiment is provided with a p-type semiconductor layer 49 formed at least in the region in contact with the photodiode 26 in the second isolation region 45 of the pixel section 23. Namely, the p-type semiconductor layer 49 is formed, extending onto the side face in contact with the photodiode 26 and a part of the underside of the insulator layer 42 in the second isolation region 45. Incidentally, the p-type semiconductor layer 49 may alternatively be formed extending onto the entire side face and underside of the insulator layer 42 buried in the semiconductor substrate 22 as indicated by chain lines in the drawing. Still alternatively, the p-type semiconductor layer 49 may be formed by conducting ion implantations of impurities, for example.

The formation of the p-type semiconductor layer 49 may also be carried out by ion implantations into the trench either after completion of the trench in the course of the STI structure formation, or after completing the STI structure, through the insulator layer 42 from above. In the latter case where the p-type semiconductor layer 49 is formed by ion implantations following the formation of the insulator layer 42, when the depth of the insulating layer 42 is too deep, a difficulty may arise in distributing p-type impurity ions properly even after implanting the ions at any implant angle. In order to overcome this difficulty, it is preferable that the insulator layer 42 is formed relatively shallow and a little bit tapered, namely such that its width is gradually narrowed downward. Since the other parts of the configuration are similar to those mentioned earlier with reference to FIGS. 3 and 4, the repeated description thereof is omitted herein.

With the configuration of the solid-state imaging device according to the second embodiment, since the p-type semiconductor layer 49 is formed in the vicinity of the interface between the insulator layer 42 and the photodiode 26 in the second isolation region 45 of the pixel section 23, the generation of the electrons at the device isolation interface can be suppressed further and the generation of the white spots in the photodiode 26 can also be suppressed. In addition, the effects similar to those described earlier with the configuration according to the first embodiment can also be offered with the present structure.

Third Embodiment of the Solid-State Imaging Device

Figure 7:
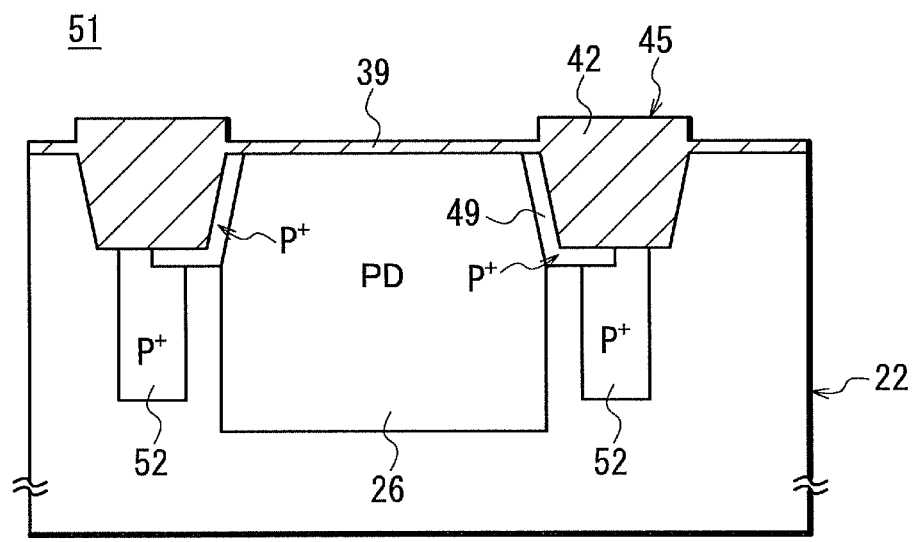
FIG. 7 is a schematic view illustrating the major portion of the solid-state imaging device according to a third embodiment of the present invention.

FIG. 7 illustrates the solid-state imaging device according to a third embodiment of the present invention. FIG. 7 is a cross section illustrating the major portions of the imaging device primarily including the photodiode 26 in the pixel section 23 and the second isolation region 45 adjacent thereto.

The solid-state imaging device 51 according to the present embodiment is provided, in the second isolation region of the pixel section 23, further including a p-type semiconductor layer 52 formed under the insulator layer 42 for also serving as diffusion layer isolation. The p-type semiconductor layer 49 shown in FIG. 7 is formed at least in the vicinity of the interface between the photodiode 26 and the insulator layer 42 in a manner similar to FIG. 6. The device configuration may alternatively be provided without the p-type semiconductor layer 49. Since the other parts of the configuration are similar to those mentioned earlier with reference to FIGS. 4, 5, and 6, the repeated description thereof is omitted herein.

With the configuration of the solid-state imaging device according to the third embodiment, because the p-type semiconductor layer 52 is further formed under the insulator layer 42 to provide the diffusion layer isolation in the second isolation region 45 in the pixel section 23, device isolation characteristics of the second isolation region 45 in the pixel section 23 are further improved merging with the above-mentioned diffusion layer isolation. In addition, the effects similar to those described earlier with the configuration according to the first and second embodiments can also be offered with the present structure.

Fourth Embodiment of the Solid-State Imaging Device

Figure 8:
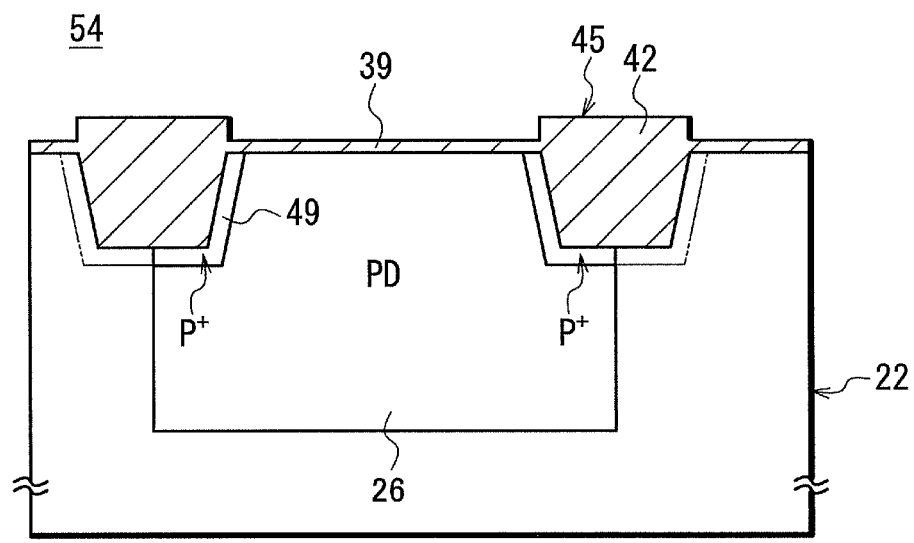
FIG. 8 is a schematic view illustrating the major portion of the solid-state imaging device according to a fourth embodiment of the present invention.

FIG. 8 illustrates the solid-state imaging device according to a fourth embodiment of the present invention. FIG. 8 is a cross section illustrating the major portions of the imaging device primarily including the photodiode 26 in the pixel section 23 and the second isolation region 45 adjacent thereto.

The solid-state imaging device 54 according to the present embodiment is provided, in the pixel section 23, forming the second isolation region 45 with the STI structure shallower than that on the side of the peripheral circuit section 24 as in the above-described embodiments and extending the photodiode 26 such that at least part thereof comes underneath the second isolation region 45. The p-type semiconductor layer 49 similar to that shown in FIG. 6 can be formed in the vicinity of the interface between the second isolation region 45 and at least the photodiode 26. The device configuration may alternatively be provided without the p-type semiconductor layer 49. Furthermore, as described earlier with reference to FIG. 7, the p-type semiconductor layer 52 for serving as the diffusion layer isolation may be formed under the insulator layer 42 in the second isolation region 45. Since the other parts of the configuration are similar to those mentioned earlier with respect to the first and second embodiments, the repeated description thereof is omitted herein.

With the configuration of the solid-state imaging device 54 according to the fourth embodiment, since the photodiode 26 is formed to be extended such that at least a part thereof comes underneath the second isolation region 45, the area of the photodiode 26 can be increased. This increase in the photodiode area is advantageous for increasing the amount of saturation signals and improving the sensor sensitivity. In addition, the effects similar to those described earlier with the configuration according to the first through third embodiments can also be offered with the present structure.

Fifth Embodiment of the Solid-State Imaging Device

Figure 9:
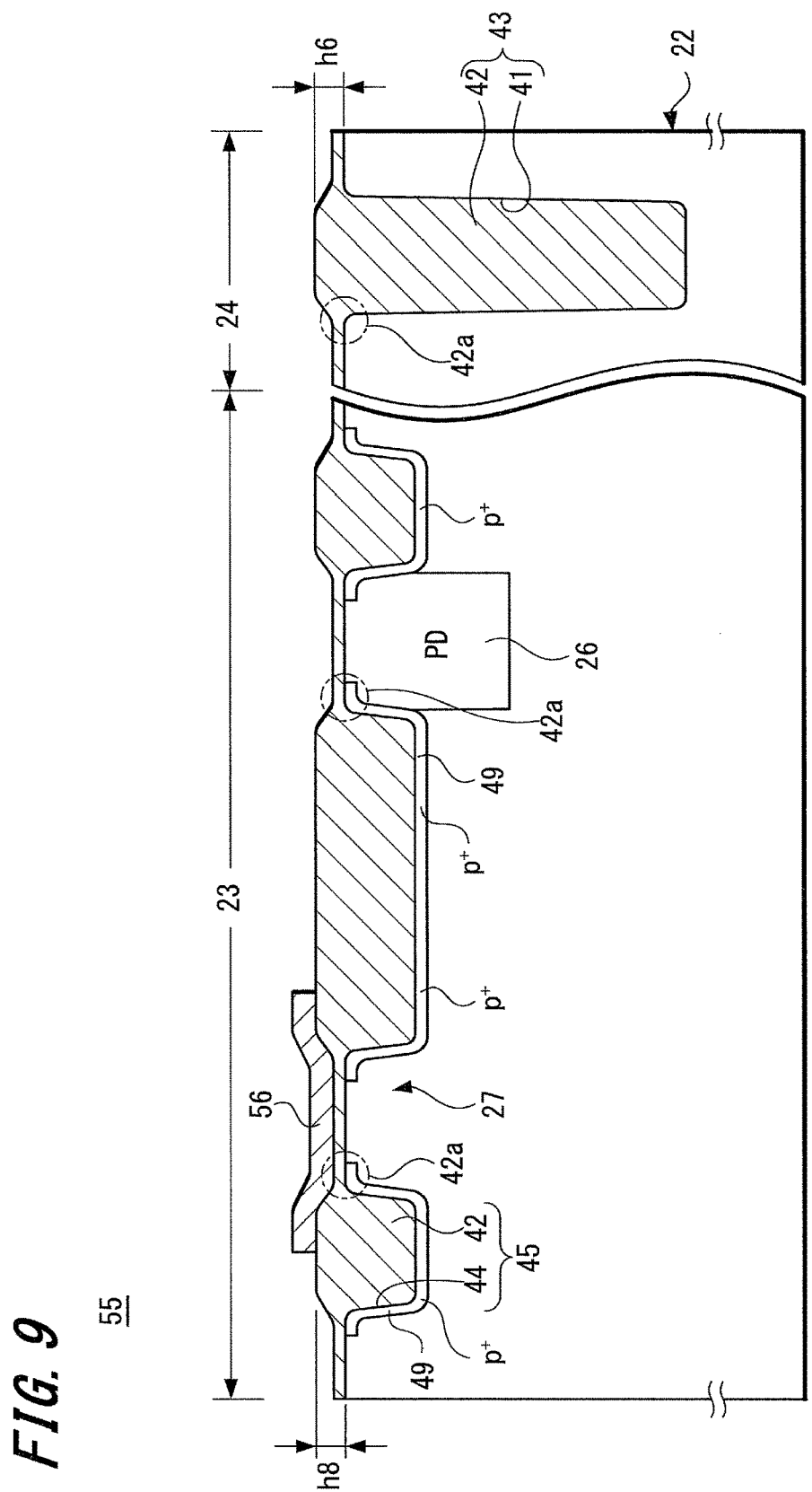
FIG. 9 is a schematic view illustrating the major portion of the solid-state imaging device according to a fifth embodiment of the present invention.

FIG. 9 illustrates the solid-state imaging device according to a fifth embodiment of the present invention. FIG. 9 is a cross section illustrating only the major portions of the imaging device including the photodiode 26 in the pixel section 23, the pixel transistor 27 and the second isolation region 45 adjacent thereto, and the first isolation region 43 in the peripheral circuit section 24. In the solid-state imaging device 55 according to the present embodiment, as in the previously described embodiments, the first isolation region 43 with the STI structure in the peripheral circuit section 24 is formed deep in the vertical direction in the semiconductor substrate 22. Also, the second device separation region 45 with the STI structure in the pixel section 23 is formed in the vertical direction in the semiconductor substrate 22 shallower than the first isolation region 43. And, the protruded heights h8 and h6 from the surfaces of the semiconductor substrate 22 of the insulator layer 42 of the first isolation region 43 and the insulator layer 42 of the second isolation region 45 are the same.

In the present embodiment, in particular, an insulator section 42a in a bird's beak shape extending from the insulator layer 42 is provided in each of the parts of the first isolation region 43 and the second isolation region 45 contacting the surfaces of the semiconductor substrate 22. That is, respective shoulder portions of the insulator layers 42 of the first isolation region 43 and the second isolation region 45 contacting the surfaces of the semiconductor substrate 22 form the insulator sections 42a each in a bird's beak shape, and the shoulder portions of the semiconductor substrate 22 are covered by the insulator sections 42a with thick film thicknesses. Also, because of the insulator sections 42a each in a bird's beak shape, the curvatures of the insulator layers 42 in the shoulder portions are gentle.

In the present embodiment, as described later, in the thermally-oxidized sidewall films of the trenches 41, 43 before the insulator layers 42 of silicon oxide films are inlaid in the trenches 41, 43, corner portions in upper and lower parts of the trenches 41, 44 are rounded. Further, the insulator sections 42a each in a bird's beak shape are formed in the upper corner portions (so-called shoulder portions) of the trenches 41, 43.

Note that as the sidewall film, insulator films, other than the thermally-oxidized film, such as, a plasma-oxidized film, a plasma-oxynitrided film, etc., formed by insulating processing, such as plasma oxidizing processing, plasma oxynitriding processing, etc., may be used.

Further, in the second isolation region 45 in the pixel section 23, an impurity implanting region for suppressing dark currents, i.e., a p-type semiconductor layer 49, is formed from the interface with the semiconductor substrate 22 to a part of the surface side of the semiconductor substrate 22. That is, the p-type semiconductor layer 49 is formed along the bottom and side surfaces of the insulator layer 42 inlaid in the second isolation region 45 to the insulator sections 42a each in a bird's beak, partly extending in the lateral direction in the area reaching the semiconductor substrate surface. In the pixel transistor 27, a gate electrode 56 is formed so as to ride on a protruded surface protruded from the surface of the second isolation region 45. The other parts of the configuration are similar to those described with reference to the first embodiment, so that the repeated description is omitted.

Figure 10:
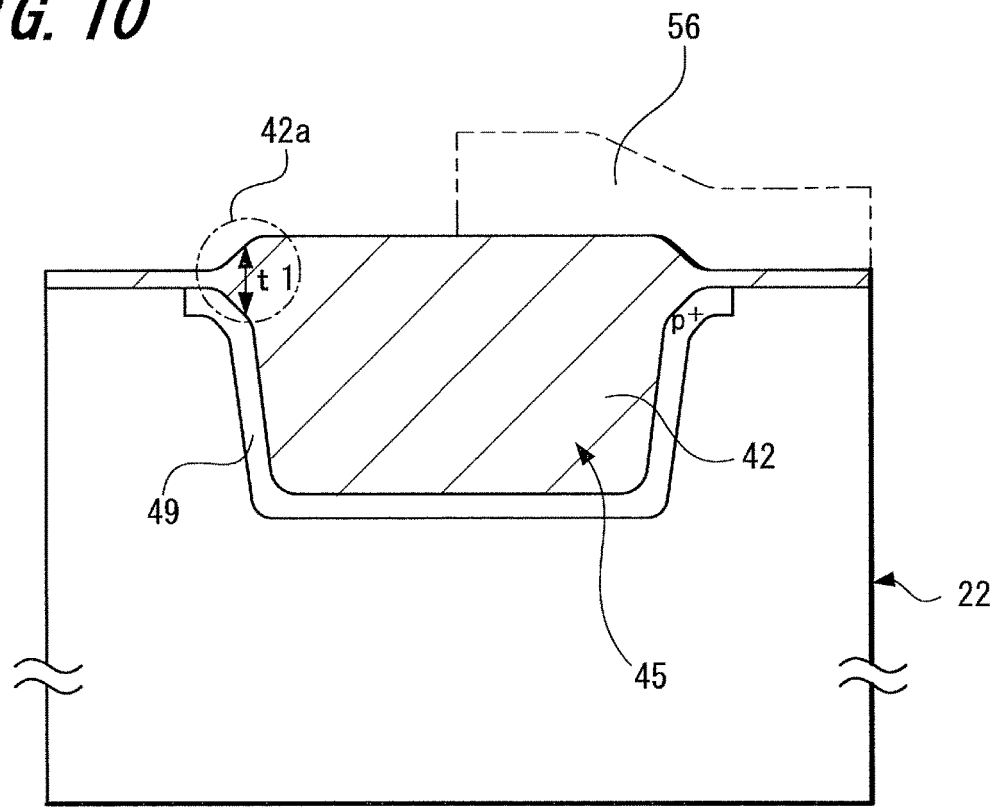
FIG. 10 is an enlarged cross section of an isolation region of a STI structure of a pixel section according to the fifth embodiment.
Figure 12:
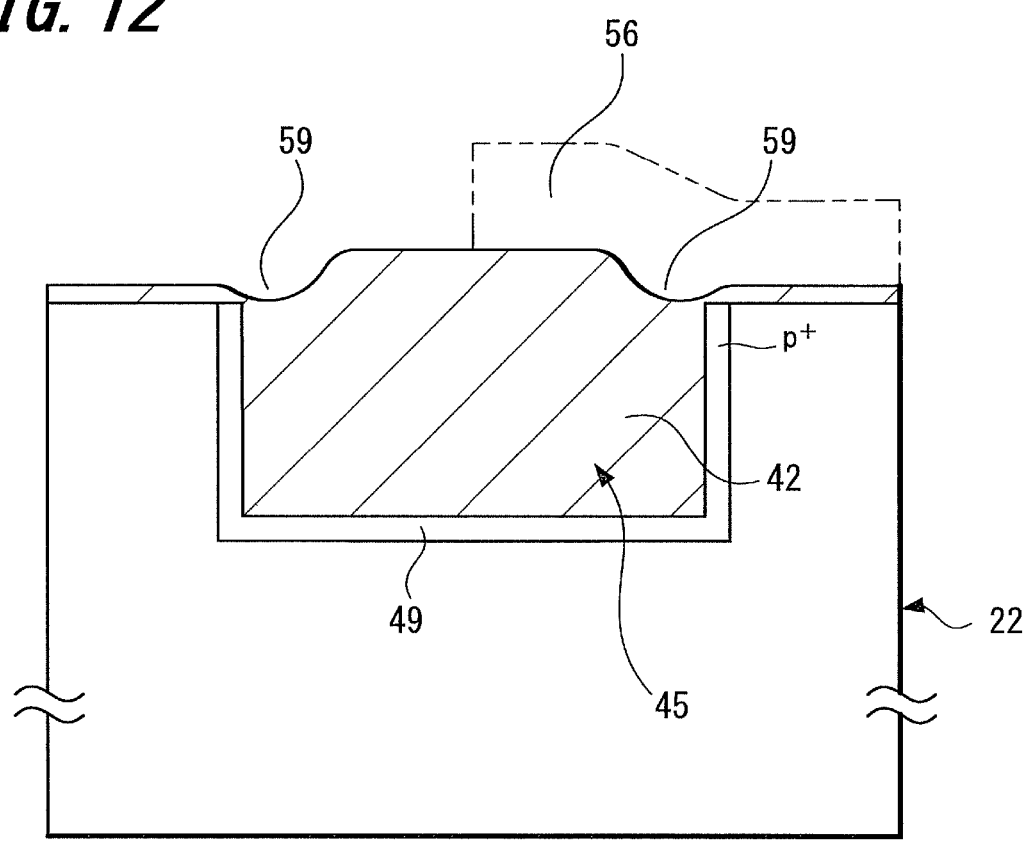
FIG. 12 is an enlarged cross section of a STI isolation region for the purpose of comparison.

With the solid-state imaging device 55 according to the fifth embodiment, in the upper corner part (shoulder part) of the trench 44 of the second isolation region 45 with the STI structure in the pixel section 23, the insulator section 42a in a bird's beak shape is formed. That is, because the insulator section 42a in a bird's beak shape is provided as shown in FIG. 10, a divot 59 shown in FIG. 12 that occurs in the isolation region 45 with the ordinary STI structure is suppressed.

Figure 11:
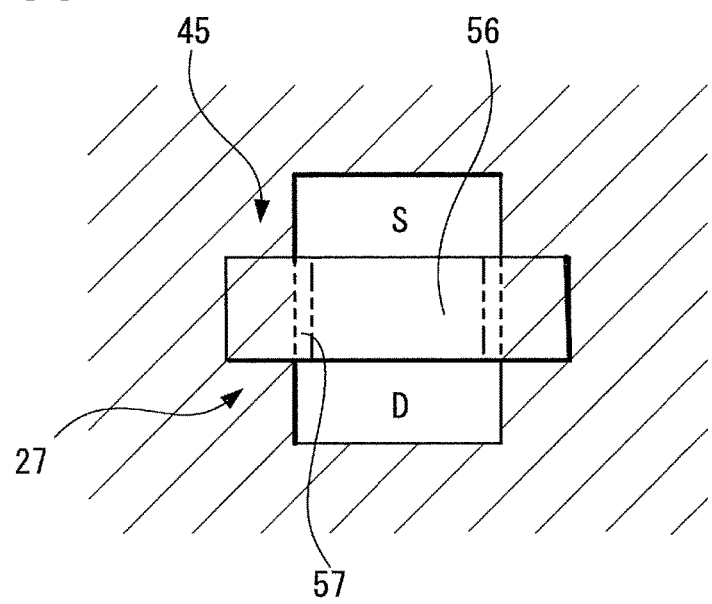
FIG. 11 is a schematic plan view of a pixel transistor for describing the fifth embodiment.

In the pixel transistor 27, generally, end portions of the gate electrode 56 are formed so as to ride on the isolation region. In the present embodiment, the thickness t1 of the insulator layer 42 at the upper corner portion of the trench 44 being large and the stress being lessened due to the gentle curvature of the upper corner portion combine to make the electric field concentration to the upper corner portion of the trench 44 to be lessened. Lessening of the electric field concentration increases the threshold voltage Vth in the upper corner portion and can suppress generation of a parasitic channel component 57 at an edge portion on the boundary with the second isolation region 45 of the pixel transistor 27 shown in FIG. 11. Because the generation of the parasitic channel component 57 is suppressed, leak current between the source S and the drain D is suppressed and random noise can be reduced. Because the oxide film quality in the edge portion is not relatively good compared with the center portion, random noise can be reduced. Because the divot 59 is suppressed, a hump in the {Id (drain current)–Vg (gate voltage)} characteristic of the pixel transistor 27 can be reduced.

Because the structure similar to that in the insulator layer 42 of the second isolation region 45 of the pixel section 23 is adopted also in the insulator layer 42 of the first isolation region 43 of the peripheral circuit section 24, in the MOS transistor of the peripheral circuit section 24 also, the effect of reducing the hump in the Id–Vg characteristic is offered.

Further, because the curvature of the upper corner portion of the trench 44 is gentle in the second isolation region 45 of the pixel section 23, the stress given to the upper corner portion is reduced. Thereby, dark currents and white spots attributed to the floating diffusion (FD) section of the pixel can be improved. Also, junction leak in the floating diffusion section is suppressed.

In the second isolation region 45 with the STI structure in the pixel section 23, to improve dark currents and white spots, the p-type semiconductor layer 49 is provided around the STI structure. In the present embodiment, the p-type semiconductor layer 49 is formed from the sidewall of the trench 44 to the surface side of the semiconductor substrate, that is, the p-type semiconductor layer 49 is formed extending toward the active region side of the photodiode or pixel transistor. Thus, the p-type semiconductor layer 49 is provided also to the active region side in the upper portion of the trench 44, so that the freedom of enabling improvement of dark currents and white spots is increased.

Because the p-type semiconductor layer 49 is formed on the active region side in the upper portion of the trench 44, in the pixel transistor, the parasitic channel component can be made further smaller. Combined with the above-described divot improvement, random noise can be improved in a synergistic manner. Moreover, similar effects described in the first embodiment are produced.

First Embodiment of the Production Method

In the next place, a first embodiment of the production method for the solid-state imaging device according to the present invention will be described with reference to FIGS. 13A through 17J. The present embodiment is adapted to producing the solid-state imaging device according to the aforementioned second embodiment of the solid-state imaging device shown in FIG. 6, in particular to forming isolation regions thereof.

First, referring to FIG. 13A, a thin insulator film 39 is formed having a first predetermined film thickness on a major surface of a semiconductor substrate 22, and subsequently formed on the insulator film 39 is another insulator film 61 having a second predetermined film thickness with an etching rate different from that of the insulator film 39. As the insulator film 39, a silicon oxide film may be used, for example. As the insulator film 61, a silicon nitride film formed by low pressure CVD of about 100 nm in film thickness may be used, for example. A photoresist film is deposited over the insulator film 61. This photoresist film is exposed through an optical mask having a prescribed pattern and subsequently developed, whereby a resist mask 63 is formed, having openings 62 corresponding to the portions into which isolation regions on the side of the peripheral circuit section 24 are to be formed. The entire surface on the side of the pixel section 23 is covered by a flat face resist mask 63 having no opening.

Next, referring to FIG. 13B, the insulator films 61 and on the side of the peripheral circuit section 24 are removed by performing selective etching through the resist mask 63, and portions of the semiconductor substrate 22 are subsequently removed by further performing selective etching to obtain a predetermined depth, whereby several trenches 41 are formed. These trenches 41 are formed herein as relatively deep trenches having the depth ranging approximately from 200 to 300 nm, as mentioned earlier.

Next, a new photoresist film is deposited after removing the resist mask 63, as illustrated in FIG. 14C. This photoresist film is exposed through an optical mask having a prescribed pattern and subsequently developed, whereby a resist mask 65 is completed, having openings 64 corresponding to the portions into which isolation regions on the side of the pixel section 23 are to be formed. The entire surface on the side of the peripheral circuit section 24 is covered by a flat face resist mask 65 having no opening.

Next, referring to FIG. 14D, the insulator films 61 and on the side of the pixel section 23 are removed by performing selective etching through the resist mask 65, and portions of the semiconductor substrate 22 are subsequently removed by further performing selective etching to obtain a predetermined depth, whereby several trenches 44 are formed. These trenches 44 are formed to be relatively shallow with the depth approximately ranging from 50 to 160 nm, as mentioned earlier. Furthermore, in practice, the trenches are formed by performing an etching process first to have the depth ranging approximately from 40 to 150 nm, and subsequently, through light etching etc., the final depth on completion is obtained in the abovementioned range approximately from 50 to 160 nm.

Next, the resist mask 65 is removed, as illustrated in FIG. 15E. Incidentally, although the deep trenches 41 on the side of the peripheral circuit section 24 have been first formed and the shallow trenches 44 on the side of the pixel section 23 have been formed later, the process may alternatively be reversed in which the shallow trenches 44 on the side of the pixel section 23 are formed first and the deep trenches 41 on the side of the peripheral circuit section 24 are formed afterwards.

Next, at the process step illustrated in FIG. 15F, for example, p-type semiconductor layers 49 may be formed by ion implantations on the inner wall surface of the trenches 44. The p-type semiconductor layers 49 may alternatively be formed by ion implantations subsequent to the completion of isolation regions. Still alternatively, the p-type semiconductor layers 49 may be formed by first implanting a first p-type impurity at the step of FIG. 15F and next implanting a second p-type impurity after completing isolation regions, whereby the p-type semiconductor layers 49 can be formed through the double ion implantation.

In this example, a photoresist film is deposited over the entire surface of the structure, as illustrated in FIG. 15F. This photoresist film is exposed through an optical mask having a prescribed pattern and subsequently developed, whereby a resist mask 67 is formed only on the side of the peripheral circuit section 24. Subsequently, using the insulator film 61 such as a silicon nitride film, for example, on the side of the pixel section 23 as a hard mask, ion implantations are conducted to implant p-type impurities 60 into the entire surface over the pixel section 23. No ion implantation of the p-type impurities 60 is conducted into the portions of the substrate 22, for which the insulator film 61 as the hard mask is formed, while the ion implantations are conducted into the portions of the substrate 22, for which the openings 61a are formed, i.e., into the inner wall surface of the trenches 44. Thereby, the p-type semiconductor layers 49 are formed on the inner wall surface of the trenches 44, i.e., on the entire surface of the inner wall including the inner surface and bottom face of the wall of the trenches 44. These ion implantations are carried out by rotational implantations. Incidentally, the p-type semiconductor layers 49 may be formed only on the inner faces of the trenches, which are in contact with the photodiode, by an alternative implantation method.

Although the p-type semiconductor layers 49 are formed by conducting ion implantations of p-type impurities because the trenches 44 have been formed, this has the potential to reduce the concentration of p-type impurities to implant, and the advantage of improving the electric charge Qs per a unit area as well.

Next, referring to FIG. 16G, after removing the resist mask 67, an insulator layer 42 is formed by the CVD method, for example, over the entire surface of the structure so as to be inlaid into the trenches 41 and 44. As the insulator layer 42, a silicon oxide film can be used, for example.

Next, referring to FIG. 16H, at the step as a post-process of polishing the insulator layer 42, the surface portions of the insulator layer 42 having rough surface irregularity are removed by partial etching in order to polish the entire surface uniformly. If there is a difference in the density of surface irregularity, an uneven finish of polish may arise after polishing the entire surface simultaneously. Therefore, the surface portions having rough surface irregularity are partially etched as illustrated in FIG. 16H.

Next, the surface of the insulator layer 42 is subjected to a planarizing polish, as illustrated in FIG. 17I. At this point, the polishing step is terminated at the surface of the insulator film 61. Thereafter, the surface of the structure is polished so that the protrusion heights h6 and h8 of the insulator layer 42 are in the range approximately from 0 to 40 nm, about 40 nm in this example. At this point of time, the heights are set somewhat thicker so as to finally reach the range of 0 to 40 nm considering subsequent operations such as washing after polishing, etc. As the method for polishing, the CMP (chemical mechanical polishing) method may be used, for example.

Next, the insulator film 61 is removed by selective etching as illustrated in FIG. 17J. Thereby, the pixel section 23 and the peripheral circuit section 24 are formed, having the same protrude heights h8 and h6 (h8=h6), and further including the first isolation region 43 with the deep STI structure formed in the peripheral circuit section 24 and the second isolation region 45 formed in the peripheral circuit section 24 with the STI structure having its depth shallower than the first isolation region 43.

At subsequent process steps, a photodiode 26 and pixel transistors 27 are formed, and formed further thereon is a multilevel wiring layer 33. Furthermore, on-chip color filters and on-chip micro-lens 35 are formed on the multilevel wiring layer 33, having a planarizing film formed thereunder, whereby the intended MOS-type solid-state imaging device 48 is formed.

Incidentally, the photodiode 26 may alternatively be formed before the process for forming the first isolation region 43 and the second isolation region 45.

Second Embodiment of the Production Method

In the next place, a second embodiment of the production method for the solid-state imaging device according to the present invention will be described with reference to FIGS. 18A through 22. The present embodiment is adapted to producing the solid-state imaging device according to the aforementioned second embodiment of the solid-state imaging device shown in FIG. 6, in particular to the isolation region thereof.

First, referring to FIG. 18A, a thin insulator film 39 is formed having a first predetermined film thickness on a major surface of a semiconductor substrate 22, and subsequently formed on the insulator film 39 is another insulator film 61 having a second predetermined film thickness with an etching rate different from that of the insulator film 39. As the insulator film 39, a silicon oxide film may be used, for example. As the insulator film 61, a silicon nitride film formed by the low pressure CVD of about 100 nm in film thickness may be used, for example. A photoresist film is deposited over the insulator film 61. This photoresist film is exposed through an optical mask having a prescribed pattern and subsequently developed, whereby a resist mask 73 is formed, having openings 711 and 722 corresponding to the portions into which isolation regions on the side of the peripheral circuit section 24 and on the side of the pixel section 23, are to be formed, respectively.

Next, referring to FIG. 18B, the insulator films 61 and 39 on the side of the pixel section 23 and on the side of the peripheral circuit section 24, respectively, are removed by performing selective etching through the resist mask 73, and portions of the semiconductor substrate 22 are subsequently removed by further performing selective etching to obtain a predetermined depth, whereby several trenches 44 and 41a are formed, respectively. The trenches 41 are formed herein as relatively shallow trenches with the depth ranging approximately from 50 to 160 nm, as mentioned earlier. In addition, since the trenches 41a on the side of the peripheral circuit section 24 are formed simultaneously with the trenches 44 on the side of the pixel section 23, the trenches 41a are formed as the trenches having approximately the same depth as the trenches 44.

Next, a new photoresist film is deposited after removing the resist mask 73, as illustrated in FIG. 19C. This photoresist film is exposed through an optical mask having a prescribed pattern and subsequently developed, whereby a resist mask 74 is formed, covering only the side of the pixel section 23. Namely, none of the resist mask 74 is formed on the side of the peripheral circuit section 24, while the entire surface on the side of the pixel section 23 is covered by the resist mask 74. The trenches 41a on the side of the peripheral circuit section 24 are further removed by etching through the resist mask 74, whereby the deep trenches 41 are formed. These trenches 41 are formed, having a depth approximately ranging from 200 to 300 nm, as mentioned earlier.

Next, the resist mask 74 is removed, as illustrated in FIG. 19D.

Figure 20E:
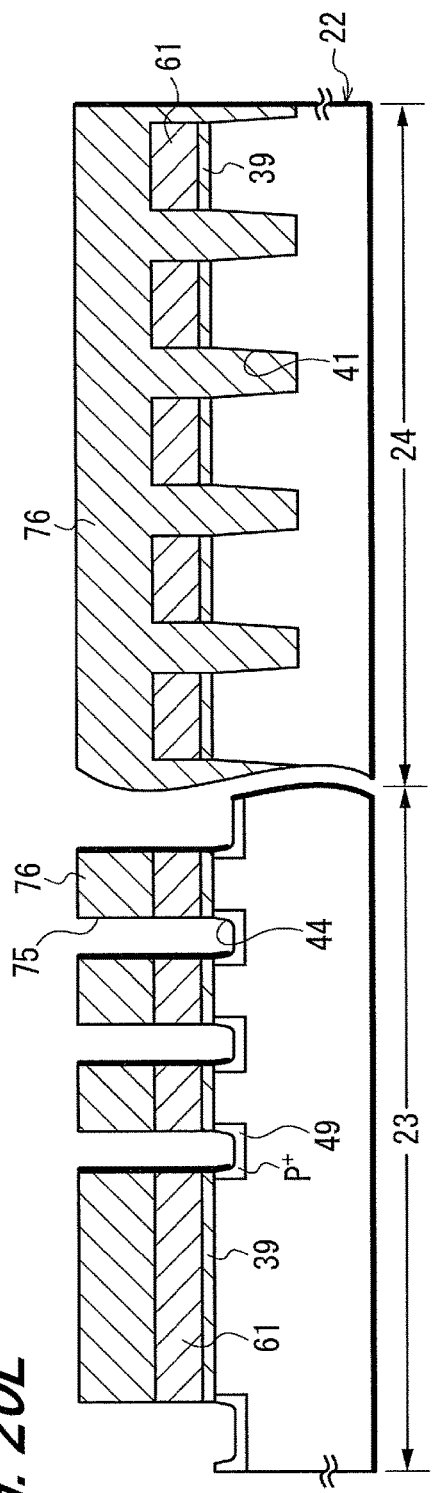
FIGS. 20E and 20F illustrate, in a series of diagrammatic cross-sectional views, a sequence of process steps utilized in producing a solid-state imaging device according to a second embodiment of the production method of the present invention.
Figure 20F:
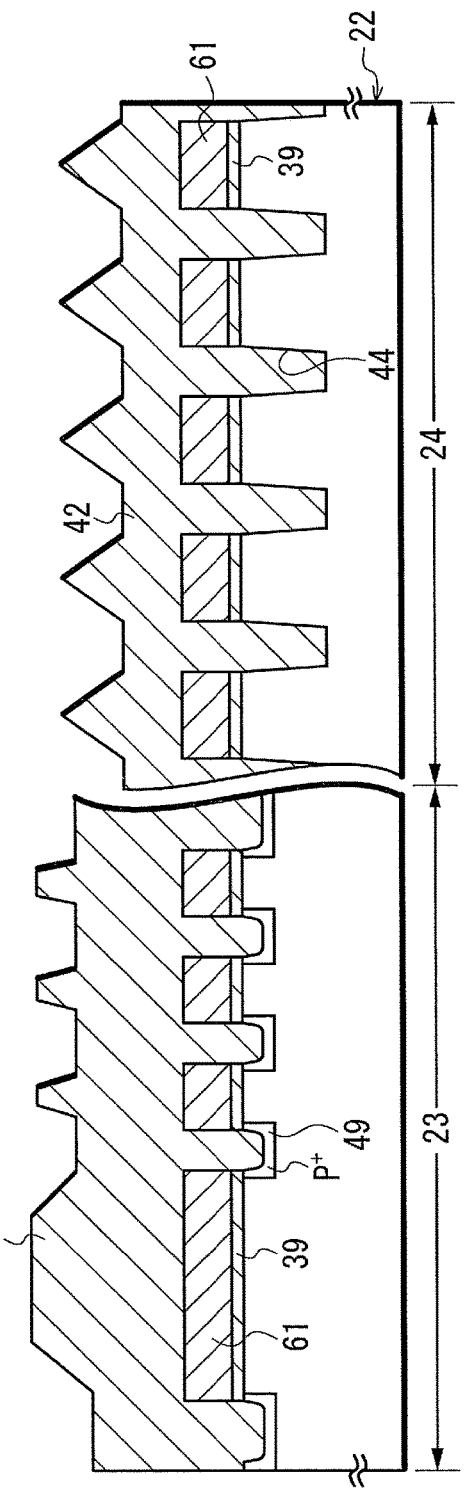
Figure 22:
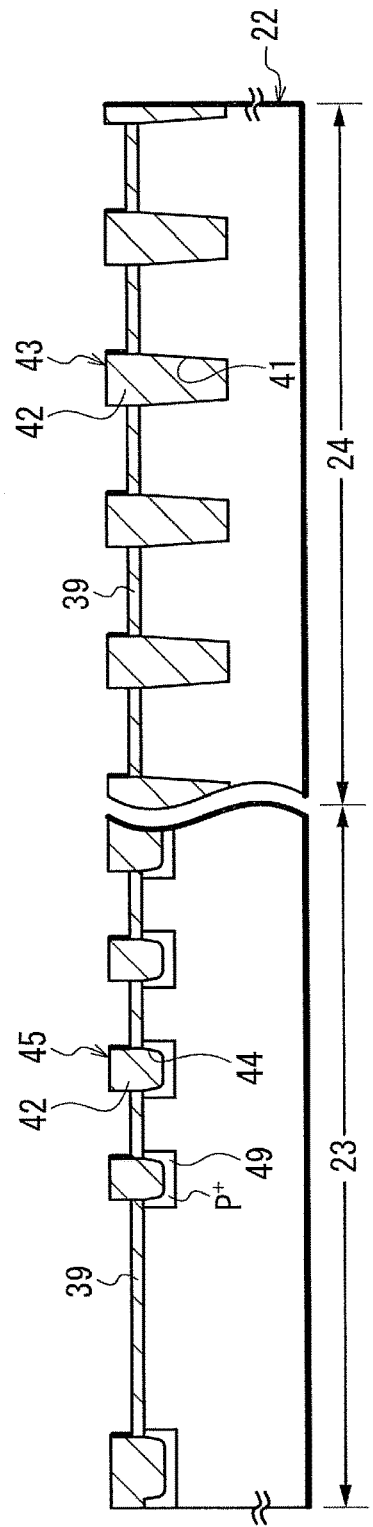
FIG. 22 illustrates, in a series of diagrammatic cross-sectional views, a sequence of process step utilized in producing a solid-state imaging device according to a second embodiment of the production method of the present invention.

Next, at the process step illustrated in FIG. 20E, for example, p-type semiconductor layers 49 may be formed by ion implantations on the inner wall surface of the trenches 44. The p-type semiconductor layers 49 may alternatively be formed by ion implantations subsequent to the completion of isolation regions. Still alternatively, the p-type semiconductor layers 49 may be formed by first implanting a first p-type impurity at the step of FIG. 20E and subsequently implanting a second p-type impurity after completing isolation regions, whereby the p-type semiconductor layers 49 can be formed through the double ion implantation.

In this example, a photoresist film is further deposited after removing the resist mask 74, as illustrated in FIG. 20E. This photoresist film is exposed through an optical mask having a prescribed pattern and subsequently developed, whereby a resist mask 76 is formed only on the side of the peripheral circuit section 24. Subsequently, using the insulator film 61 such as silicon nitride film, for example, on the side of the pixel section 23 as a hard mask, ion implantations are conducted to implant p-type impurities 60 into the entire surface over the pixel section 23. No ion implantation of the p-type impurities 60 is conducted into the portions of the substrate 22, for which the insulator film 61 as the hard mask is formed, while the ion implantations are conducted into the portions of the substrate 22, for which the openings 61a are formed, i.e., into the inner wall surface of the trenches 44. Thereby, the p-type semiconductor layers 49 are formed on the inner wall surface of the trenches 44, i.e., on the entire surface of the inner wall including the inner surface and bottom face of the wall of the trenches 44. These ion implantations are carried out by rotational implantations. Incidentally, the p-type semiconductor layers 49 may be formed only on the inner faces of the trenches, which are in contact with the photodiode, by an alternative implantation method.

Since subsequent steps illustrated in FIGS. 20F through 22 are similar to those illustrated earlier in FIGS. 16G through 17J, the portions corresponding to those shown in FIGS. 16G through 17J are shown with identical numerical representations and the repeated description thereof is omitted herein.

At subsequent process steps, in a manner similar to those aforementioned, a photodiode 26 and pixel transistors 27 are formed, and formed further thereon is a multilevel wiring layer 33. Furthermore, on-chip color filters 34 and on-chip micro-lens 35 are formed on the multilevel wiring layer 33, having a planarizing film formed thereunder, whereby the intended MOS-type solid-state imaging device 48 is formed.

Incidentally, the photodiode 26 may alternatively be formed before the process for forming the first isolation region 43 and the second isolation region 45.

With the abovementioned production methods of the solid-state imaging device according to the first and second embodiments of the production method, after forming the trenches 44 and 41 on the side of the pixel section 23 and on the side of the peripheral circuit section 24, respectively, the second and first isolation regions 45 and 43 are formed by depositing the insulator layer 42 and polishing by the CMP method in the same process. Therefore, the number of processes in the manufacturing process can be reduced. In addition, the second and first isolation regions 45 and 43 are formed, having the same projection height, and moreover having the depth of the second isolation region 45 on the side of the pixel section 23 shallower than the first isolation region 43 on the side of the peripheral circuit section 24. As a result, the solid-state imaging device can be produced with improved pixel characteristics in terms of afterimage characteristics, the amount of saturation signals, and other similar properties, as mentioned earlier.

Third Embodiment of the Production Method

Next, referring to FIG. 23 through FIG. 25, a third embodiment of the production method for the solid-state imaging device according to the present invention will be described. The present embodiment is adapted to producing the solid-state imaging device 55 according to the fifth embodiment shown in FIG. 9, in particular, to forming the isolation region thereof.

In the production method according to the third embodiment, first, as illustrated in FIG. 23A, using the processes shown in FIG. 13A through FIG. 15E or in FIG. 18A through FIG. 19D, shallow trenches 44 and deep trenches 41 are formed in pixel sections 23 and peripheral circuit sections 24, respectively. FIG. 23A shows a state that a thin insulator film 39 for example of a silicon oxide film is formed on the surface of a semiconductor substrate 22 where the trenches 44 and 41 are not formed and an insulator film 61 for example of a silicon nitride film is formed thereupon.

Next, as illustrated in FIG. 23B, the width of the insulator film 61 is selectively narrowed. For example, using a chemical such as hot phosphoric acid, the exposed surface of the insulator film 61 of a silicon nitride film is selectively removed for a predetermined thickness, and thereby the width is narrowed from the initial width d1 to the width d2. The removed width d3 can be made to be about 2 nm to 15 nm. If the removed width d3 is smaller than 2 nm, the effects of the present invention may not be obtained. If the width d3 is increased, the region where the gate oxide film of the active layer region edge becomes thicker increases, and the effective gate width of the transistor becomes narrow. In the 90 nm generation, the minimum width of the effective active layer is desired to be about 120 nm. If the width d3 is 15 nm or greater, the minimum width of the effective active layer becomes about 120−15×2=90 nm, and the drive force of the transistor with the minimum effective active layer width is deteriorated about 10%. Because this influences the velocity characteristics, the maximum amount of the width d3 is about 15 nm.

Figure 24C:
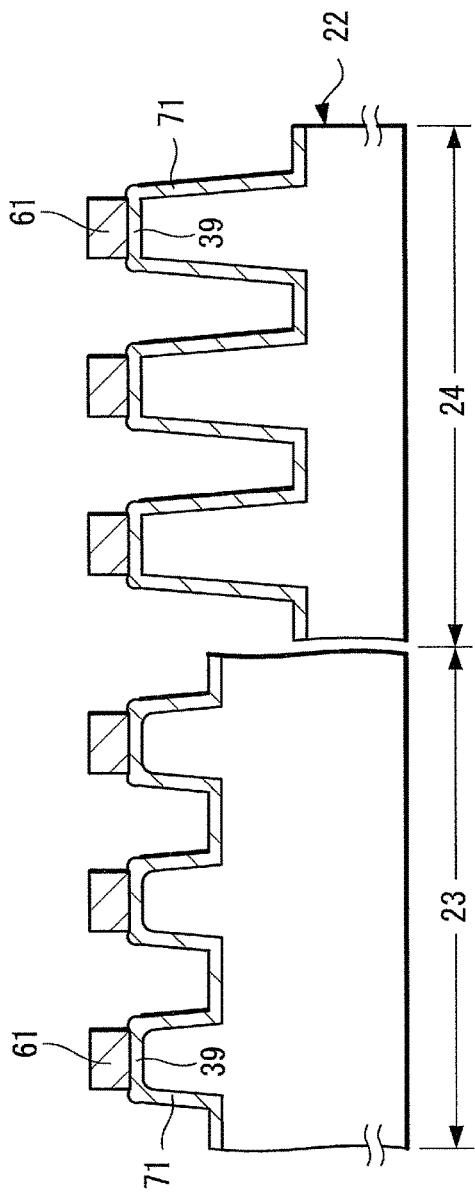
FIGS. 24C and 24D illustrate, in a series of diagrammatic cross-sectional views, a sequence of process steps utilized in producing a solid-state imaging device according to a third embodiment of the production method of the present invention.
Figure 26:
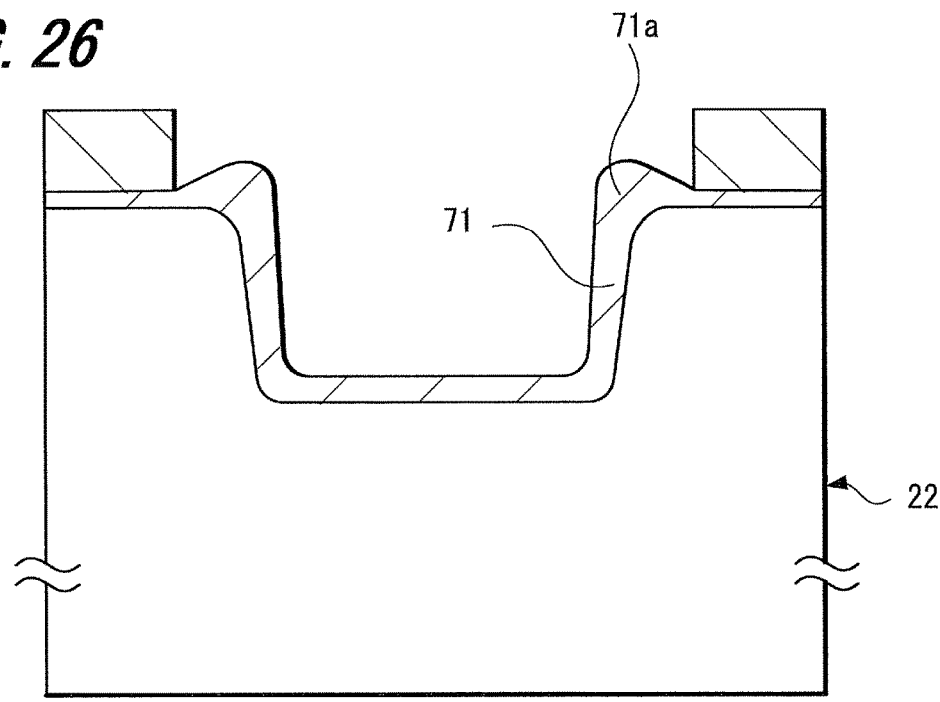
FIG. 26 is an enlarged view of FIG. 24C.

Next, as illustrated in FIG. 24C, the sidewalls and the semiconductor substrate side portions of the trenches 41 and are subjected to thermal oxidation processing using the insulator layer 61 of a silicon nitride film for a mask. So-called sidewall oxidation of the trenches 44 and 41 are carried out. With this thermal oxidation processing, a thermally-oxidized film 71 is formed on the sidewalls of the trenches 44 and 41. Because this thermal oxidation is selective oxidation to the surface not covered by the insulator layer 61 of a silicone nitride film, as illustrated in FIG. 26, in the upper corner portions of the trenches 44 and 41, a thermally-oxidized film 71a in which the oxidized film bulges in a sort of bird's beak shape is formed. This thermally-oxidized film 71a in a bird's beak shape corresponds to the insulator section 42a in a bird's beak shape shown in FIG. 10. With this selective oxidation, the surfaces of the thermally-oxidized film in the upper corner portions of the trenches 44 and 41, contacting the semiconductor substrate 22 of silicon, become gently rounded curvatures. At the same time, the thermally-oxidized film in the lower corner portions of the trenches 44, 41 are rounded.

As the sidewall film formed from the sidewalls of the trenches 44 and 41 to the substrate surface, besides the thermally-oxidized film, a plasma-oxidized film, a plasma-oxynitrided film, etc. formed by selective insulating processing such as plasma oxidizing processing, plasma oxynitriding processing, etc. may be used. These plasma oxidation and plasma oxyniriding are selectively performed using the insulator film 61 for the mask.

Figure 24D:
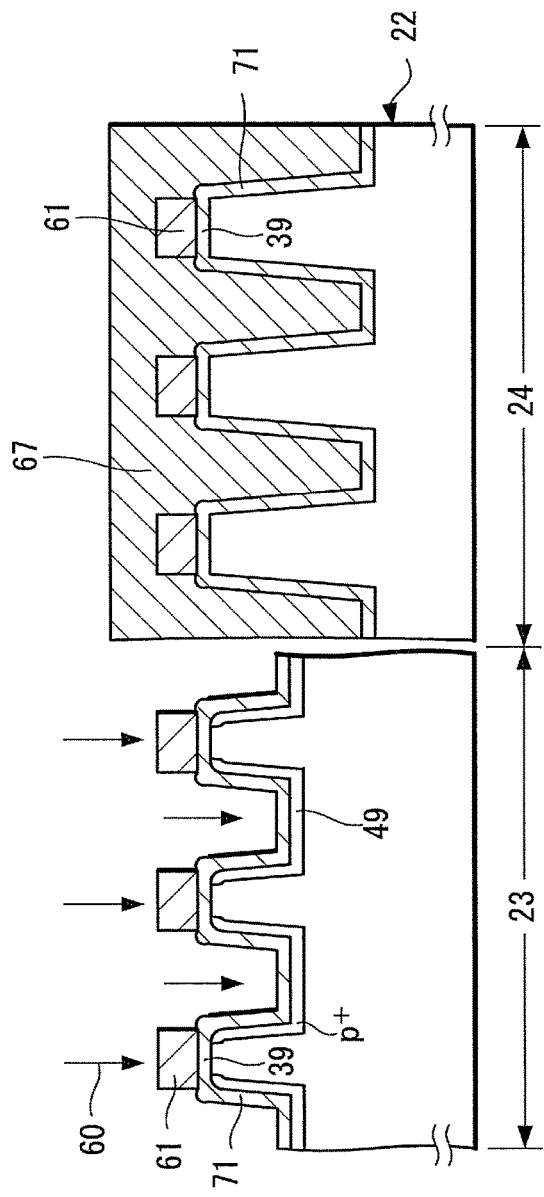
Figure 27:
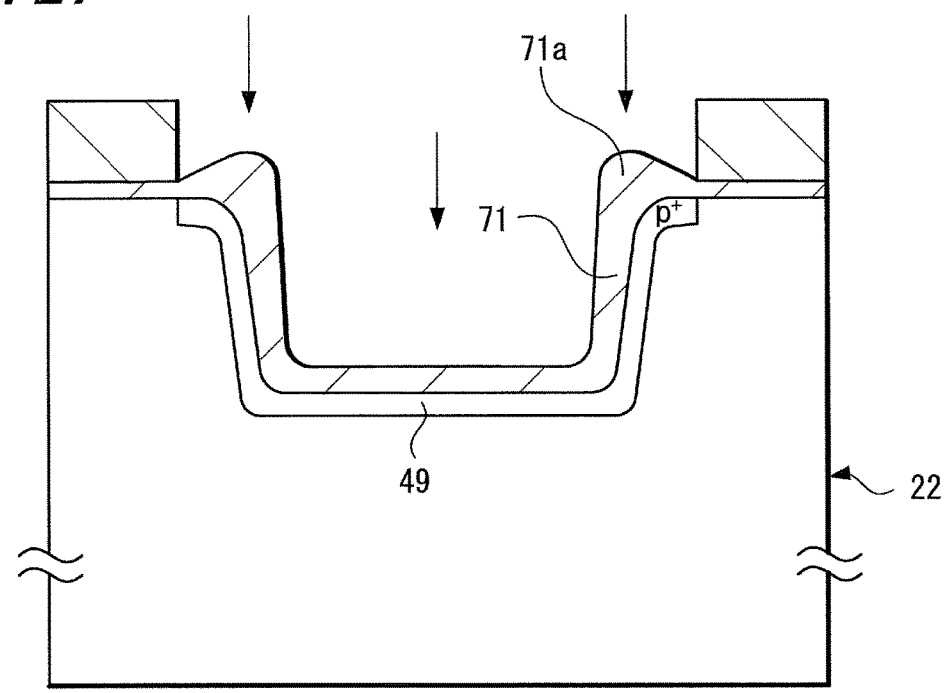
FIG. 27 is an enlarged view of FIG. 24D.

Next, as shown in FIG. 24D, in the state that the side of the peripheral circuit section 24 is covered by a resist mask, ion implantations of p-type impurities 60 are carried out, using the insulator film 61 of a silicon nitride film for the mask, to form a p-type semiconductor layer 49 on the internal wall surface of the trench 44 in the pixel section 23. This p-type semiconductor layer 49 is formed, as shown in FIG. 27, in addition to the internal surface and bottom surface of the trench 44, so as to laterally extend from the upper corner portion of the trench 44. That is, the p-type semiconductor layer 49 is formed extending up to the surface of the semiconductor substrate 22 not covered by the insulator film 61. The process shown in FIG. 24D corresponds to the processes shown in FIG. 15F and FIG. 20E.

The subsequent processes are the same as those shown in FIG. 16G through FIG. 17J, FIG. 20F through FIG. 21H, and FIG. 22. Then, as shown in FIG. 25, the first isolation region 43 with a deep STI structure is formed in the peripheral circuit section 24 and the second isolation region 45 with a shallow STI structure is formed in the pixel section 23, in which the protrusion heights h8 and h6 in the pixel section 23 and the peripheral circuit section 24 are the same. In doing so, in the first and second isolation regions 43, 45, the insulator layer 42 is inlaid into the trenches 41, 44, however, the insulator section 42a in a bird's beak shape is formed in each of the upper corner portions of the trenches 41, 44. Further, in the second isolation region 45 on the side of the pixel section 23, the p-type semiconductor layer 49 is formed to surround the isolation region 45 and to partially extend in a lateral direction from the upper corner portion of the trench 44.

In the subsequent processes, a photodiode 26 and pixel transistors 27 are formed, and a multilevel wiring layer 33 is formed thereupon. Further, on-chip color filters 34 and on-chip micro-lenses 35 are formed on the multilevel wiring layer 33 through a planarizing film, and thereby the intended MOS type solid-state imaging device 55 is obtained.

According to the production method of the solid-state imaging device according to the third embodiment, after forming the trenches 41, 44, the width of the insulator film 61 of a silicone nitride film is narrowed by the process of FIG. 23B, and sidewall oxidation of the trenches 41, 44 is carried out by the process of FIG. 24C. That is, sidewall oxidation of the trenches 41, 44 is carried out, using the insulator layer 61 with the width thereof narrowed for the mask, to form the oxidized film 71. With this selective oxidation, in the upper corner portions of the trenches, the oxidized film 71a in a bird's beak shape in which the oxidized film has bulge is formed. The oxidized film 71a corresponds to the insulator section 42a in a bird's beak shape shown in FIG. 10. Thereafter, the trenches 41, 44 are buried with the insulator layer 42, and thereby the first and second isolation regions 43, 45 are formed, so that divots that are generated in the ordinary isolation region of the STS structure can be reduced.

Because the divot can be controlled, in the pixel transistors or MOS transistors in the peripheral circuit section, the film quality of insulator layers in separation edge portions can be improved, although the film quality is inferior to that of the gate oxidized film in the center portion. By eliminating the divot, the parasitic channel component is reduced, and random noise can be reduced.

Further, the sidewall oxidization can round the upper and lower corner portions of the trenches 41, 44. A surface with a gentle curvature is formed in each of the upper corner portions of the trench. Thereby, stresses in the upper corner portions of the isolation regions 43, 45 each with the STI structure can be reduced. In the pixel section, dark currents and white spots resulting from the floating diffusion (FD) section of each pixel can be improved.

In the process of FIG. 24D, to suppress dark currents and white spots, the p-type semiconductor layer 49 is formed by ion implantations. At this time, the semiconductor layer 49 is formed extending from the sidewalls of the trenches to the surface of the semiconductor substrate in a lateral direction. Because the p-type semiconductor layer 49 is formed so as to extend to the substrate surface on the active region side in a lateral direction, it is possible to increase the freedom with which dark currents and white spots can be further improved.

Because the p-type semiconductor layer 49 is formed so as to extend from the upper portion of the trench to the substrate surface side, the density of the p-type semiconductor layer 49 at the edge part in the upper portion of the trench becomes high. Thereby, the parasitic channel component at the edge part contacting the isolation region of the pixel transistor shown in FIG. 11 can be made further smaller. Combined with the improvement on the divot, random noise can be improved in a synergistic manner.

In addition, the effects similar to those described with respect to the production methods of the solid-state imaging device according to the first and second embodiments are produced.

An embodiment of the present invention can be applied to both the surface illumination type solid-sate imaging device and the backside illumination type solid-state imaging device. In the CMOS solid-state imaging device, as previously described, an embodiment of the present invention can be applied to the surface side illumination type device in which light enters from the multilevel wiring layer side and the backside illumination type device in which light enters from the backside of the substrate opposite the multiple level wiring layer. The solid-state imaging devices according to an embodiment of the present invention can be applied to the linear image sensor, etc., in addition to the above-described area image sensor.

Sixth Embodiment of the Solid-State Imaging Device

Figure 28:
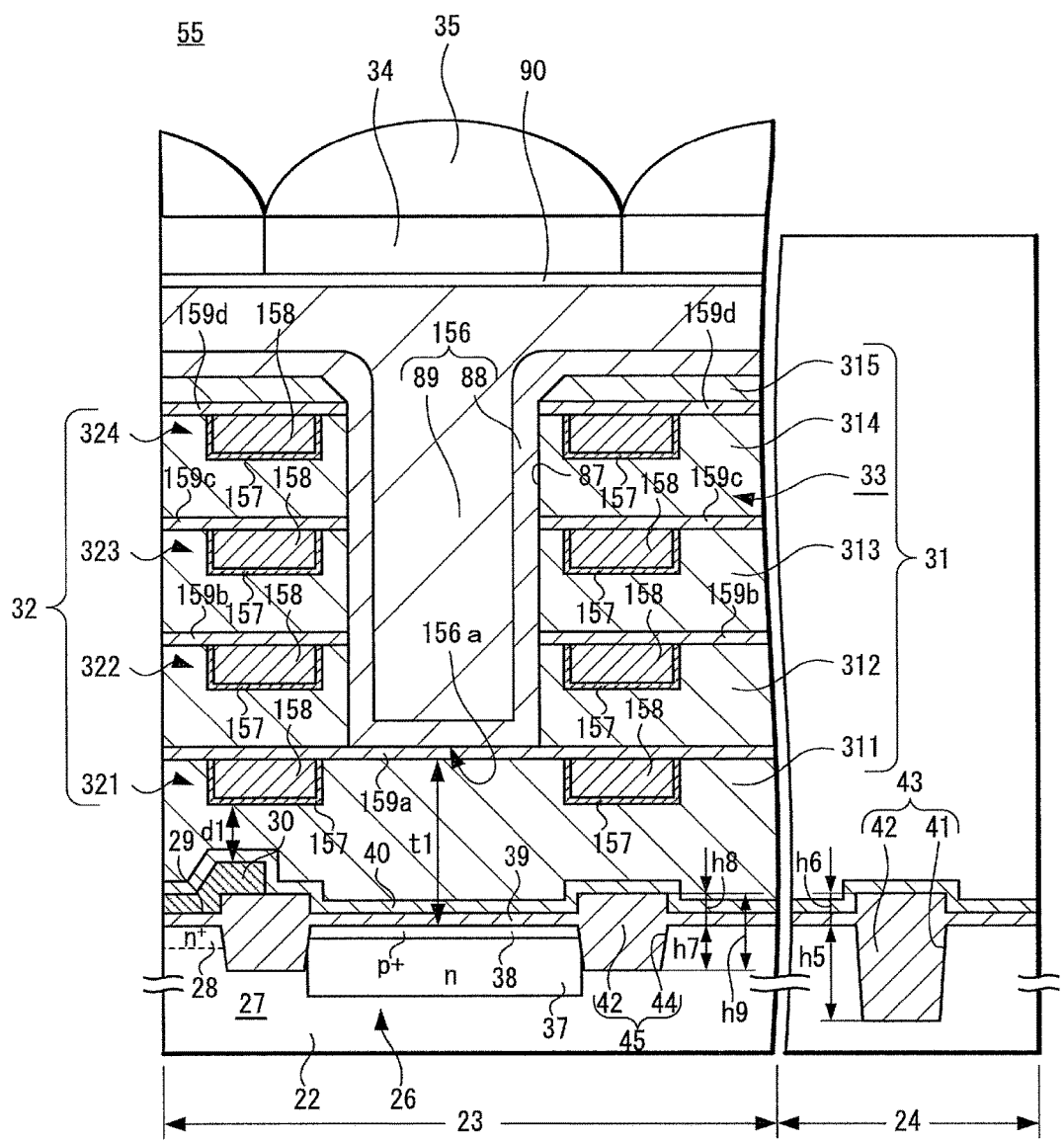
FIG. 28 is a schematic view illustrating the major portion of the solid-state imaging device according to a sixth embodiment of the present invention.

FIG. 28 is a schematic view illustrating the solid-state imaging device according to a sixth embodiment of the present invention. The solid-state imaging device according to the present embodiment is provided, lowering the protrusion height h8 of the second isolation region in the pixel section to be the same as the protrusion height h6 of the first isolation region in the peripheral circuit section, and thinning or reducing the thickness of insulating interlayers formed between the substrate surface and a multilevel wiring layer. At the same time, a waveguide structure is also provided facing the photodiode 26 to improve pixel characteristics including condensing efficiency of light led into the photodiode 26 and the overall sensitivity.

Referring to FIG. 28, the solid-state imaging device 55 according to the present embodiment is provided in a manner similar to that described in the first embodiment, including a pixel section 23 having a plurality of pixels arranged on a semiconductor substrate 22, and a peripheral circuit section 24 formed on the periphery of the pixel section 23 including logic circuits, for example.

The pixel section 23 includes plural pixels 25 arranged in a two-dimensional array, in which each of the pixels is formed, including a photodiode 26 serving as photoelectric conversion element, and pixel transistors 27. As shown in FIG. 5, the photodiode 26 is provided, including a charge accumulation region 37 of n-type or the second conductivity type, an insulator film 39 formed on the surface of the accumulation region, and a p+ semiconductor region 38 for controlling dark current formed in the vicinity of the interface with a silicon oxide film, for example. On an insulator film 39 of silicon oxide film, for example, formed on the surface of the photodiode 26, a silicon nitride film 40 is formed for serving as an antireflection film. The pixel transistors are formed, which are representatively illustrated by a single pixel transistor 27 for the purpose of clarity, including source/drain regions 28, a gate insulator film 29, and a gate electrode 30 formed with polysilicon, for example. In addition, the source/drain regions 28 are formed in the direction perpendicular to the plane of the drawing sheet. Also, the end portion of the gate electrode 30 is formed so as to ride over the second isolation region 45.

In the pixel section 23 and peripheral circuit section 24, the second isolation region 45 and first isolation region 43 are respectively formed with the STI structure described earlier. The first isolation region 43 is formed with an insulator layer 42 buried in a first trench 41, the insulator layer having a buried depth h5 and a protrusion height h6. The second isolation region 45 is formed with an insulator layer 42 buried in a second trench 44, the insulator layer having a buried depth h7 and a protrusion height h8. The protrusion heights h6 and h8 of the isolation regions 43 and 45 are set to be the same as mentioned earlier. The buried depth h7 of the second isolation region 45 is set to be shallower than the buried depth h5 of the first isolation region 43. In a manner similar to that indicated earlier for the first isolation region 43, the buried depth h5 may be in the range approximately from 200 to 300 nm, and the protrusion height h6 may be in the range approximately from 0 to 40 nm. In the second isolation region 45, the buried depth h7 may be in the range approximately from 50 to 160 nm, the protrusion height h8 may be in the range approximately from 0 to 40 nm, and the total thickness h9 may be in the range approximately from 70 to 200 nm.

On the substrate in the pixel section 23, a multilevel wiring layer 33 is formed, including multiple wiring layers 32 (321 to 324) having insulating interlayers 31 (311 to 315) formed thereunder for passivation. The insulating interlayers 31 can be formed with silicon oxide films, for example. The multiple wiring layers 32 are formed including a first-layer wiring 321, second-layer wiring 322, third-layer wiring 323, and fourth-layer wiring 324, in the present example. Each of the wiring layers 32 (321 through 324) is formed by the damascene process, burying a barrier metal layer 157 including tantalum/tantalum-nitride and a copper (Cu) wiring layer 158. On each of the insulating interlayers 31 between the wirings, i.e., on each of the insulating interlayers, 311 through 314, including the upper face of the copper (Cu) wiring layer 158, first through fourth interlayer wiring diffusion prevention films 159 (159*a*, 159*b*, 159*c*, and 159*d*) are formed for preventing the diffusion of copper (Cu) used as the wiring material. The wiring diffusion prevention films 159 are formed of films including SiN and/or SiC, for example. In the present example, the wiring diffusion prevention films 159 are formed of SiC films. Although not shown in the drawing, the peripheral circuit section 24 is provided with logic circuits which are formed, including CMOS transistors, for example, and with other multilevel wiring layers which are similarly formed, having a predetermined number of wiring layers.

In addition, in the present embodiment, a waveguide 156 is formed above each photodiode 26 in the pixel section 23 for leading incidence light efficiently to the photodiode 26. The waveguide 156 is formed by first forming a concave groove 87 in the portion of the multilevel wiring layer 33 facing the photodiode 26 by selectively etching the insulating interlayer together with the interlayer wiring diffusion prevention films 159, and subsequently burying a first core layer 88 and a second core layer 89 into the concave groove 87. During this process, the plane 156*a* of the waveguide 156 facing the photodiode 26 is formed so as to terminate at the wiring diffusion prevention film 159*a* on the lowermost layer. Namely, the waveguide 156 is formed to reach the wiring diffusion prevention film 159*a* of the lowermost layer, and not to pass through the wiring diffusion prevention film 159*a* of the lowermost layer.

In addition, a planarizing film 90, an on-chip color filter 34, and an on-chip micro lens 35 are formed in the pixel section 23.

Figure 29:
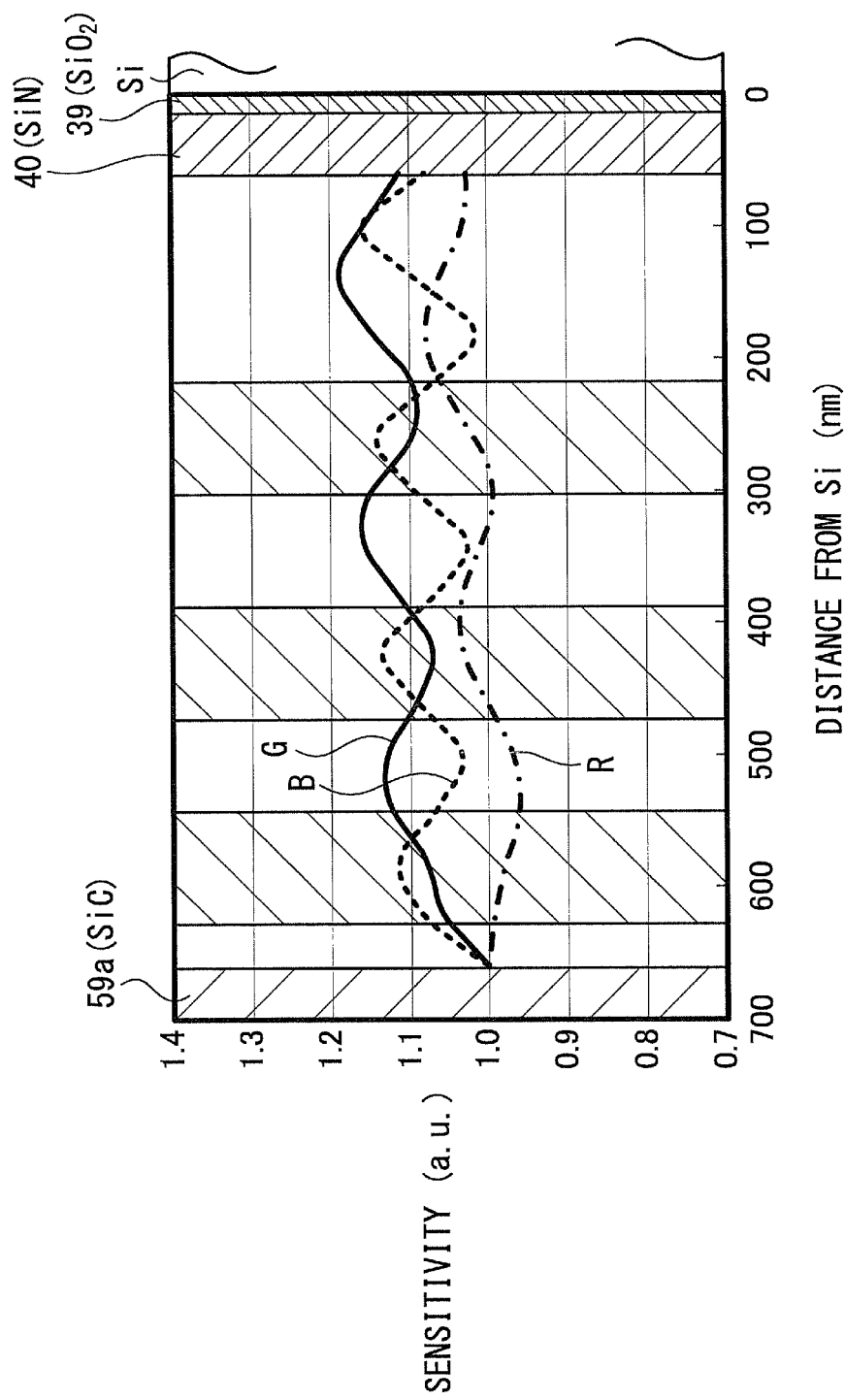
FIG. 29 shows graphical plots of the sensitivity variation for respective colors as a function of the insulating interlayer thickness measured from the surface of the photodiode serving as photoelectric conversion element to the wiring diffusion prevention film on the first layer, prepared for purposes of explanation, according to an embodiment of the present invention.

Furthermore, as will be detailed later on, the thickness of insulating interlayers t1 is set to be small in the present embodiment, in which this thickness of insulating interlayers is measured from the surface of the semiconductor substrate 22 (i.e., the surface of the photodiode 26) to the lowermost wiring diffusion prevention film 159*a*, inclusive of the insulator film 39, antireflection film 40, and the first layer insulating interlayer 311. That is, in order to yield the high sensitivity at blue light wavelengths, the film thickness t1 is set to be in the range either from 220 to 320 nm, from 370 to 470 nm, or from 530 to 630 nm. As shown in FIG. 29 which includes graphical plots of the sensitivity variation as a function of film thickness t1 measured from the surface of silicon substrate, if the film thickness t1 is in the range either from 220 to 320 nm, from 370 to 470 nm, or from 530 to 630 nm, as mentioned just above, it is indicated that the blue light sensitivity that is equal to or greater than the half of the difference in sensitivity between the crest and trough of the sensitivity curve can be obtained. Namely, the sensitivity can be obtained as high as approximately equal to, or greater than $x+[(y-x)/2]$, where the variable x is the sensitivity value at a crest of the curve, and y is the value at a next trough.

Since the other parts of the configuration are similar to those mentioned earlier with reference to FIG. 4 according to the first embodiment, the repeated description thereof is omitted herein. It is noted that the present configuration of the multilevel wiring layer 33 and antireflection film 40 formed on the surface of the photodiode 26 is the more detailed one of the aforementioned configuration according to the first embodiment.

With the configuration of the solid-state imaging device 55 according to the sixth embodiment, the protrusion height h8 of the second isolation region 45 in the pixel section 23 is formed to be the same as the protrusion height h6 of the first isolation region 43 in the peripheral circuit section 24, i.e., as low as 40 nm or less. With the present configuration, the film thickness t1 can be formed to be thin measured from the surface of the photodiode 26 to the wiring diffusion prevention film 159*a* on the lowermost layer in contact with the bottom of the waveguide 156, inclusive of the insulating interlayers (39, 40, 32).

In general, the insulating interlayer 31 is limited in its minimum film thickness so as not to induce the deposition of a polysilicon gate electrode on the isolation region 45 with the STI structure during the polishing process subsequent to the formation of the insulating interlayer. With the present embodiment, by forming the protrusion height h8 of the second isolation region 45 in the pixel section 23 to be the same as the protrusion height h6 of the first isolation region 43 in the peripheral circuit section 24, the variation in the film thickness during the polishing process can be suppressed and the polishing process becomes feasible for attaining the film thickness d1 as small as 90 nm from the upper face of the gate electrode. For example, when the protrusion height h8 is assumed to be 30 nm, the whole insulating interlayer can be processed to reduce its film thickness smaller by about 70 nm from the thickness in a first comparative example shown in FIG. 30.

Figure 30:
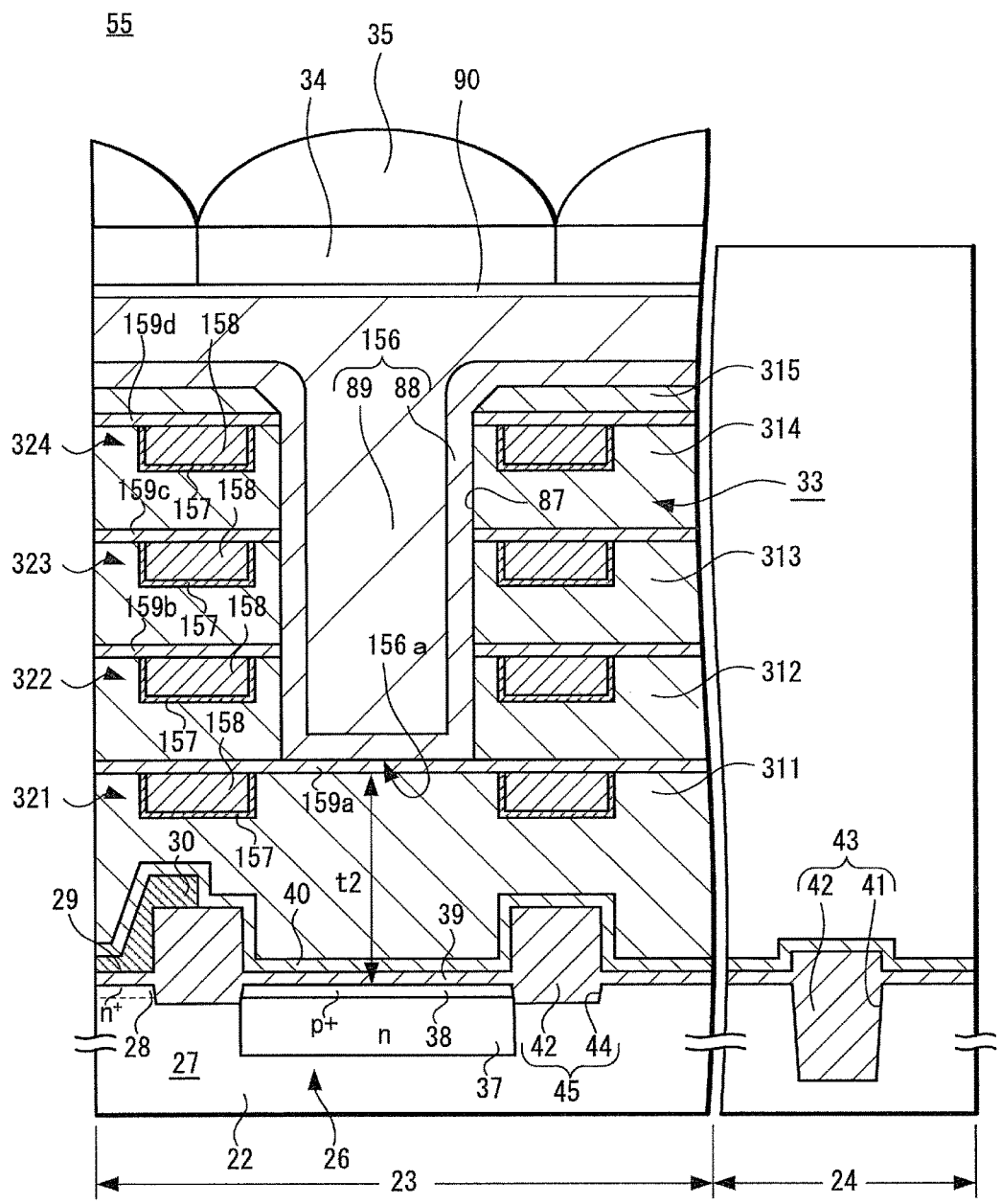
FIG. 30 is a schematic view illustrating the major portion of a solid-state imaging device according to a first comparative example.

Incidentally, in the first comparative example shown in FIG. 30, the protrusion height h3 of the isolation region 43 with the STI structure in the peripheral circuit section 24 is considered to be 30 nm, while the protrusion height h4 of the isolation region 45 with the STI structure in the pixel section 23 is also considered to be 80 nm. In this case, in order to retain the insulating interlayer on the gate electrode, the amount of polishing has to be appropriately controlled. Consequently, the finished film thickness t2 of the insulating interlayer is obtained as about 650 nm and the optimization of sensor sensitivity may not be achieved as a result. It is noted that other regions shown in FIG. 30 similar to those in FIG. 28 are shown with identical numerical representations for purposes of comparison and the repeated description thereof is herein omitted.

With the present embodiment, as a result of the thinning of the insulating interlayer having the film thickness t1, as mentioned above, together with the provision of the waveguide 156 facing the photodiode 26, the condensing efficiency of the incidence light to the photodiode 26 is improved, and the sensor sensitivity, particularly the blue light sensitivity can be improved.

FIG. 29 shows graphical plots of the sensitivity variation for respective colors, red, green, and blue, as a function of the insulating interlayer thickness t1 measured from the surface of the photodiode 26 (silicon surface) to the wiring diffusion prevention film 159*a* formed of SiC with the configuration of the solid-state imaging device according to the sixth embodiment, in which the curve R shows the sensitivity variation for red wavelengths, the curve G for green, and the curve B for blue. The silicon oxide film 39 is formed on the Si surface, the silicon nitride film 40 is formed further thereon, and the total thickness of both films, 39 and 40, is in the range of about 70 nm. It is noted with the concern of antireflection capability and film processing (the limitation on its maximum film thickness being determined by considering the capability of forming contact through holes), the total thickness of the films, 39 and 40, may be formed to be in the range approximately from 20 to 120 nm. The refractive index of thus formed insulating interlayer is in the range from 1.4 to 1.5.

As described earlier briefly, from the graphical plots of the sensitivity variation for respective colors shown in FIG. 29, it is found that the sensitivity is improved for the blue color, which normally has a low luminous efficiency, and the sensor sensitivity is most increased for the film thickness t1 in the range either from 220 to 320 nm, from 370 to 470 nm, or from 530 to 630 nm. Namely, as the blue sensitivity, the sensitivity that is equal to or greater than the half of the sensitivity difference between the crest and trough of the sensitivity curve can be obtained.

In addition, the diffraction of light takes place when the waveguide structure is included, primarily from the difference in refractive indices between (a) the material buried in the waveguide, i.e., a second core layer 89, and (b) the insulating interlayers formed from the surface of the photodiode 26 to the lowermost wiring diffusion prevention film 159a (that is, the interference of incident light is caused by the change of the refractive indices, and results in either reinforcing or weakening the incident light, depending on the range in insulator film thickness). As a result, there exists the optimum range of film thickness for a light condensing structure. In the present embodiment, therefore, this optimum range of film thickness can be set in the range either from 220 to 320 nm, from 370 to 470 nm, or from 530 to 630 nm.

In the first comparative example, since the protrusion height of the isolation region is high on the side of the pixel section, the reflection of incident light is caused by the protrusion of the isolation region, and the sensor sensitivity decreases, accordingly. In the present embodiment, however, since the protrusion height of the second isolation region on the side of the pixel section is low, the reflection of incident light by the protrusion decreases, and the sensor sensitivity can be improved.

Incidentally, when both the films, 39 and 40, are formed having a total film thickness approximately ranging from 20 to 120 nm, the above-mentioned range of film thickness t1, 220 to 320 nm, 370 to 470 nm, and 530 to 630 nm, changes with the total film thickness as follows. When the total film thickness of both the films, 39 and 40, becomes smaller than 70 nm (20 nm, for example), the peak position of the sensitivity curve of FIG. 29 shifts to the left in the drawing (in the direction to increasing the film thickness of the insulating interlayer 311) relative to the peak position at the 70 nm thickness. The amount of the shift corresponding to the present thickness is obtained as $(dN-70)\times(nN-n0)$, which is derived from the general relationship used in the light interference: "film thickness"×"refractive index"="optical film thickness".

By contrast, when the total film thickness of both the films, 39 and 40, becomes larger than 70 nm (120 nm, for example), the peak position of the sensitivity curve of FIG. 29 shifts to the right (in the direction to decreasing the film thickness of the insulating interlayer 311) relative to the peak position at the 70 nm thickness. The amount of the shift corresponding to the thickness is obtained as $(70-dN)\times(nN-n0)$. The above notations are dN for the total film thickness of the films 39 and 40, nN for the refractive index of the silicon nitride film 40, and n0 for the refractive index of the silicon oxide film 39.

With the present configuration of the isolation regions in this embodiment, the generation of the white spots in the photodiode 26 is suppressed and the sensor sensitivity can be further improved, as described earlier in the first embodiment, comparing with the other configuration, in which the isolation region in the pixel section is formed, having the same buried depth as the region in the peripheral circuit section.

With the present configuration of forming the waveguide so as to be terminated at the wiring diffusion prevention film, the depth of the waveguide can be kept constant.

Incidentally, with the progress of pixel miniaturization, if the protrusion height of the isolation region on the side of the pixel section is large as illustrated in the first comparative example, it is conceived that, even after the formation and the subsequent step of planarizing polish of the insulating interlayers, the uniform planarization of the upper face of the structure is hard to be achieved because of relatively large step height and that the planarization of the wiring diffusion prevention film formed on the structure is also hard to be achieved. When the process proceeds further in this situation for forming the multilevel wiring layer and subsequently forming the groove for the waveguide in the multilevel wiring layer, it becomes difficult to form the groove so as to be terminated accurately at the lowermost wiring diffusion prevention film. As a result, even if the waveguide is intended to be formed by subsequently burying the clad material layer and the core material layer into this groove, it is anticipated that the waveguide may not be formed properly so as to be terminated at the lowermost wiring diffusion prevention film.

With the present embodiment, in contrast, since the protrusion height of the second isolation region in the pixel section is low, the planarization polishing of the insulating interlayers is feasible, and proper waveguides can be formed so as to terminate at the lowermost wiring diffusion prevention film even in the device configuration with miniaturized pixels.

In addition, also with the progress of pixel miniaturization, if the protrusion height of the isolation region on the side of the pixel section is large as illustrated in the first comparative example, there arises a concern of void formation when the insulating interlayer is formed by inlaying the portion between the high protrusions. With the present embodiment, however, since the height of protrusion is low, the formation of voids can be obviated, the efficiency of burying the insulating interlayer is improved, and the formation of the insulating interlayer can be carried out satisfactorily.

Still in addition, with the present embodiment, by suppressing the variation in the film thickness within a chip, which is caused by polishing the above-mentioned insulating interlayer, the effect can be achieved of improving the difference in sensitivity between the middle and the circumference of a screen, so-called shading.

Moreover, according to the sixth embodiment, the effects similar to those described earlier with the configuration according to the first embodiment can also be offered with the present structure, including the increase in sensor sensitivity, improvement in afterimage characteristics and in the amount of saturation signals, prevention of short circuit failures caused between pixel transistors, reduction of the number of processes, improvement of manufacturing yield, etc.

It is added that the aforementioned values of optimal film thickness t1 in the range either from 220 to 320 nm, from 370 to 470 nm, or from 530 to 630 nm, can be applied not only to the sixth embodiment, but also to the first through fourth embodiments as well.

Seventh Embodiment of the Solid-State Imaging Device

Figure 31:
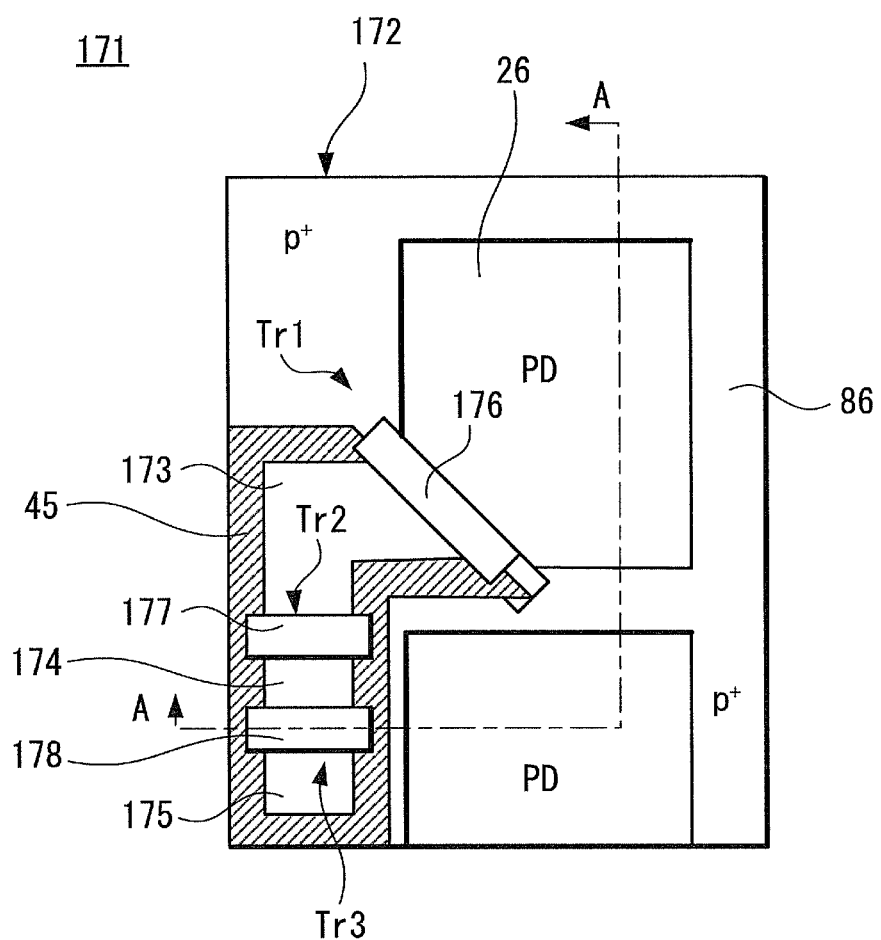
FIG. 31 is a schematic view illustrating the major portion of the solid-state imaging device according to a seventh embodiment of the present invention.
Figure 32:
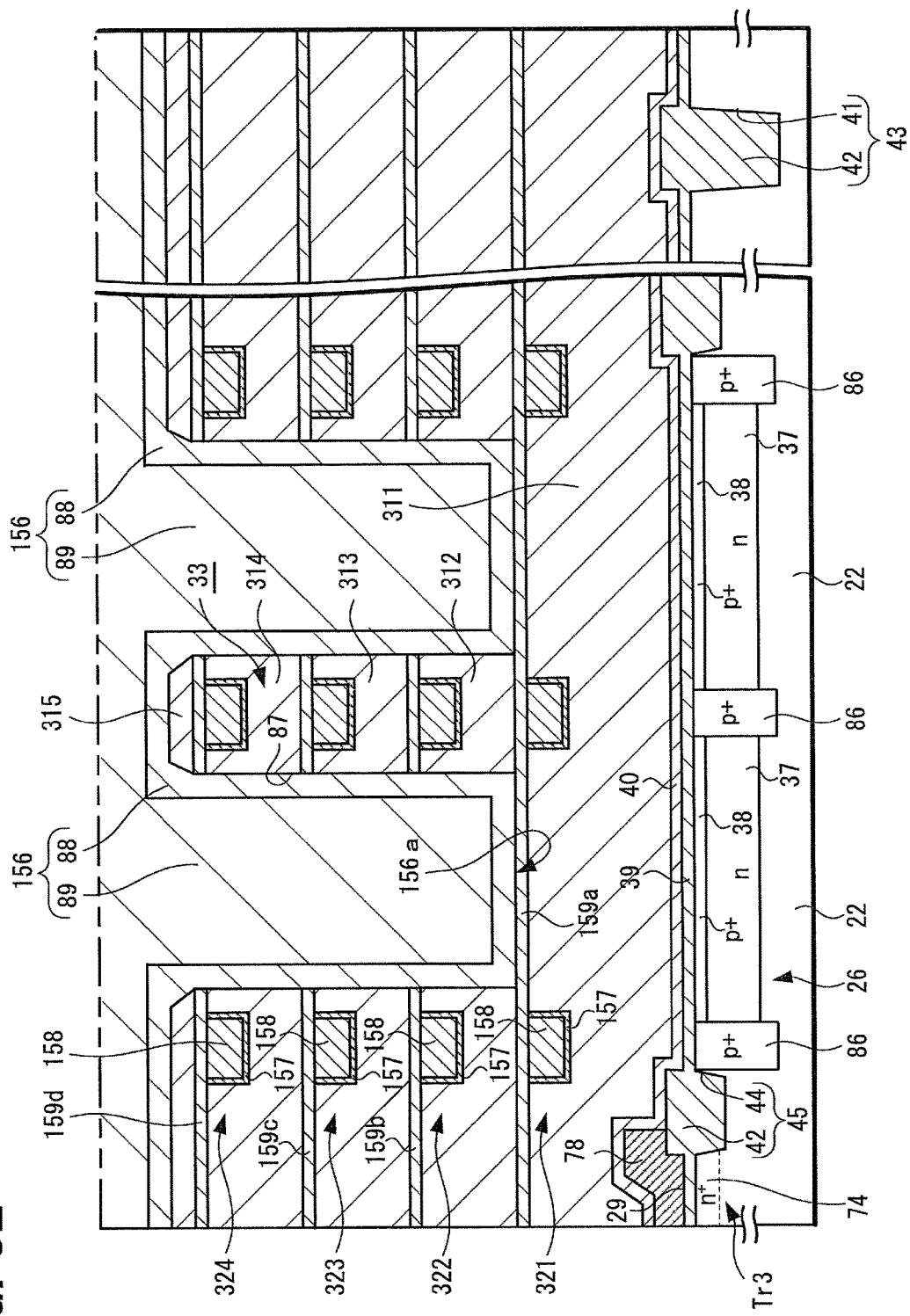
FIG. 32 is a cross-sectional view taken along the line A-A of the structure of FIG. 31.

FIGS. 31 and 32 are schematic views illustrating a solid-state imaging device according to a seventh embodiment of the present invention. FIG. 31 is a simplified plan view of the layout of pixels in an imaging region as the major portion of the solid-state imaging device. FIG. 32 is a cross-sectional view taken along the line A-A of the structure of FIG. 31.

The solid-state imaging device 171 of the present embodiment is provided, including a pixel section 23 and a peripheral circuit section 24, in which the pixel section 23 includes a plurality of pixels 172 arranged in a two-dimensional array, each of the pixels being formed, including a photodiode (PD) 26 and several pixel transistors. As illustrated by the layout shown in FIG. 31, each of the pixels 172 is formed in the present embodiment, including a photodiode (PD) 26 and several transistors, i.e., three transistors such as a transfer transistor Tr1, a reset transistor Tr2, and an amplifying transistor Tr3. The transfer transistor Tr1 is formed, including a source/drain region 173 serving as a floating diffusion (FD) and a transfer gate electrode 176 formed having a gate insulator film formed thereunder. The reset transistor Tr2 is formed, including a pair of source and drain regions 173 and 174, and a reset gate electrode 177 formed having another gate insulator film formed thereunder, in similar manner as above. The amplifying transistor Tr3 is formed, including a pair of source and drain regions 174 and 175, and an amplification gate electrode 178 formed having still another gate insulator film formed thereunder.

In addition, also in the present embodiment, as shown in FIGS. 31 and 32, an isolation region 86 of p-type impurity region is formed around the circumference of the photodiode (PD) 26. Namely, the photodiode (PD) 26 is isolated utilizing pn junction with the isolation region 86. On the other hand, the region of the pixel transistors such as the transfer transistor Tr1, reset transistor Tr2, and amplifying transistor Tr3, is isolated using the second isolation region 45 with the same STI structure as mentioned earlier.

Since the other parts of the configuration are similar to those mentioned earlier according to the sixth embodiment, the regions shown in FIG. 32 similar to those in FIG. 28 are shown with identical numerical representations and the repeated description thereof is omitted herein.

With the configuration of the solid-state imaging device 171 according to the seventh embodiment, by implementing the pn-junction isolation of the photodiode (PD) 26 using the isolation region 86 of p-type impurity region, the vignetting of light is eliminated and the sensor sensitivity can be further improved. Namely, since the protrusion portion (with protrusion height h8) in the second isolation region 45 is not present by the photodiode (PD) 26, the vignetting of light is not caused by the protrusion portion and the light condensing efficiency is further improved. In the pixel section 23, since the structure is adapted to incorporate a combination of pn junction isolation and STI isolation, the isolation tolerance is improved and gate parasitic capacitance can be reduced.

Moreover, with the seventh embodiment of the invention, the effects similar to those described earlier with the configuration according to the sixth embodiment can also be offered.

Although the pixel configuration is adapted herein above to include one photodiode and several pixel transistors, the configuration may alternatively be formed for the structure having plural pixels shared with each other, for example, in which the circumference of the photodiode PD is isolated by pn-junction similarly to the seventh embodiment, while other portions are isolated using the second isolation region 45 with the aforementioned STI structure. It is a matter of course that the present configuration of pn junction isolation of the photodiode (PD) in the circumference thereof can also be applied to the solid-state imaging device according to the first through seventh embodiments as well.

Fourth Embodiment of the Production Method

In the next place, a fourth embodiment of the production method for the solid-state imaging device according to the present invention will be described with reference to FIGS. 33 through 37. The present embodiment is adapted to producing the solid-state imaging device 55 according to the aforementioned sixth embodiment shown in FIG. 28, in particular to forming insulating interlayers and waveguides thereof.

Reference numerals 49 and 52 denote a p-type semiconductor region and a p-type semiconductor layer, respectively.

Figure 33:
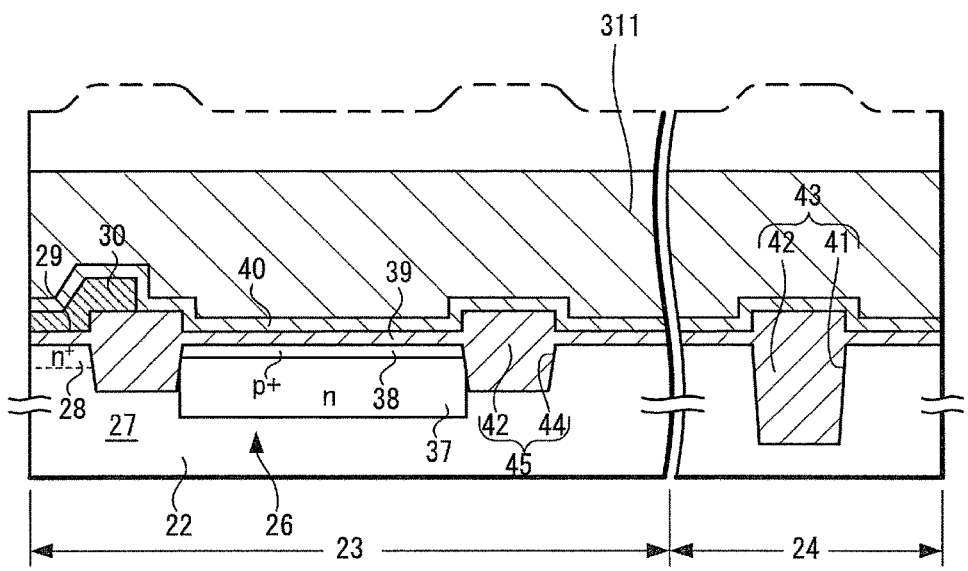
FIG. 33 illustrates, in a diagrammatic cross-sectional view, a process step utilized in producing a solid-state imaging device according to a fourth embodiment of the production method of the present invention.

In the production method according to the fourth embodiment, as illustrated in FIG. 33, shallow trenches 44 and deep trenches 41 are first formed in the pixel part 23 and the circumference circuit part 24, respectively, by way of process steps illustrated in either FIGS. 13A through 15E or FIGS. 18A through 19D. Also, the second isolation region 45 and the first isolation region 43 each with the STI structure are formed by burying an insulator film 42 into the trenches 44 and 41, respectively, so as to make the protrusion heights h6 and h8 the same. Moreover, in the pixel section 23, a photodiode 26 and pixel transistors 27 are formed. Logic circuits with CMOS transistors are formed in the peripheral circuit section 24. On an insulator film 39 of a silicon oxide film covering the surface of the photodiode 26, an antireflection film 40 of silicon nitride film is formed. Thereafter, a first-layer insulating interlayer 311 of a silicon oxide film, for example, is formed by the CVD method for example, and is subsequently subjected to planarizing polish by the CMP method to obtain a desired film thickness t1.

Figure 34:
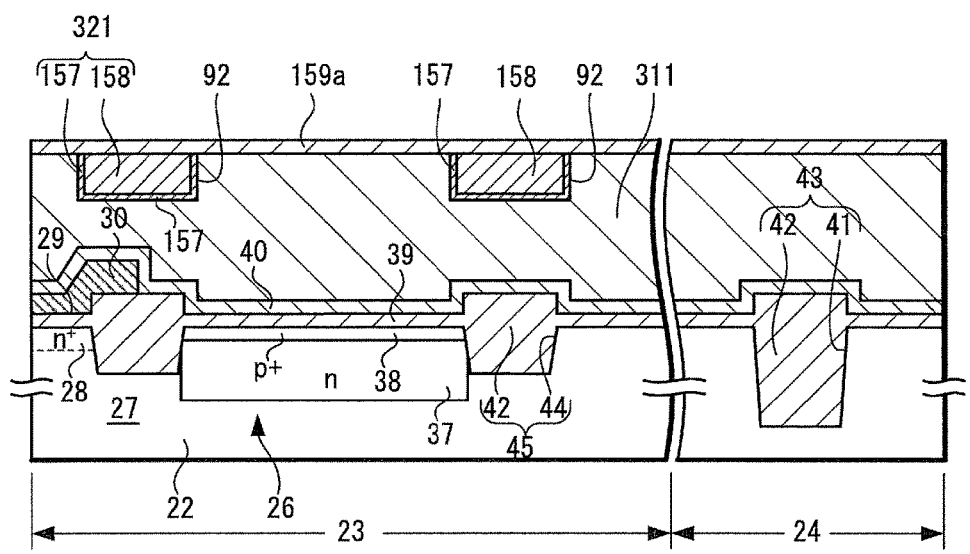
FIG. 34 illustrates, in a diagrammatic cross-sectional view, a process step utilized in producing a solid-state imaging device according to the fourth embodiment of the production method of the present invention.

Next, referring to FIG. 34, several trenches 92 are formed at predetermined locations of the insulating interlayer 311, and a first-layer wiring 321 is formed by burying a Cu wiring layer 158 into the trench 92, having a barrier metal layer 157 with tantalum/tantalum-nitride formed thereunder for passivation. Subsequently, all over the insulating interlayer 311 including the surface of the first-layer wiring 321, a first-layer wiring diffusion prevention film 159a for preventing the diffusion of the wiring 321 is formed of a SiC film or SiN film, for example, of a SiC film in this example.

Figure 35:
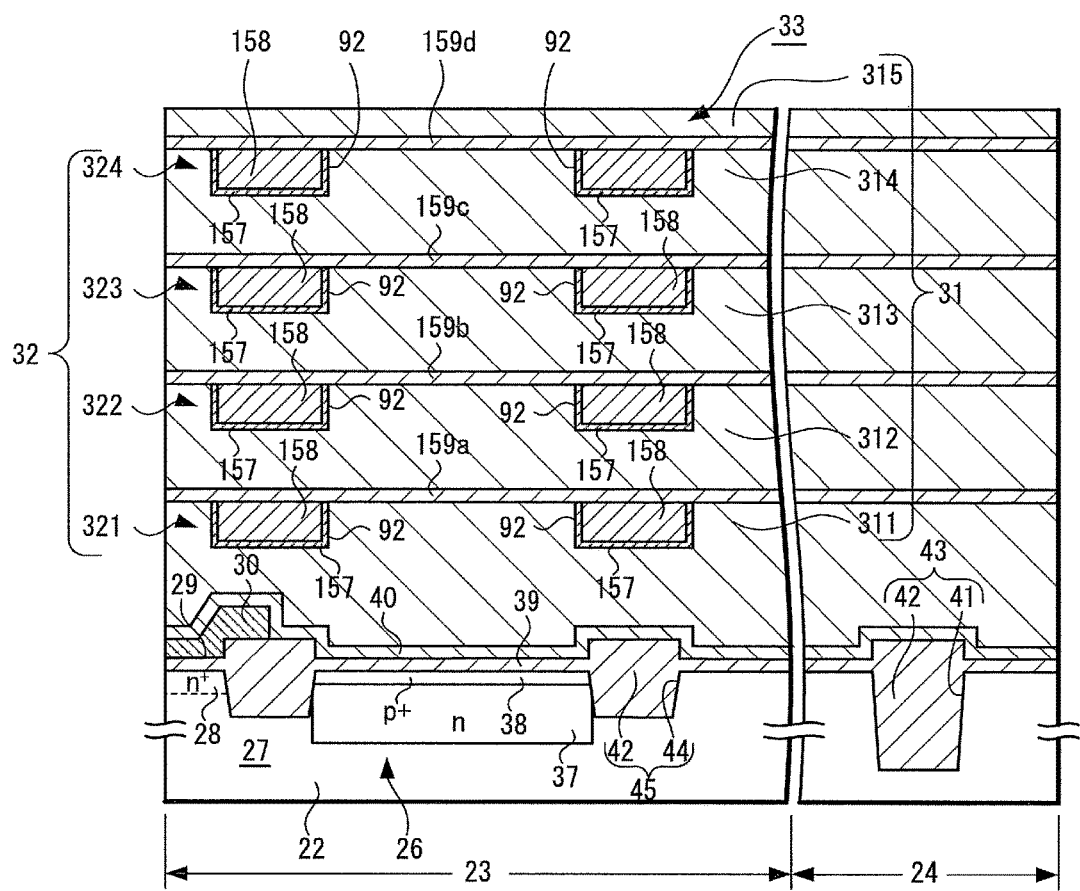
FIG. 35 illustrates, in a diagrammatic cross-sectional view, a process step utilized in producing a solid-state imaging device according to the fourth embodiment of the production method of the present invention.

Next, referring to FIG. 35, there formed on the first-layer wiring diffusion prevention film 159a using process steps similar to those mentioned above, are a second-layer insulating interlayer 312, a second-layer wiring 322 having a barrier metal layer 157 and a Cu wiring layer 158 both buried into a trench 92, and a second-layer wiring diffusion prevention film 159b. Subsequently, a third-layer insulating interlayer 313, a third-layer wiring 323 having another barrier metal layer 157 and another Cu wiring layer 158 buried into a trench 92, and a third-layer wiring diffusion prevention film 159c are formed. Furthermore, a fourth-layer insulating interlayer 314, a fourth-layer wiring 324 having still another barrier metal layer 157 and a still another Cu wiring layer 158 buried into a trench 92, and a fourth-layer wiring diffusion prevention film 159d are formed. In addition, a fifth-layer insulating interlayer 315 is formed on the structure, whereby a multilevel wiring layer 33 is formed.

Figure 36:
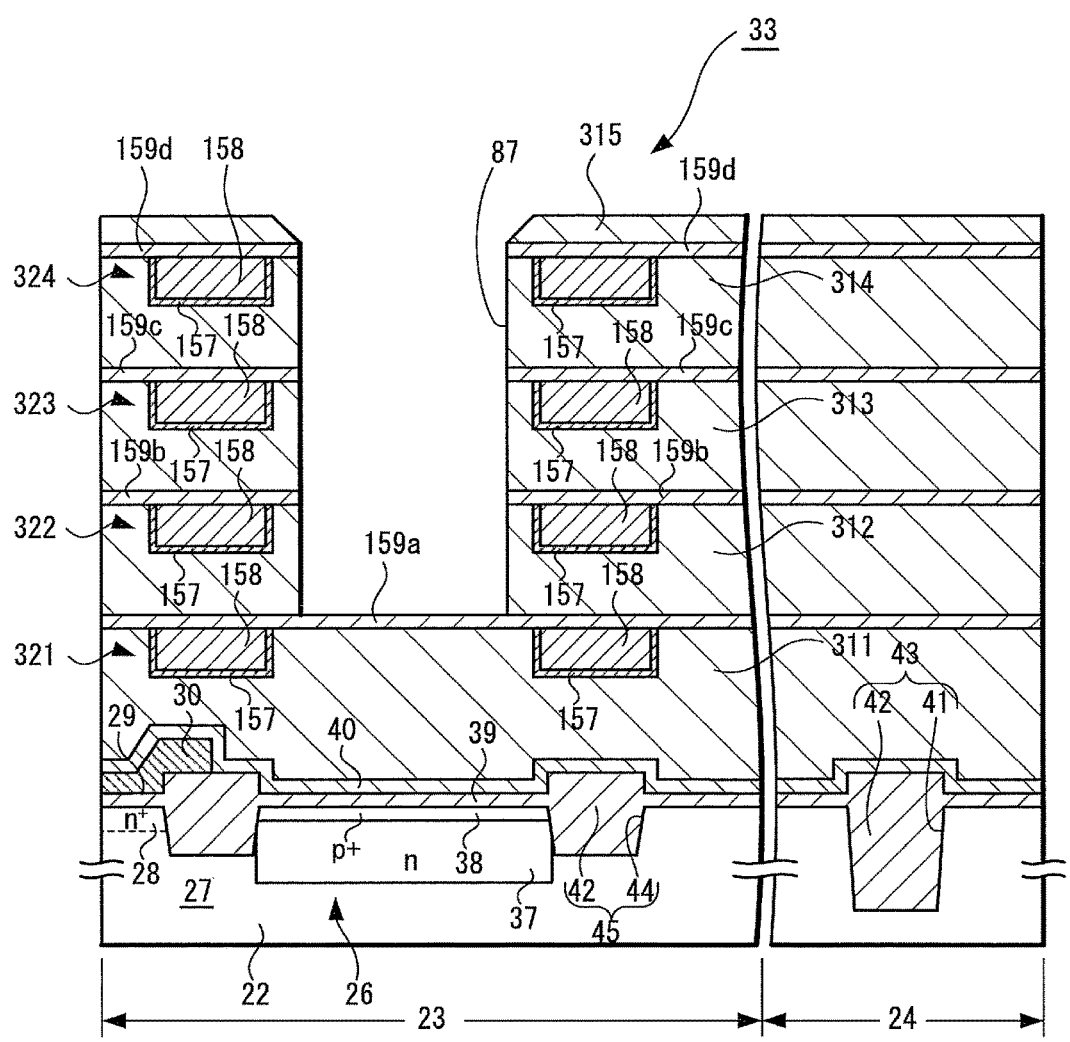
FIG. 36 illustrates, in a diagrammatic cross-sectional view, a process step utilized in producing a solid-state imaging device according to the fourth embodiment of the production method of the present invention.

Next, referring to FIG. 36, a concave groove 87 is formed by selectively etching the portion in the multilevel wiring layer 33 facing the photodiode 26 so as to terminate at the lowermost wiring diffusion prevention film 159a as the first layer. This selective etching is performed on the insulating interlayer 315 on the fifth layer, the wiring diffusion prevention film 159*d* and insulating interlayer 314 on the fourth layer, the wiring diffusion prevention film 159*c* and insulating interlayer 313 on the third layer, and the wiring diffusion prevention film 159*b* and insulating interlayer 312 on the second layer.

Figure 37:
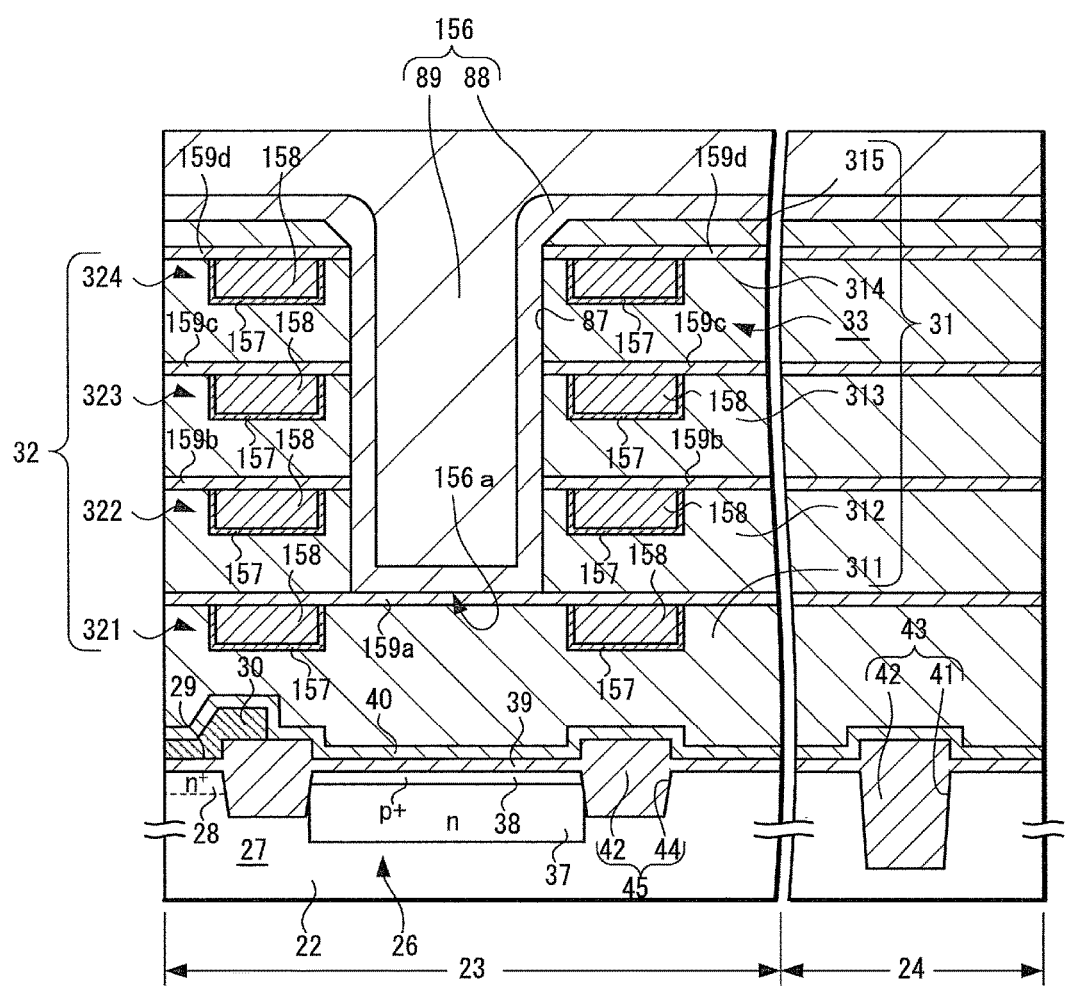
FIG. 37 illustrates, in a diagrammatic cross-sectional view, a process step utilized in producing a solid-state imaging device according to the fourth embodiment of the production method of the present invention.

Next, referring to FIG. 37, a first core layer 88 is formed including the inner wall of the concave groove 87. Thereafter, a second core layer 89 is formed on the first core layer 88 to inlay the concave groove 87. The first core layer 88 and the second core layer 89 are formed of either a silicon oxide film or silicon nitride film. Thereby, a waveguide 156 consisting of the first core layer 88 and the second core layer 89 is formed to reach the wiring diffusion prevention film 159*a* on the lowermost layer and facing each of the photodiodes 26. If the first core layer 88 is formed with the material having a refractive index higher than that for forming the second core layer 89 and the insulating interlayer (312 to 315) included in the multilevel wiring layer 33, the light leak outward from the waveguide becomes more difficult, and the sensor sensitivity is further increased. An embodiment of the invention is not limited thereto, however. And, the waveguide may alternatively be formed, including the second core layer 89 formed with the material having a refractive index higher than that for forming the first core layer 88.

Although not shown as a drawing, subsequent process steps proceed for successively forming a planarizing film 90, on-chip color filters 34, and on-chip micro-lens 35, whereby the solid-state imaging device 55 according to the sixth embodiment is formed.

With the production method of the solid-state imaging device according to the fourth embodiment of production method, by forming the second isolation region 45 and the first isolation region 43 to make the protrusion heights thereof h6 and h8 the same, a satisfactory planarization process becomes feasible during the polishing process by the CMP method after forming the first layer insulating interlayer 311. As a result, the thickness of the first layer insulating interlayer 311 decreases, and the film thickness t1 of insulating interlayers from the surface of the photodiode 26 to the wiring diffusion prevention film 159*a* on the first layer can also be decreased. Moreover, the waveguide 156 is formed at the location facing the photodiode 26. By achieving the formation of the insulating interlayers having the thin film thickness t1, and also by providing the waveguide 156, the condensing efficiency of leading incident light into the photodiode 26 is improved, and the solid-state imaging device 55 can be produced with improved sensor sensitivity.

Since the formation of the concave groove 87 for forming the waveguide 156 is carried out to be terminated at the first-layer wiring diffusion prevention film 159*a*, and not to form the groove 87 any deeper, undesirable increase in dark current can be avoided. In addition, by terminating the concave groove 87 at the wiring diffusion prevention film 159*a*, terminal points can be made uniform in depth and the variation in sensitivity can be suppressed.

In addition, similarly to those described above according to the first and second embodiments of production method, the solid-state imaging device can be produced with improved pixel characteristics, including the improvement in afterimage characteristics and in the amount of saturation signals, the prevention of short circuit failures between pixel transistors, etc. Moreover, after forming the trenches 44 and 41 on the side of the pixel section 23 and on the side of the peripheral circuit section 24, respectively, the deposition of the insulator layer 42 and the polishing by the CMP method are carried out in the same process, and then the first and second isolation regions 43 and 45 are formed. Thus, the number of processes can therefore be reduced.

Fifth Embodiment of the Production Method

Figure 38:
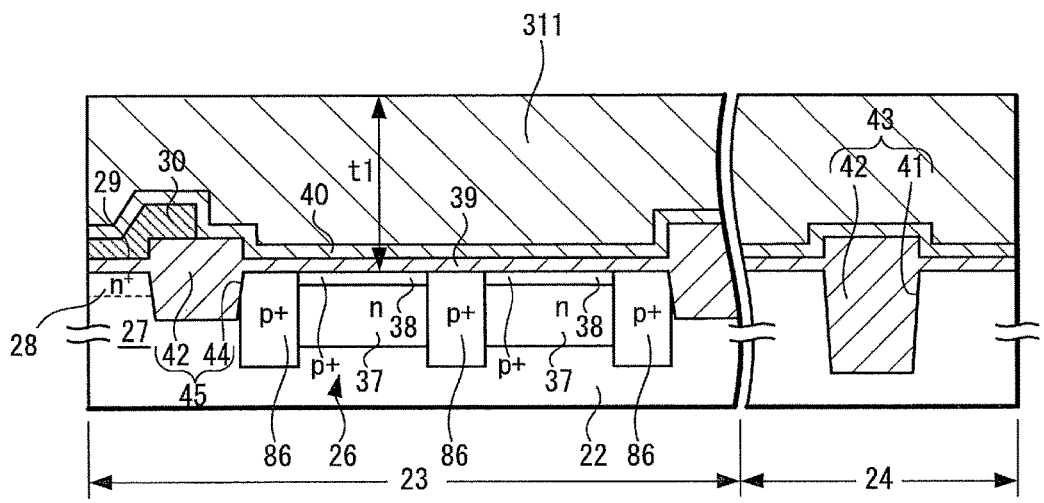
FIG. 38 illustrates, in a diagrammatic cross-sectional view, a process step utilized in producing a solid-state imaging device according to a fifth embodiment of the production method of the present invention.

Referring to FIG. 38, a fifth embodiment of the production method for the solid-state imaging device according to the present invention will be described. The present embodiment is adapted to producing the solid-state imaging device according to the aforementioned seventh embodiment shown in FIGS. 31 and 32, in particular to forming isolation regions thereof.

In the production method according to the fifth embodiment, as illustrated in FIG. 38, shallow trenches 44 and deep trenches 41 are first formed in the pixel section 23 and the circumference circuit section 24, respectively, by way of process steps illustrated in either FIGS. 13A through 15E or FIGS. 18A through 19D. Also, the second isolation region 45 and the first isolation region 43 each with the STI structure are formed by burying an insulator film 42 into the trenches 44 and 41, respectively, so as to make the protrusion heights thereof h6 and h8 the same.

In addition, in the pixel section 23, a photodiode 26, and transistors Tr1, Tr2, and Tr3 as pixel transistors are formed for constituting a pixel. In the peripheral circuit section 24, logic circuits are formed, including CMOS transistors. Furthermore, an isolation region 86 is formed of a p-type impurity region in the periphery of the photodiode in the pixel section 23.

An antireflection film 40 of a silicon nitride film is formed on an insulator film 39 of a silicon oxide film formed on the surface of the photodiode 26. Thereafter, a first-layer insulating interlayer 311 of a silicon oxide film, for example, is formed by the CVD method and is subsequently subjected to planarizing polish by the CMP method to obtain a desired film thickness t1.

Subsequently, by way of the same process steps as aforementioned with reference to FIGS. 34 through 37, the solid-state imaging device according to the seventh embodiment can be produced.

With the production methods of the solid-state imaging device according to the fifth embodiment of production method, this method includes the process steps of forming the isolation region 86 of a p-type impurity region in the periphery of the photodiode 26 in the pixel section 23. The isolation region 86 does not protrude out of the substrate surface and no protrusion portion is present around the photodiode 26. As a result, since the vignetting of light is not caused by the protrusion portion in the periphery of the photodiode 26, the solid-state imaging device 171 can be produced with further improved light condensing efficiency. In addition, the effects similar to those described earlier with the production method according to the fourth embodiment can also be offered with the present method.

An embodiment of the present invention can be applied to both the surface illumination type and the backside illumination type of the solid-state imaging device. With the CMOS solid-state imaging device, as mentioned earlier, an embodiment of the invention can be applied to the surface illumination type imaging device rendering light incident from the side of a multilevel wiring layer, as well as the backside illumination type imaging device rendering light incident from the rear face of the substrate opposite to the side of the multilevel wiring layer. In addition, the solid-state imaging devices according to an embodiment of the present invention can be applied not only to the abovementioned area image sensors, but also to linear image sensors.

The solid-state imaging devices according to an embodiment of the present invention can suitably be adapted to various electronic equipments such as cameras provided with solid-state imaging devices, mobile devices with cameras, and other similar equipments provided with solid-state imaging devices.

Figure 39:
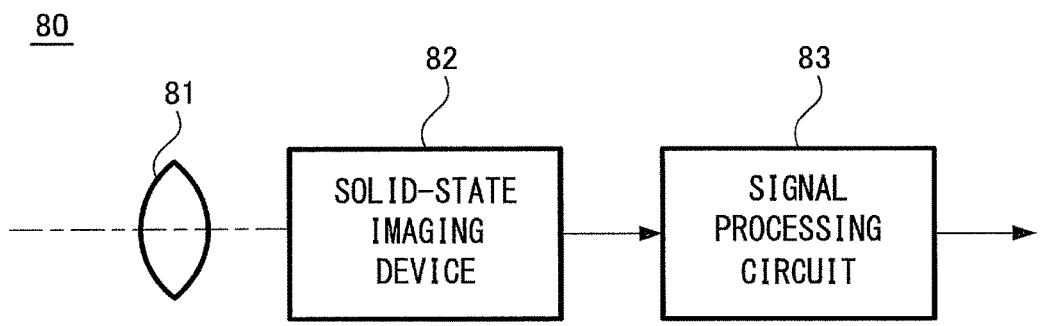
FIG. 39 is a simplified schematic diagram illustrating the configuration of a camera as an example of the adaptation of the solid-state imaging device according to an embodiment of the present invention.

FIG. 39 is a diagrammatical view illustrating a camera provided with the solid-state imaging device as an example of the abovementioned electronic equipments according to an embodiment of the present invention. The camera (electronic apparatus) 80 according to the present embodiment is provided, including an optical system (optical lens) 81, a solid-state imaging device 82, and a signal processing circuit 83.

As to the solid-state imaging device 82, any one of the devices described in the aforementioned embodiments may preferably be adapted. The optical system 81 is configured to image the image light (incident light) emitted from a subject on the imaging surface of the solid-state imaging device. Thereby, signal charges are accumulated for a fixed period of time by the photoelectric conversion element included in the solid-state imaging device 82. The signal processing circuit is configured to provide the signals outputted from the solid-state imaging device 82 with various signal processing, and to subsequently output the processed signals as picture signals. The camera 80 according to the present embodiment may be implemented as a camera module, which is formed by modularizing the optical system 81, the solid-state imaging device 82, and the signal processing circuit 83.

An embodiment of the present invention may suitably adapted to the camera illustrated in FIG. 39, and mobile devices with cameras, which are represented for example by cellular phones provided with camera modules, etc. Furthermore, the structure of FIG. 39 may be configured as a module having imaging capabilities, a so-called imaging module, which is formed by modularizing the optical system 81, the solid-state imaging device 82, and the signal processing circuit 83. According to an embodiment of the invention, electronic equipments provided with such imaging modules can be constituted.

According to the electronic equipments of the present embodiment, since high quality images can be formed owning to excellent pixel characteristics of the solid-state imaging devices, high performance electronic equipments can be provided.

As mentioned earlier, the solid-state imaging device according to an embodiment of the present invention may suitably be adapted to (a) the solid-state imaging device having plural unit pixels arranged, each of the unit pixels including one photodiode and several pixel transistors, and (b) the solid-state imaging device having a first plurality of so-called sharing pixels arranged, each of the sharing pixels including a second plurality of photodiodes and transfer transistors, and including each one of the other pixel transistors such as the reset, amplifying, and select transistors.

The present application contains subject matter related to that disclosed in Japanese Priority Patent Applications JP 2008-101971, JP 2008-199050, JP 2008-201117 filed in the Japan Patent Office on Apr. 9, 2008, Jul. 31, 2008, Aug. 4, 2008, respectively, and the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a first STI structure comprising an insulator that is formed in a first trench of a peripheral circuit section, wherein the insulator fills an entirety of the first STI structure; and
a second STI structure comprising the insulator that is formed in a second trench of a pixel section, wherein the insulator fills an entirety of the second STI structure;
wherein the first STI structure has a first protrusion protruding above a semiconductor substrate,
wherein the second STI structure has a second protrusion protruding above the semiconductor substrate,
wherein the first protrusion and the second protrusion have a same height,
wherein the first STI structure extends deeper into the semiconductor substrate than the second STI structure; and
wherein the insulator is a single layer that extends continuously from an interior surface of the first trench in the peripheral circuit section to an interior surface of the second trench in the pixel section.

2. The solid-state imaging device according to claim 1, wherein the height of the first protrusion and the second protrusion is in a range from 0 to 40 nm from a surface of the semiconductor substrate.

3. The solid-state imaging device according to claim 1, wherein the insulator is in direct contact with a bottom surface of the first trench in the peripheral circuit section and a bottom surface of the second trench in the pixel section.

4. The solid-state imaging device according to claim 1, wherein the first protrusion and the second protrusion have a chemical mechanical polished surface so as to have a same height.

5. The solid-state imaging device according to claim 4, further comprising a lens, wherein the chemical mechanical polished surface has a reduced height that reduces a thickness of at least one insulating interlayer, and wherein the reduced height is positioned directly below the lens.

6. The solid-state imaging device according to claim 5, wherein the insulator extends throughout an entirety of the first trench and an entirety of the second trench.

7. The solid-state imaging device according to claim 1, wherein the height of the first protrusion and the second protrusion is less than 30 nm from a surface of the semiconductor substrate.

8. The solid-state imaging device according to claim 5, wherein the reduced height improves a condensing efficiency of the photodiode in the pixel section.

9. The solid-state imaging device according to claim 1, wherein the pixel section includes a plurality of pixels, and the peripheral circuit section includes logic circuits.

10. The solid-state imaging device according to claim 9, wherein the logic circuits comprise a vertical driving circuit and an output circuit.

11. The solid-state imaging device according to claim 9, wherein the logic circuits comprise a vertical driving circuit, column signal processing circuits, a horizontal driving circuit, an output circuit, and a control circuit.

* * * * *